(12) United States Patent
Kawaguchi

(10) Patent No.: US 12,119,298 B2
(45) Date of Patent: Oct. 15, 2024

(54) SEMICONDUCTOR MEMORY DEVICE

(71) Applicant: Kioxia Corporation, Tokyo (JP)

(72) Inventor: Genki Kawaguchi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 450 days.

(21) Appl. No.: 17/591,713

(22) Filed: Feb. 3, 2022

(65) Prior Publication Data

US 2022/0415787 A1 Dec. 29, 2022

(30) Foreign Application Priority Data

Jun. 25, 2021 (JP) .................. 2021-106099

(51) Int. Cl.
| H01L 41/27 | (2013.01) |
| H01L 23/522 | (2006.01) |
| H10B 41/27 | (2023.01) |
| H10B 43/27 | (2023.01) |

(52) U.S. Cl.
CPC ......... *H01L 23/5226* (2013.01); *H10B 41/27* (2023.02); *H10B 43/27* (2023.02)

(58) Field of Classification Search
CPC ...... H01L 23/5226; H10B 41/27; H10B 43/27
See application file for complete search history.

(56) References Cited

U.S. PATENT DOCUMENTS

| 9,646,981 B2 * | 5/2017 | Nishikawa | ............... H01L 28/20 |
| 2016/0293625 A1 * | 10/2016 | Kang | .................... H01L 23/528 |
| 2019/0378855 A1 | 12/2019 | Kim et al. | |
| 2021/0272977 A1 | 9/2021 | Shimizu | |

FOREIGN PATENT DOCUMENTS

JP 2021-141102 A 9/2021

* cited by examiner

Primary Examiner — Douglas M Menz
(74) Attorney, Agent, or Firm — Oblon, McClelland, Maier & Neustadt, L.L.P.

(57) ABSTRACT

According to one embodiment, a semiconductor memory device includes a substrate expanding in a first direction and a second direction, a plurality of conductive layers arranged in a third direction with a distance therebetween, the conductive layers including a first conductive layer, and each including a first portion and a second portion being arranged with the first portion in the second direction and including a terrace portion provided so as not to overlap an upper conductive layer in the third direction, a first insulating portion provided between the first portions and the second portions, and a first insulating layer arranged with the first portion of the first conductive layer in the second direction with the first insulating portion interposed therebetween.

20 Claims, 52 Drawing Sheets

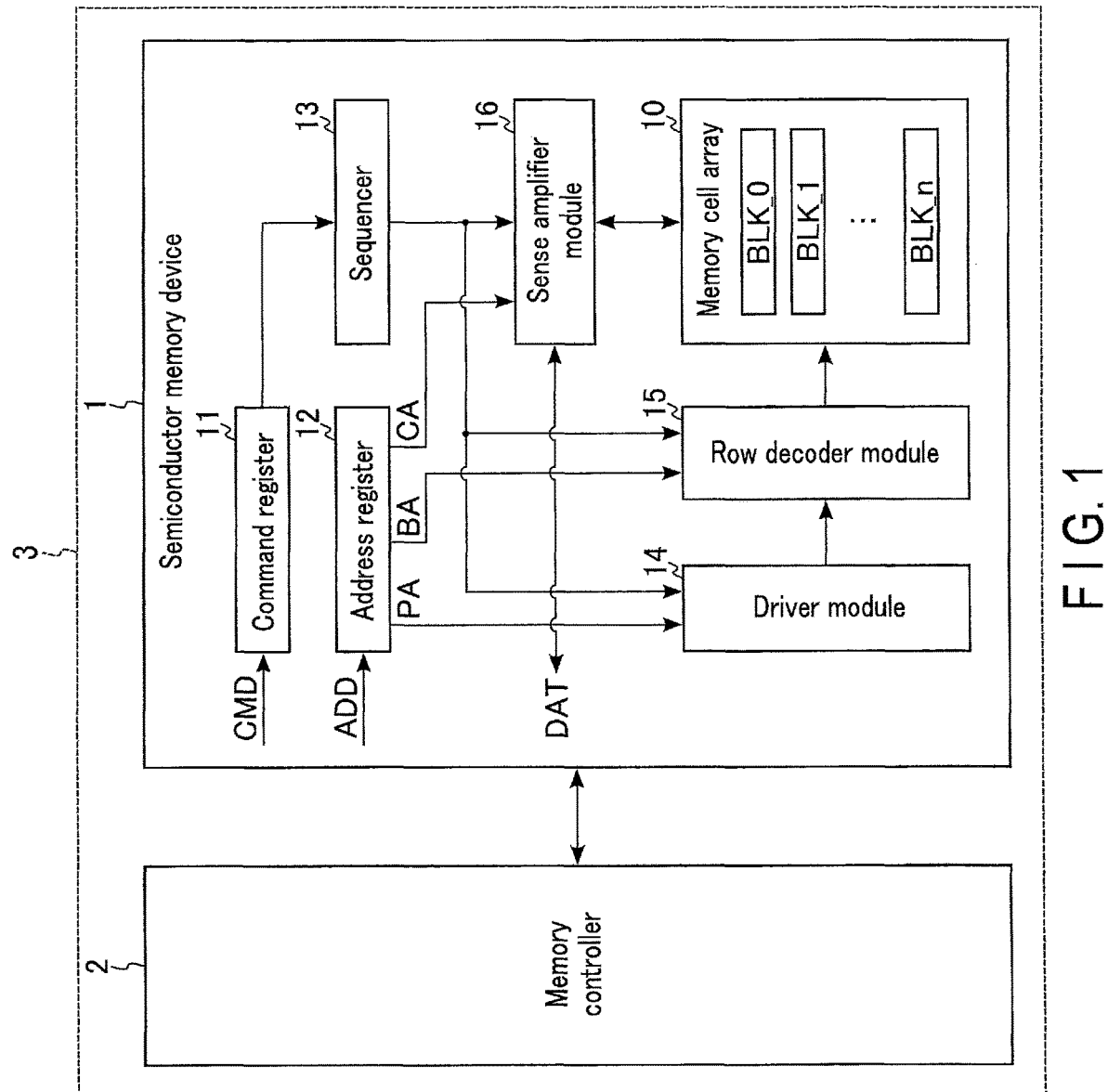
F I G. 1

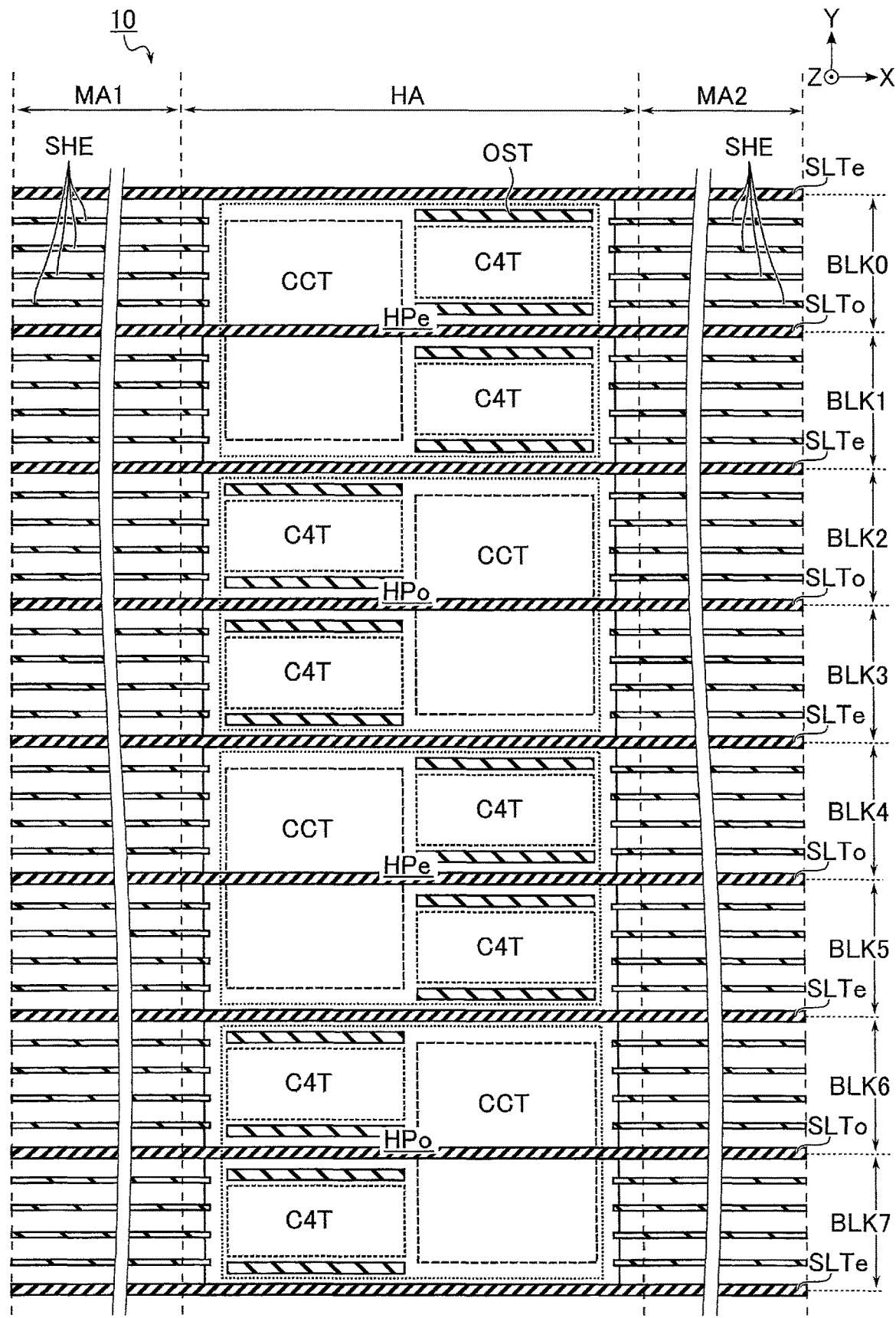
F I G. 3

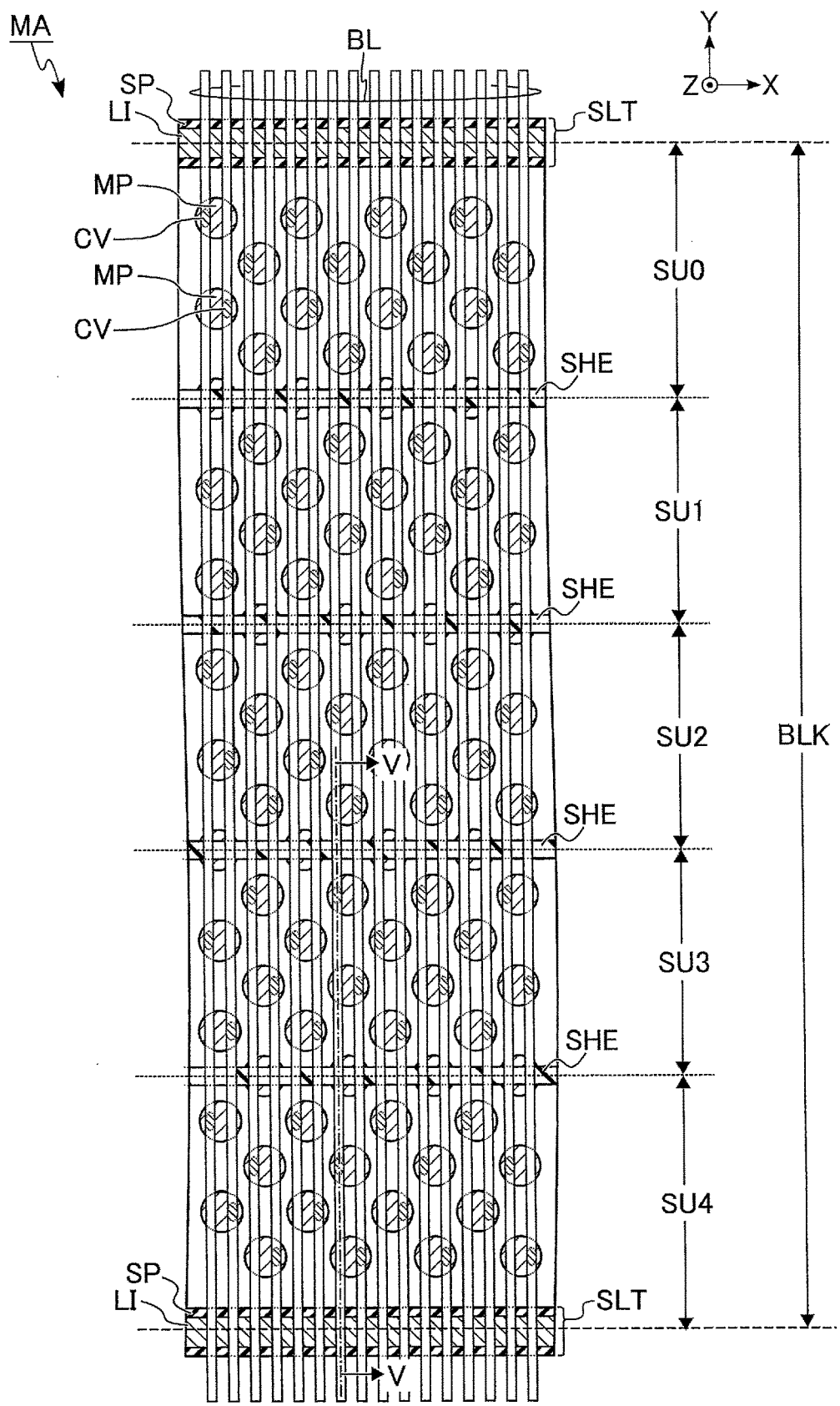
F I G. 4

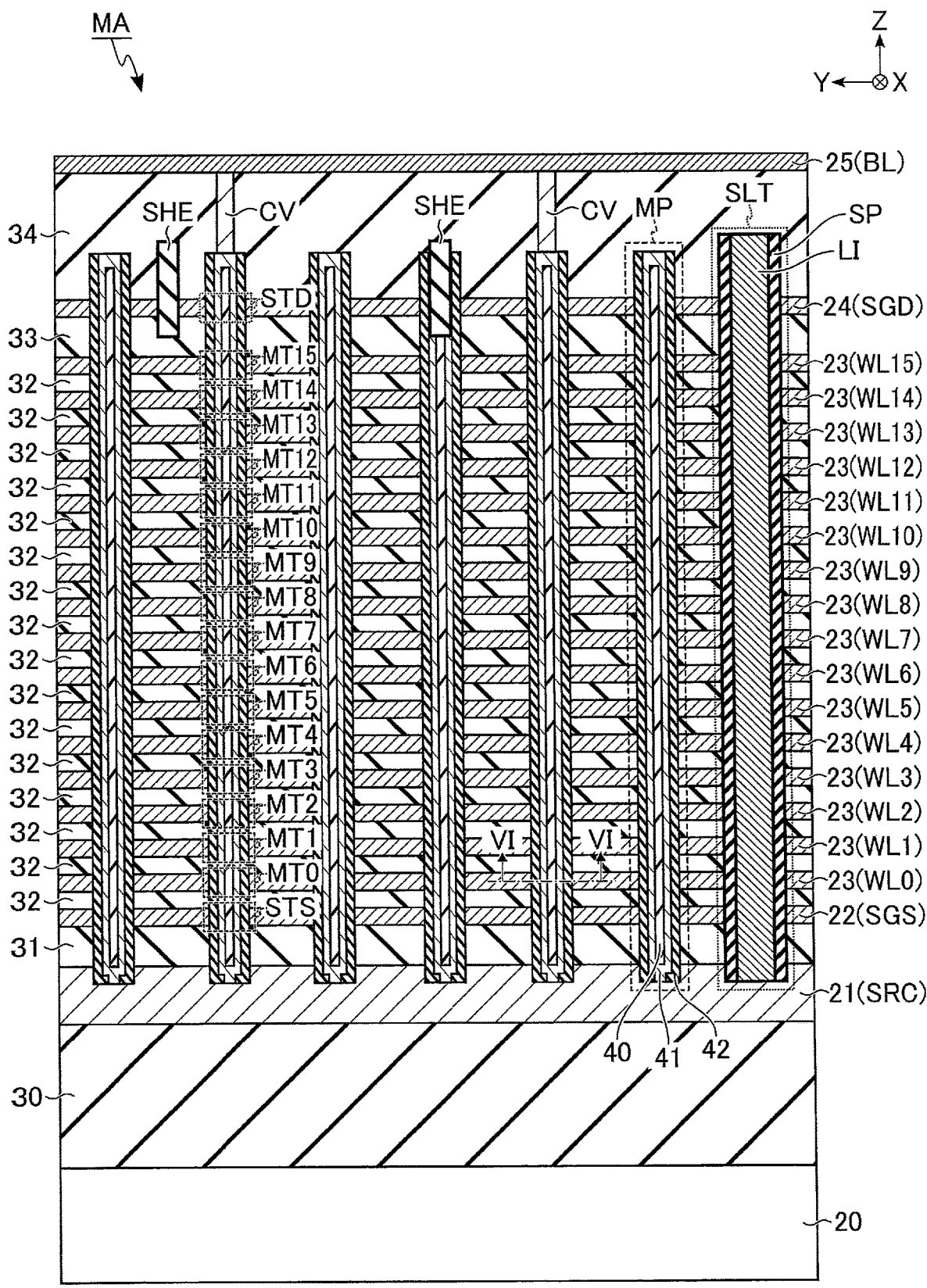
F I G. 5

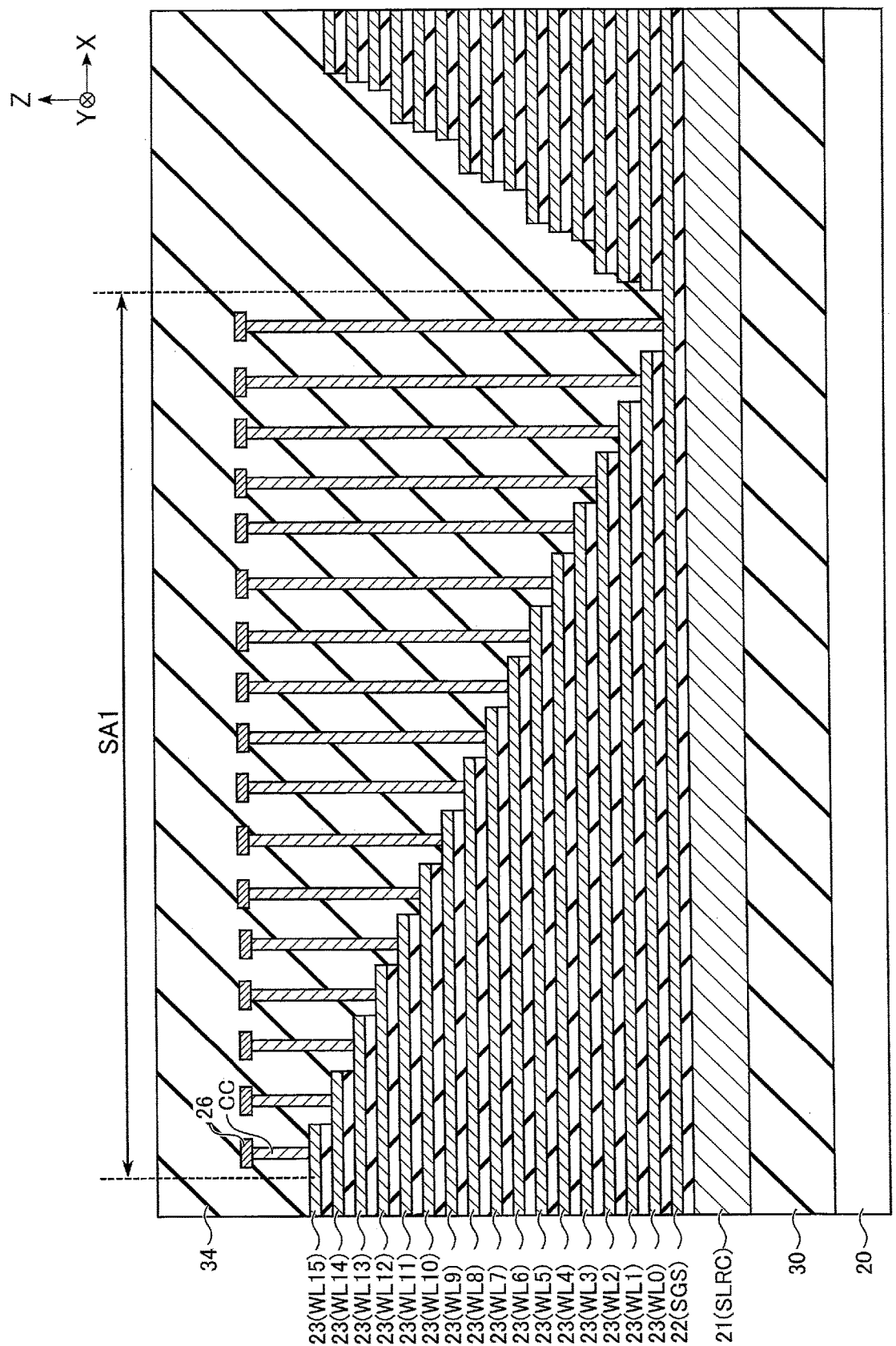
F I G. 49

SEMICONDUCTOR MEMORY DEVICE

CROSS-REFERENCE TO RELATED APPLICATIONS

This application is based upon and claims the benefit of priority from Japanese Patent Application No. 2021-106099, filed Jun. 25, 2021, the entire contents of which are incorporated herein by reference.

FIELD

Embodiments described herein relate generally to a semiconductor memory device.

BACKGROUND

A NAND flash memory is known as a semiconductor memory device capable of storing data in a nonvolatile manner. A semiconductor memory device such as the NAND flash memory employs a three-dimensional memory structure for higher integration and larger capacity.

BRIEF DESCRIPTION OF THE DRAWINGS

FIG. 1 is a block diagram showing an example of a configuration of a memory system including a semiconductor memory device according to an embodiment.

FIG. 3 is a plan view showing an example of a planar layout of the memory cell array included in the semiconductor memory device according to the embodiment.

FIG. 4 is a plan view showing an example of a planar layout of a memory area of the memory cell array included in the semiconductor memory device according to the embodiment.

FIG. 5 is a cross-sectional view taken along line V-V in FIG. 4, showing an example of a cross-sectional structure of a memory area of the memory cell array included in the semiconductor memory device according to the embodiment.

FIG. 49 is a cross-sectional view taken along line XLIX-XLIX in FIG. 48, showing an example of a cross-sectional structure of a part of a hookup area of the memory cell array included in the semiconductor memory device according to the fifth modification.

DETAILED DESCRIPTION

Figure 2:
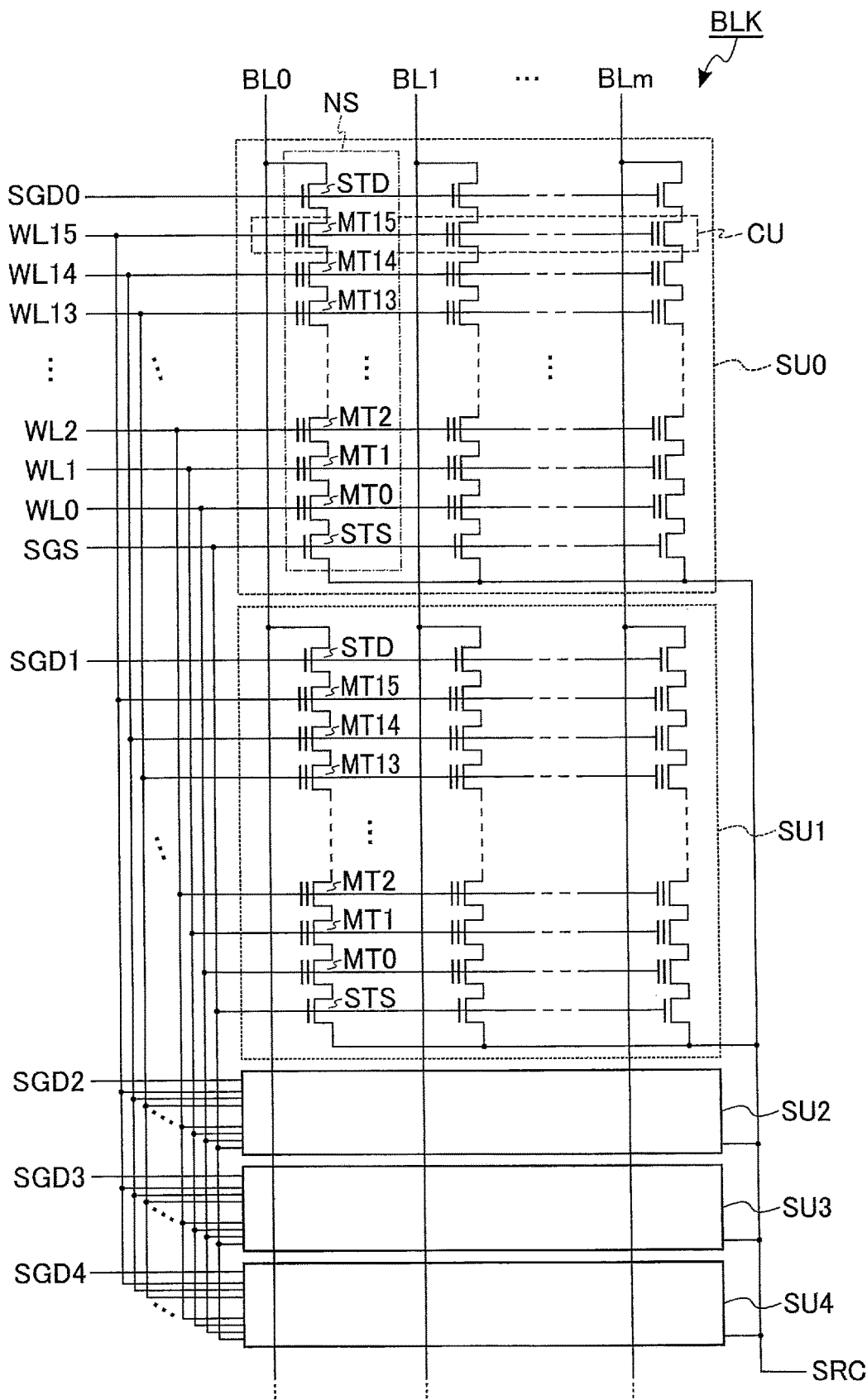
FIG. 2 is a circuit diagram showing an example of a circuit configuration of a memory cell array included in the semiconductor memory device according to the embodiment.

In general, according to one embodiment, a semiconductor memory device includes a substrate expanding in a first direction and a second direction and including a first area and a second area arranged in the first direction, the first direction intersecting the second direction, a plurality of conductive layers arranged in a third direction with a distance therebetween, the third direction intersecting the first direction and the second direction, the conductive layers including a first conductive layer and each of the conductive layers including a first portion and a second portion arranged with the first portion in the second direction, the first portion extending in the first direction over the second area and the second portion including a terrace portion provided so as not to overlap an upper conductive layer of the conductive layers in the third direction, a first insulating portion provided between the first portions of the conductive layers and the second portions of the conductive layers, a first insulating layer arranged with the first portion of the first conductive layer in the second direction with the first insulating portion interposed therebetween, and a first memory pillar passing through the conductive layers in the third direction in the first area, a portion of the first memory pillar intersecting the first conductive layer functioning as a first memory cell transistor.

Hereinafter, embodiments will be described with reference to the accompanying drawings. The dimensions, ratios, and the like in the drawings are not always the same as the actual ones.

In the following explanation, constituent elements having substantially the same function and configuration will be assigned the same reference numeral or symbol. When elements having similar configurations are particularly distinguished, different characters or numerals may be added to the common reference numeral or symbol.

1 Embodiment

1.1 Configuration
1.1.1 Memory System

FIG. 1 is a block diagram showing an example of a configuration of a memory system including a semiconductor memory device according to an embodiment. A memory system 3 is a memory device configured to be connected to an external host device (not shown). The memory system 3 is, for example, a memory card such as an SD™ card, a universal flash storage (UFS), or a solid state drive (SSD). The memory system 3 includes a memory controller 2 and a semiconductor memory device 1.

The memory controller 2 is constituted by an integrated circuit such as a system-on-a-chip (SoC). The memory controller 2 controls the semiconductor memory device 1 based on a request from the host device. Specifically, for example, the memory controller 2 writes data requested for writing by the host device to the semiconductor memory device 1. The memory controller 2 also reads data requested for reading by the host device from the semiconductor memory device 1 and transmits the data to the host device.

The semiconductor memory device 1 is a memory that stores data in a nonvolatile manner. The semiconductor memory device 1 is, for example, a NAND flash memory.

Communication between the memory controller 2 and the semiconductor memory device 1 is compliant with, for example, a single data rate (SDR) interface, a toggle double data rate (DDR) interface, or an open NAND flash interface (ONFI).

1.1.2 Semiconductor Memory Device

With continuous reference to the block diagram of FIG. 1, an internal configuration of the semiconductor memory device 1 according to the embodiment will be described. The semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer larger than or equal to 1). Each block BLK is a set of memory cell transistors capable of storing data in a nonvolatile manner, and is used as, for example, a data erase unit. The memory cell array 10 is provided with a plurality of bit lines and a plurality of word lines. Each memory cell transistor is associated with, for example, one bit line and one word line.

The command register 11 stores a command CMD received by the semiconductor memory device 1 from the memory controller 2. The command CMD includes an order to cause the sequencer 13 to execute a read operation, a write operation, an erase operation, or the like.

The address register 12 stores address information ADD received by the semiconductor memory device 1 from the memory controller 2. The address information ADD includes, for example, a page address PA, a block address BA, and a column address CA. For example, the page address PA, the block address BA, and the column address CA are used to select a word line, a block BLK, and a bit line, respectively.

The sequencer 13 controls the overall operation of the semiconductor memory device 1. For example, the sequencer 13 controls, based on the command CMD stored in the command register 11, the driver module 14, the row decoder module 15, the sense amplifier module 16, and the like to execute a read operation, a write operation, an erase operation, and the like.

The driver module 14 generates voltages used in a read operation, a write operation, an erase operation, and the like. Then, the driver module 14 applies a generated voltage to a signal line corresponding to a selected word line, based on, for example, the page address PA stored in the address register 12.

Based on the block address BA stored in the address register 12, the row decoder module 15 selects one corresponding block BLK in the memory cell array 10. Then, the row decoder module 15 transfers, for example, the voltage applied to the signal line corresponding to the selected word line to the selected word line in the selected block BLK.

In a write operation, the sense amplifier module 16 transfers write data DAT received from the memory controller 2 to the memory cell array 10. In a read operation, the sense amplifier module 16 determines data stored in a memory cell transistor based on the voltage of the corresponding bit line. The sense amplifier module 16 transfers a result of the determination to the memory controller 2 as read data DAT.

1.1.3 Circuit Configuration of Memory Cell Array

FIG. 2 is a circuit diagram showing an example of a circuit configuration of the memory cell array included in the semiconductor memory device according to the embodiment. In FIG. 2, one block BLK of the blocks BLK included in the memory cell array 10 is shown. In the example shown in FIG. 2, the block BLK includes, for example, five string units SU0 to SU4.

Each string unit SU includes a plurality of NAND strings NS associated with bit lines BL0 to BLm (where m is an integer larger than or equal to 1), respectively. Each NAND string NS includes, for example, memory cell transistors MT0 to MT15 and select transistors STD and STS. The memory cell transistors MT0 to MT15 each include a control gate and a charge storage layer, and store data in a nonvolatile manner. The select transistors STD and STS are each used to select a string unit SU in various operations. In the following explanation, the memory cell transistors MT0 to MT15 are each also referred to as a "memory cell transistor MT".

In each NAND string NS, the memory cell transistors MT0 to MT15 are coupled in series. The drain of the select transistor STD is coupled to a corresponding bit line BL, and the source of the select transistor STD is coupled to one end of the series of the memory cell transistors MT0 to MT15. The drain of the select transistor STS is coupled to the other end of the series of the memory cell transistors MT0 to MT15. The source of the select transistor STS is coupled to a source line SRC.

The control gates of the memory cell transistors MT0 to MT15 in the same block BLK are coupled to word lines WL0 to WL15, respectively. The gates of the select transistors STD in the string units SU0 to SU4 are coupled to select gate lines SGD0 to SGD4, respectively. The gates of the select transistors STS in the same block BLK are coupled in common to a select gate line SGS. However, the configuration is not limited to this, and the gates of select transistors STS of different string units SU may be coupled to different select gate lines SGS0 to SGS4.

Each of the bit lines BL0 to BLm couples corresponding NAND strings NS included in the respective string units SU across a plurality of blocks BLK. The word lines WL0 to WL15 are provided for each block BLK. The source line SRC is, for example, shared by a plurality of blocks BLK.

A set of memory cell transistors MT coupled to a common word line WL in one string unit SU is referred to as, for example, a "cell unit CU". For example, the storage capacity of a cell unit CU including memory cell transistors MT each configured to store 1-bit data is defined as "1-page data". The cell unit CU may have a storage capacity of 2 or more-page data in accordance with the number of bits of data stored in each memory cell transistor MT.

The circuit configuration of the memory cell array 10 included in the semiconductor memory device 1 according to the embodiment is not limited to the above-described one. For example, the number of string units SU included in each block BLK may be any number. Likewise, the number of memory cell transistors MT, the number of select transistors STD, and the number of select transistors STS in each NAND string NS may be any number.

1.1.4 Memory Cell Array

An example of a structure of the memory cell array included in the semiconductor memory device according to the embodiment will be described below. In the drawings to be referred to below, the X direction corresponds to the direction in which the word lines WL extend, the Y direction corresponds to the direction in which the bit lines BL extend, and the Z direction corresponds to the direction vertical to the surface of a semiconductor substrate used to form the semiconductor memory device 1. In the plan views, hatching is applied as appropriate for improved visibility. The hatching applied to the plan views does not necessarily relate to the material or characteristics of the hatched constituent element. In the cross-sectional views, constituents are omitted as appropriate for improved visibility. The constituents are simplified in the drawings as appropriate.

1.1.4.1 Overall Configuration of Memory Cell Array

FIG. 3 is a plan view showing an example of a planar layout of the memory cell array included in the semiconductor memory device according to the embodiment. FIG. 3 shows an area corresponding to eight blocks BLK0 to BLK7. Hereinafter, even-numbered blocks BLK (BLK0, BLK2, . . . ) will be referred to as "BLKe", and odd-numbered blocks BLK (BLK1, BLK3, . . . ) will be referred to as "BLKo".

The memory cell array 10 includes a layer stack, a plurality of members SLT, and a plurality of members SHE. The layer stack is a structure in which the number of layers corresponding to the number of the select gate lines SGD and SGS and word lines WL are stacked in the Z direction. The layer stack includes the select gate lines SGD and SGS and word lines WL. The layer stack also includes insulating layers provided in the same layers as the word lines WL. Hereinafter, the select gate lines SGD and SGS and word lines WL in the layer stack are also collectively called "stacked-layer interconnects". The insulating layers provided in the same layers as the stacked layer interconnects in the layer stack are also collectively called "stacked-layer insulating members". A set of a stacked-layer interconnect and a stacked-layer insulating member provided in the same layer as the stacked-layer interconnect is also collectively called "a stacked-layer member SL". In particular, the stacked-layer members SL corresponding to the word lines WL0 to WL15 are referred to as "stacked-layer members SL0 to SL15", respectively.

The memory cell array 10 is divided, for example, in the X direction into memory areas MA1 and MA2 and a hookup area HA. Hereinafter, when the memory areas MA1 and MA2 are not distinguished from each other, they are merely referred to as "memory areas MA".

The memory areas MA1 and MA2 are each an area formed by stacked-layer interconnects. The memory areas MA1 and MA2 are each used for storing data. The memory areas MA1 and MA2 each include a plurality of NAND strings NS.

The hookup area HA is an area formed by stacked-layer members SL. The hookup area HA is arranged between the memory areas MA1 and MA2. In the hookup area HA, contacts, etc. for the stacked-layer interconnects of the memory cell array 10 are provided.

The members SLT extend in the X direction, and are aligned in the Y direction. The members SLT each traverse the memory areas MA1 and MA2 and hookup area HA in the X direction. Each member SLT has, for example, a structure in which an insulator and a plate-like contact are embedded. Each member SLT divides stacked-layer interconnects that are adjacent to each other via the member SLT. In the embodiment, the areas separated by the members SLT each correspond to one block BLK.

In the embodiment, the member SLT in contact with one Y-directional end (+Y-directional end) of each block BLKe is referred to as "SLTe". The member SLT in contact with one Y-directional end (+Y-directional end) of each block BLKo is referred to as "SLTo". Namely, in the memory cell array 10, multiple sets of members SLTe and SLTo are aligned in the Y direction.

The members SHE are arranged in each of the memory areas MA1 and MA2. In the embodiment, four members SHE are arranged between adjacent members SLT in each of the memory areas MA1 and MA2. In each of the memory areas MA1 and MA2, the members SHE extend in the X direction, and are aligned in the Y direction. The members SHE arranged in the memory area MA1 each traverse the memory area MA1. The members SHE arranged in the memory area MA2 each traverse the memory area MA2. Each member SHE has a structure in which an insulator is embedded. Each member SHE divides, for example, select gate lines SGD that are adjacent to each other via the member SHE. In the embodiment, the areas separated by the members SLT and SHE each correspond to one string unit SU.

The hookup area HA includes a plurality of hookup portions HP aligned in the Y direction. A hookup portion HP is arranged for every two blocks BLK. In other words, in the hookup area HA, each hookup portion HP is arranged in an area interposed between two members SLTe between which two adjacent blocks BLK are interposed.

Hereinafter, a hookup portion HP arranged in correspondence with blocks BLKk and BLK(k+1) (k=4×i, where i is an integer larger than or equal to 0) will be referred to as "HPe". A hookup portion HP arranged in correspondence with blocks BLK(k+2) and BLK(k+3) will be referred to as "HPo". In FIG. 3, a hookup portion HPe is arranged in correspondence with each of the pair of blocks BLK0 and BLK1 and the pair of blocks BLK4 and BLK5. A hookup portion HPo is arranged in correspondence with each of the pair of blocks BLK2 and BLK3 and the pair of blocks BLK6 and BLK7.

Each hookup portion HP includes a contact area CCT and two contact areas C4T. The contact area CCT is an area including a staircase structure formed by stacked-layer members SL. The contact areas C4T are each an insulating area formed by stacked-layer insulating members.

In each hookup portion HP, the contact area CCT is arranged to overlap partial areas of two adjacent blocks BLK while extending across one member SLTo between the two adjacent blocks BLK. The member SLTo overlapping the contact CCT divides a staircase structure formed by the layer stack of two adjacent blocks BLK corresponding to the contact area CCT into two in correspondence with the blocks BLK. Specifically, the contact area CCT corresponding to blocks BLK0 and BLK1, the contact area CCT corresponding to blocks BLK2 and BLK3, the contact area CCT corresponding to blocks BLK4 and BLK5, and the contact area CCT corresponding to blocks BLK6 and BLK7 are each divided by a member SLTo.

In each hookup portion HP, two contact areas C4T are provided for the respective blocks BLK. The two contact areas C4T are arranged side by side, for example, in the Y direction. The contact area CCT and each of the two contact areas C4T are arranged side by side in the X direction.

Each contact area C4T is interposed between two members OST arranged side by side separately from each other in the Y direction in the corresponding block BLK. Each member OST extends in the X direction and has a structure in which an insulator is embedded. In each block BLK, the stacked-layer interconnects in the memory area MA1 are electrically coupled to those in the memory area MA2 via an area different from the contact area C4T. Specifically, the stacked-layer interconnects in each block BLK have portions arranged side by side with the contact area C4T in the Y direction. The portions arranged side by side with the contact area C4T in the Y direction extend in the X direction across the hookup portion HP, and couple the portions of the stacked-layer interconnects which extend from the memory area MA1 side to the portions of the stacked-layer interconnects which extend from the memory area MA2 side.

In the hookup area HA, a contact area CCT and a set of two contact areas C4T included in a hookup portion HP are alternately arranged, for example, in the Y direction. In other words, in each hookup portion HPe, a contact area CCT is arranged on the memory area MA1 side, and contact areas C4T are arranged on the memory area MA2 side. In each hookup portion HPo, contact areas C4T are arranged on the memory area MA1 side, and a contact area CCT is arranged on the memory area MA2 side.

1.1.4.2 Memory Area

A structure of the memory cell array 10 in a memory area MA will be described with reference to FIG. 4. FIG. 4 is a plan view showing an example of a planar layout of a memory area of the memory cell array included in the semiconductor memory device according to the embodiment. FIG. 4 shows one block BLK, i.e., an area including the string units SU0 to SU4. Shown in FIG. 4 is a structure of the memory cell array 10 in one memory area MA of the memory areas MA1 and MA2; however, the structure of the memory cell array 10 in the memory area MA1 is substantially the same as that of the memory cell array 10 in the memory area MA2.

As shown in FIG. 4, in the memory area MA, the memory cell array 10 includes a plurality of memory pillars MP, a plurality of contacts CV, and a plurality of bit lines BL. Each member SLT includes a contact LI and spacers SP.

Each memory pillar MP functions as, for example, one NAND string NS. The memory pillars MP are in, for example, a 24-row staggered arrangement in an area between two adjacent members SLT. For example, when counted from the +Y-directional side, the memory pillars MP in each of the fifth row, the tenth row, the fifteenth row, and the twentieth row overlap one member SHE.

The bit lines BL extend in the Y direction, and are aligned in the X direction. Each bit line BL is arranged to overlap at least one memory pillar MP in each string unit SU. In the example of FIG. 4, each bit line BL is arranged to overlap two memory pillars MP in each string unit SU. One of the bit lines BL overlapping a memory pillar MP is electrically coupled to the memory pillar MP via a contact CV.

For example, a contact CV between a bit line BL and a memory pillar MP overlapping a member SHE is omitted. The number and arrangement of memory pillars MP and members SHE between adjacent members SLT are not limited to those described with reference to FIG. 4, and may be changed as appropriate. The number of bit lines BL overlapping each memory pillar MP may be any number.

The contact LI is a conductor including a portion extending in the X direction. The spacers SP are insulators provided on the side surfaces of the contact LI. The contact LI is interposed between the spacers SP. The contact LI is isolated from conductive layers (e.g., word lines WL0 to WL15 and select gate lines SGD and SGS) adjacent to the contact LI in the Y direction by the spacers SP. Accordingly, the contact LI is insulated from the conductive layers adjacent to the contact LI in the Y direction.

(Cross-Sectional Structure)

FIG. 5 is a cross-sectional view taken along line V-V in FIG. 4, showing an example of a cross-sectional structure of a memory area of the memory cell array included in the semiconductor memory device according to the embodiment. As shown in FIG. 5, the memory cell array 10 further includes a semiconductor substrate 20, conductive layers 21 to 25, and insulating layers 30 to 34.

Specifically, an insulating layer 30 is provided on the semiconductor substrate 20. The insulating layer 30 includes circuits (nor shown) corresponding to the row decoder module 15, the sense amplifier module 16, and the like. Herein, assuming that contacts are provided in the contact area CCT for coupling the conductive layers 21 to (stacked-layer interconnects) to the aforementioned circuits to be described later, the direction along the Z direction in which the contacts locate with respect to the corresponding stacked-layer interconnects is defined as an upward direction.

A conductive layer 21 is provided on the insulating layer 30. The conductive layer 21 is formed, for example, in a plate-like shape expanding along the XY plane, and is used as a source line SRC. The conductive layer 21 contains, for example, phosphorous-doped silicon.

An insulating layer 31 is provided on the conductive layer 21. A conductive layer 22 is provided on the insulating layer 31. The conductive layer 22 is formed, for example, in a plate-like shape expanding along the XY plane, and is used as a select gate line SGS. The conductive layer 22 contains, for example, tungsten.

On the conductive layer 22, an insulating layer 32 and a conductive layer 23 are alternately stacked. The conductive layer 23 is formed, for example, in a plate-like shape expanding along the XY plane. The stacked conductive layers 23 are used as word lines WL0 to WL15 in the order from the semiconductor substrate 20 side. The conductive layer 23 contains, for example, tungsten.

An insulating layer 33 is provided on the uppermost conductive layer 23. A conductive layer 24 is provided on the insulating layer 33. The conductive layer 24 is formed, for example, in a plate-like shape expanding along the XY plane, and is used as a select gate line SGD. The conductive layer 24 contains, for example, tungsten.

An insulating layer 34 is provided on the conductive layer 24. A conductive layer 25 is provided on the insulating layer 34. The conductive layer 25 is formed, for example, in a linear shape extending in the Y direction, and is used as a bit line BL. The conductive layer 25 contains, for example, copper.

Each memory pillar MP extends in the Z direction, and passes through the insulating layers 31 to 33 and conductive layers 22 to 24. The bottom of the memory pillar MP is in contact with the conductive layer 21. The portion where the memory pillar MP intersects the conductive layer 22 functions as a select transistor STS. The portion where the memory pillar MP intersects each conductive layer 23 functions as a memory cell transistor MT. The portion where the memory pillar MP intersects the conductive layer 24 functions as a select transistor STD.

Each memory pillar MP includes, for example, a core member 40, a semiconductor layer 41, and a stacked film 42. The core member 40 is provided so as to extend in the Z direction. The upper end of the core member 40 is included in a layer above the conductive layer 24. The lower end of the core member 40 reaches, for example, the same level as the conductive layer 21. The semiconductor layer 41 covers the periphery of the core member 40. At the bottom of the memory pillar MP, a portion of the semiconductor layer 41 is in contact with the conductive layer 21. The stacked film 42 covers the side and bottom surfaces of the semiconductor layer 41, except for the portion of the semiconductor layer 41 in contact with the conductive layer 21. The core member 40 contains an insulator, such as silicon oxide. The semiconductor layer 41 contains, for example, silicon.

A pillar-shaped contact CV is provided on the top surface of the semiconductor layer 41 in the memory pillar MP. In the illustrated area, two contacts CV corresponding to two of the six memory pillars MP are shown. The memory pillars MP not overlapping any member SHE and not coupled to any contact CV in the memory area MA are each coupled to a contact CV in an area not shown in FIG. 5.

The top of the contact CV is in contact with one conductive layer 25, i.e., one bit line BL. One contact CV is coupled to one conductive layer 25 in each of the spaces separated by the members SLT and SHE. That is, each conductive layer 25 is electrically coupled to a memory pillar MP provided between each set of adjacent members SLT and SHE and a memory pillar MP provided between each set of two members SHE.

The member SLT includes a portion expanding along the XZ plane, and divides each of the conductive layers 22 to 24. The contact LI in the member SLT is provided so as to extend along the member SLT. The upper end of the contact LI is positioned between the conductive layer 24 and the conductive layer 25. The lower end of the contact LI is in contact with the conductive layer 21. The contact LI is used as, for example, part of the source line SRC. The spacer SP is provided between the contact LI and the conductive layers 22 to 24. The contact LI is isolated and insulated from the conductive layers 22 to 24 by the spacer SP.

The member SHE includes, for example, a portion expanding along the XZ plane, and divides the conductive layer 24. The upper end of the member SHE is positioned between the conductive layer 24 and the conductive layer 25. The lower end of the member SHE is positioned between the uppermost conductive layer 23 and the conductive layer 24. The member SHE contains an insulator, such as silicon oxide. The upper end of the member SHE may be aligned with, or unaligned with, the upper end of the member SLT. The upper end of the member SHE may be aligned with, or unaligned with, the upper end of the memory pillar MP.

Figure 6:
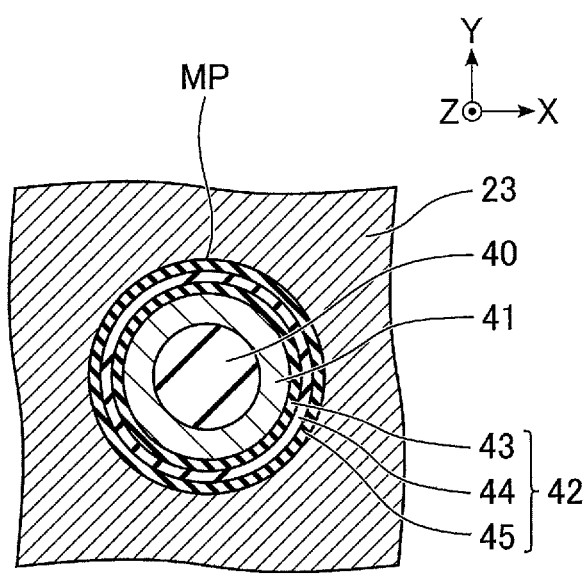
FIG. 6 is a cross-sectional view taken along line VI-VI in FIG. 5, showing an example of a cross-sectional structure of a memory pillar of the memory cell array included in the semiconductor memory device according to the embodiment.

A cross-sectional structure of a memory pillar MP in the semiconductor memory device 1 according to the embodiment will be described with reference to FIG. 6. FIG. 6 is a cross-sectional view taken along line VI-VI in FIG. 5, showing an example of a cross-sectional structure of a memory pillar of the memory cell array included in the semiconductor memory device according to the embodiment.

As shown in FIG. 6, the stacked film 42 includes, for example, a tunnel insulating film 43, an insulating film 44, and a block insulating film 45.

In a cross section including a conductive layer 23, the core member 40 is provided in the middle of the memory pillar MP. The semiconductor layer 41 surrounds the side surface of the core member 40. The tunnel insulating film 43 surrounds the side surface of the semiconductor layer 41. The insulating film 44 surrounds the side surface of the tunnel insulating film 43. The block insulating film 45 surrounds the side surface of the insulating film 44. The conductive layer 23 surrounds the side surface of the block insulating film 45. The tunnel insulating film 43 and block insulating film 45 each contain, for example, silicon oxide. The insulating film 44 contains, for example, silicon nitride.

In the above-described memory pillar MP, the semiconductor layer 41 functions as channels (current paths) of the memory cell transistors MT0 to MT15 and the select transistors STD and STS. The insulating film 44 is used as the charge storage layer of each memory cell transistor MT. The semiconductor memory device 1 turns on the memory cell transistors MT0 to MT15 and select transistors STD and STS to allow a current to pass through the memory pillar MP between the bit line BL and the source line SRC.

1.1.4.3 Hookup Area

Figure 7:
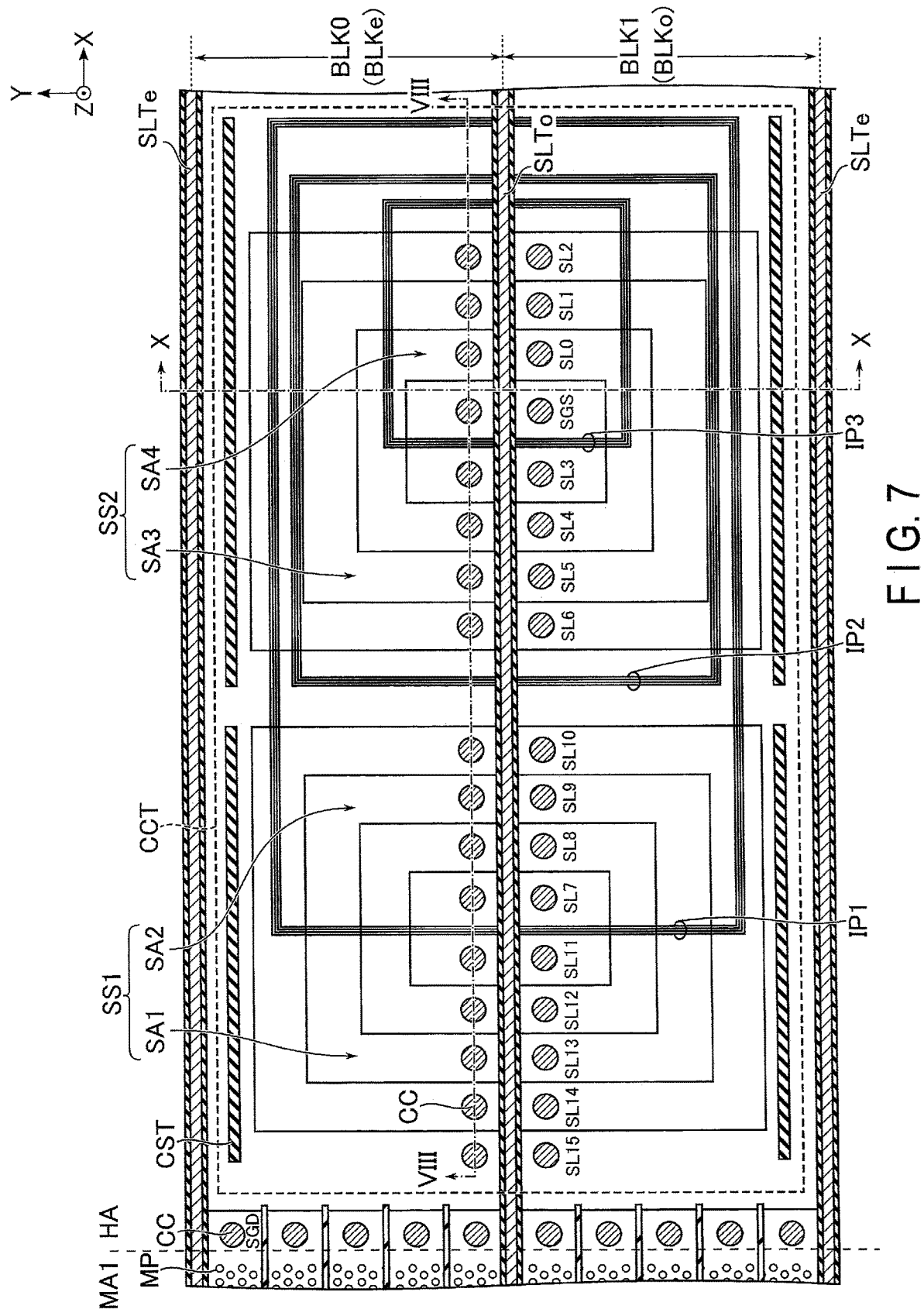
FIG. 7 is a plan view showing an example of a planar layout of a contact area, and its vicinity, of the memory cell array included in the semiconductor memory device according to the embodiment.

A structure of the hookup area HA will be described with reference to FIG. 7. FIG. 7 is a plan view showing an example of a planar layout of a contact area, and its vicinity, of the memory cell array included in the semiconductor memory device according to the embodiment. FIG. 7 shows a contact area CCT (included in a hookup portion HPe) corresponding to an area of adjacent blocks BLK0 (BLKe) and BLK1 (BLKo), and part of the memory area MA1 in the vicinity of the contact area CCT. A structure of the contact area CCT and its vicinity will be mainly described below.

In the contact area CCT and its vicinity, each of a plurality of stacked-layer members SL has a portion (hereinafter referred to as a "terrace portion") not overlapping the upper stacked-layer member SL. The terrace portions of the select gate line SGS and the stacked-layer members SL0 to SL15 are included in the contact area CCT. The terrace portion of the select gate line SGD is included in an end portion of the hookup area HA on the memory area MA1 side, for example outside the contact area CCT.

The terrace portion is shaped like a step, a terrace, a rimstone, or the like. Specifically, for example, in an end portion of the hookup area HA on the memory area MA1 side, a step is provided between the select gate line SGD and the stacked-layer member SL15. In the contact area CCT, a step is provided between the stacked-layer member SL15 and the stacked-layer member SL14, between the stacked-layer member SL14 and the stacked-layer member SL13, between the stacked-layer member SL1 and the stacked-layer member SL0, and the stacked-layer member SL0 and the select gate line SGS.

In the contact area CCT, the memory cell array 10 includes stadium-like staircase portions SS (SS1 and SS2), inclined portions IP (IP1, IP2, and IP3), and a plurality of members CST, and a plurality of contacts CC.

Each of the stadium-like staircase portions SS is a plurality of terrace portions formed to ascend from a center portion in all directions in a plan view. The layer stack is recessed towards the center portion of the stadium-like staircase portion SS. The center portion of the stadium-like staircase portion SS is provided across the member SLTo. The stadium-like staircase portions SS1 and SS2 are arranged side by side in the X direction.

Each of the inclined portions IP is a step including the ends of a plurality of (four in the example of FIG. 7) consecutive stacked-layer members SL, which is provided in a rectangular shape in a plan view. The layer stack is recessed from the outside to the inside of the inclined portion IP. The inclined portion IP1 is provided so as to laterally traverse the stadium-like staircase portion SS2 in the X direction and longitudinally traverse the center portion of the stadium-like staircase portion SS1 in the Y direction. The inclined portion IP2 is provided inside the inclined portion IP1 so as to laterally traverse the stadium-like staircase portion SS2 in the X direction and longitudinally traverse in the Y direction between the stadium-like staircase portion SS1 and the stadium-like staircase portion SS2. The inclined portion IP3 is provided inside the inclined portion IP2 so as to longitudinally traverse the center portion of the stadium-like staircase portion SS2 in the Y direction.

The stadium-like staircase portions SS1 and SS2 are divided into staircase areas SA1, SA2, SA3, and SA4 by the inclined portions IP1, IP2, and IP3.

The staircase area SA1 is an area of the stadium-like staircase portions SS1 and SS2 which lies outside the inclined portion IP1. The staircase area SA1 includes, for example, the terrace portions of the stacked-layer members SL11 to SL15. In the staircase area SA1, the terrace portions of the stacked-layer members SL11 to SL15 are arranged to descend in the X direction from the memory area MA1 side to the memory area MA2 side.

The staircase area SA2 is an area of the stadium-like staircase portions SS1 and SS2 which lies inside the inclined portion IP1 and outside the inclined portion IP2. The staircase area SA2 includes, for example, the terrace portions of the stacked-layer members SL7 to SL10. In the staircase area SA2, the terrace portions of the stacked-layer members SL7 to SL10 are arranged to ascend in the X direction from the memory area MA1 side to the memory area MA2 side.

The staircase area SA3 is an area of the stadium-like staircase portions SS1 and SS2 which lies inside the inclined portion IP2 and outside the inclined portion IP3. The staircase area SA3 includes, for example, the terrace portions of the stacked-layer members SL3 to SL6. In the staircase area SA3, the terrace portions of the stacked-layer members SL3 to SL6 are arranged to descend in the X direction from the memory area MA1 side to the memory area MA2 side.

The staircase area SA4 is an area inside the inclined portion IP3. The staircase area SA4 includes, for example, the terrace portions of the stacked-layer members SL0 to SL2 and select gate line SGS. In the staircase area SA4, the terrace portions of the select gate line SGS and stacked-layer members SL0 to SL2 are arranged to ascend in the X direction from the memory area MA1 side to the memory area MA2 side.

The terrace portion of the stacked-layer member SL11 in the staircase area SA1 and the terrace portion of the stacked-layer member SL7 in the staircase area SA2 are provided so as to be adjacent to each other with a portion of the inclined portion IP1 on the memory area MA1 side interposed therebetween in the X direction. The terrace portion of the stacked-layer member SL3 in the staircase area SA3 and the terrace portion of the select gate line SGS in the staircase area SA4 are provided so as to be adjacent to each other with a portion of the inclined portion IP3 on the memory area MA1 side interposed therebetween in the X direction.

Each member CST extends in the X direction and has a structure in which an insulator is embedded. The member CST is provided to pass through the layer stack. In the example shown in FIG. 7, the memory cell array 10 includes, for example, two members CST in each block BLK. That is, the memory cell array 10 includes four members CST per contact area CCT. The two members CST included in each block BLK are arranged side by side in the X direction. The space between the two members CST and the border between the stadium-like staircase portions SS1 and SS2 are aligned in the Y direction. The two members CST included in the block BLKe and the two members CST included in the block BLKo are provided so as to interpose, for example, the terrace portions of the select gate line SGS and stacked-layer members SL0 to SL14 therebetween in the Y direction.

In the hookup area HA, each of the contacts CC is provided on the top surface of the terrace portion of a corresponding stacked-layer member SL among the terrace portions of the stacked-layer members SL provided in each block BLK.

In the contact area CCT, the contacts CC corresponding respectively to the select gate line SGS and stacked-layer members SL0 to SL15 included in one block BLK are arranged, for example, in the X direction in a straight line. The contacts CC corresponding respectively to the stacked-layer members SL15, SL14, SL13, SL12, SL11, SL7, SL8, SL9, SL10, SL6, SL5, SL4, and SL3, select gate line SGS, and stacked-layer members SL0, SL1, and SL2 are arranged in the order of appearance from the memory area MA1 side to the memory area MA2 side. However, the contacts CC corresponding respectively to the select gate line SGS and stacked-layer members SL0 to SL15 need not necessarily be arranged in a straight line, and may be misaligned in the Y direction.

In an end portion of the hookup area HA, the contacts CC corresponding respectively to the select gate lines SGD of the string units SU are arranged, for example, in the Y direction in a straight line. However, the contacts CC corresponding respectively to the select gate lines SGD need not necessarily be arranged in a straight line, and may be misaligned in the X direction.

In the hookup area HA, the portion corresponding to the block BLK0 (BLKe) and the portion corresponding to the block BLK1 (BLKo) have Y-directionally symmetric structures with respect to, for example, the member SLTo.

The structure of the contact area CCT included in the hookup portion HPo is similar to, for example, the structure of the contact area CCT included in the hookup portion HPe. In each hookup portion HPe, the contact area CCT is provided, for example, on the memory area MA1 side. In each hookup portion HPo, the contact area CCT is provided, for example, on the memory area MA2 side.

Figure 8:
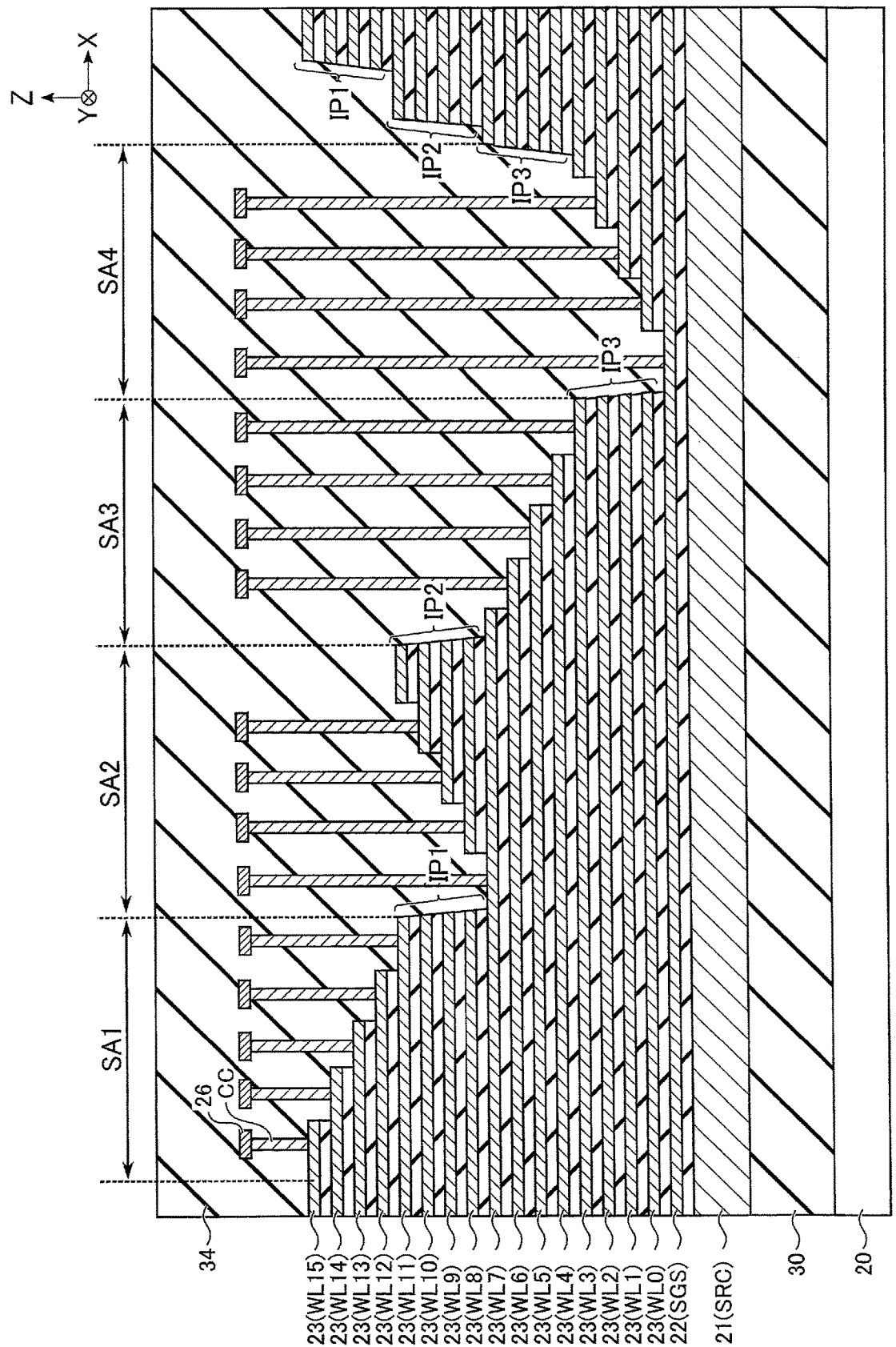
FIG. 8 is a cross-sectional view taken along line VIII-VIII in FIG. 7, showing an example of a cross-sectional structure of a part of a hookup area of the memory cell array included in the semiconductor memory device according to the embodiment.

Next, a cross-sectional structure of the contact area CCT of the memory cell array 10 will be described with reference to FIG. 8. FIG. 8 is a cross-sectional view taken along line VIII-VIII of FIG. 7, showing an example of a cross-sectional structure of a part of the hookup area of the memory cell array included in the semiconductor memory device according to the embodiment.

In the cross section shown in FIG. 8, the layer stack includes the terrace portions of the conductive layers 23 corresponding to the word lines WL0 to WL15 and the conductive layer 22 corresponding to the select gate line SGS. Accordingly, in the cross section shown in FIG. 8, the conductive layers 23 and conductive layer 22 are coupled to the corresponding contacts CC.

An insulating layer 34 is provided above the conductive layers 23.

The staircase structure provided in the staircase area SA1 and the staircase structure provided in the staircase area SA2 are plane-symmetrical with respect to the YZ plane except for the height, for example. The staircase structure in the staircase area SA1 is higher than that in the staircase area SA2.

The staircase structure provided in the staircase area SA3 and the staircase structure provided in the staircase area SA4 are plane-symmetrical with respect to the YZ plane except for the height, for example. The staircase structure in the staircase area SA3 is higher than the staircase structure in the staircase area SA4.

In the contact area CCT, the memory cell array 10 includes a plurality of conductive layers 26 corresponding to a plurality of contacts CC. Each of the conductive layers 26 is provided on the top surface of the corresponding contact CC. Accordingly, the conductive layers 22 and 23 are electrically coupled to the associated conductive layers 26 via the contacts CC. The conductive layers 26 are included in, for example, a layer at the same level as the conductive layer 25.

In this manner, the stacked-layer interconnects coupled to the NAND strings NS are electrically coupled to the row decoder module 15 via the contacts CC and conductive layers 26 associated with the stacked-layer interconnects. The contacts CC are coupled to the row decoder module 15 via, for example, the contact area C4T. The contacts CC may be coupled to the row decoder module 15 via contacts provided in an area outside the memory cell array 10.

In the cross-sectional view of FIG. 8, the contacts CC corresponding to word lines WL15 to WL11 and WL7 to WL3 are coupled to portions of stacked-layer interconnects extending from the memory area MA1 side. The contacts CC corresponding to word lines WL2 to WL0 are coupled to portions of stacked-layer interconnects extending from the memory area MA2 side. The contact CC corresponding to the select gate line SGS is coupled to both of a portion of a stacked-layer interconnect extending from the memory area MA1 side and a portion of a stacked-layer interconnect extending from the memory area MA2 side. The portions of stacked-layer interconnects extending from the memory area MA1 side are coupled to the portions of stacked-layer interconnects extending from the memory area MA2 side via portions of stacked-layer interconnects which are not shown in FIG. 8. The contacts CC corresponding to word lines WL3 to WL10 (included in the staircase areas SA2 and SA3) are coupled via, for example, an area not shown in FIG. 8 to portions which couple the portions of stacked-layer interconnects extending from the memory area MA1 side to the portions of stacked-layer interconnects extending from the memory area MA2 side.

Figure 9:
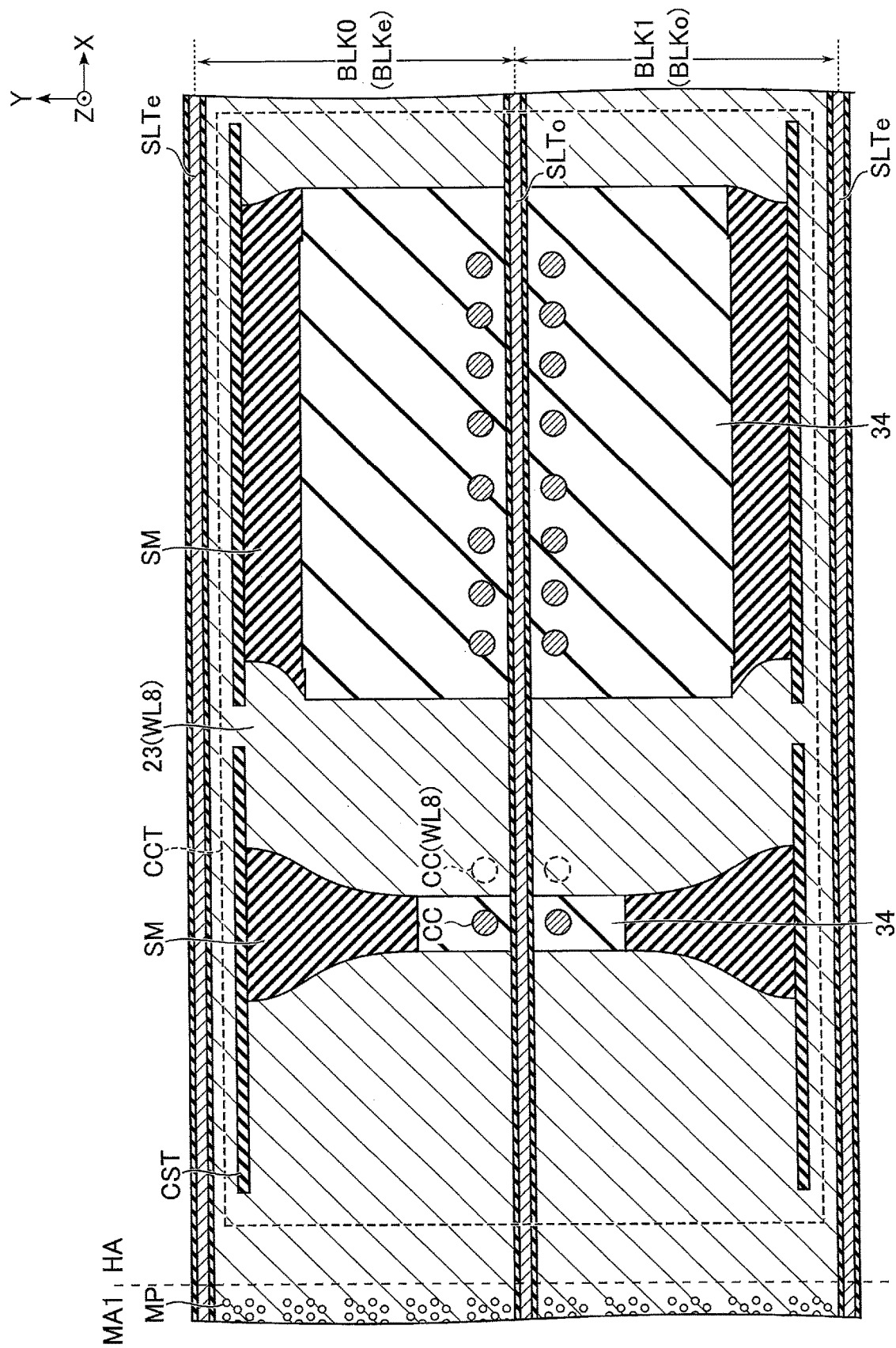
FIG. 9 is a cross-sectional view showing an example of a cross-sectional structure of the memory cell array included in the semiconductor memory device according to the embodiment.

Coupling between the contacts CC provided in the staircase area SA2 and a memory area MA will be described with reference to FIG. 9. FIG. 9 is a cross-sectional view showing an example of a cross-sectional structure of the memory cell array included in the semiconductor memory device according to the embodiment. FIG. 9 shows an XY cross section of the area shown in FIG. 7 of the memory cell array 10, which includes the stacked-layer member SL8.

As shown in FIG. 9, at the same level as the stacked-layer member SL8, an insulating layer 34, which is not included in the layer stack, is provided in an area including the terrace portions of the layers lower than the stacked-layer member SL8. Specifically, an insulating layer 34 is formed at the same level as the stacked-layer member SL8 in each of an area on the memory area MA1 side and an area on the memory area MA2 side in each block BLK. Each insulating layer 34 is in contact with the member SLTo. The area on the memory area MA1 side where the insulating layer 34 is provided corresponds to the terrace portion of the stacked-layer member SL7. The area on the memory area MA2 side where the insulating layer 34 is provided corresponds to the terrace portions of the stacked-layer members SL0 to SL6 and select gate line SGS. In each block BLK, the contacts CC corresponding to the lower-layer word lines WL7 to WL0 and select gate line SGS each pass through the corresponding one of the two insulating layers 34. In FIG. 9, the contact CC corresponding to the word line WL8 is provided at the position of the circle indicated by a dashed line on the top surface of the conductive layer 23 corresponding to the word line WL8.

In each block BLK, the stacked-layer member SL includes a sacrificial member SM between the insulating layer 34 on the memory area MA1 side and the member CST on the memory area MA1 side, and a sacrificial member SM between the insulating layer 34 on the memory area MA2 side and the member CST on the memory area MA2 side. The sacrificial member SM is provided to form the conductive layer 22 and conductive layers 23 in the manufacturing processes of the semiconductor memory device 1 to be described later, and remains without being replaced with the conductive layer 22 and conductive layers 23. Two sacrificial members SM are in contact with the corresponding members CST and insulating layers 34. The sacrificial member SM contains an insulator. The insulator contained in the sacrificial member SM is, for example, silicon nitride.

Between the two members CST and the member SLTo, the portion of the conductive layer 23 where the contact CC is provided is isolated from both memory areas MA1 and MA2 by the above-described two insulating layers 34 and two sacrificial members SM. However, the portion of the conductive layer 23 where the contact CC is provided is coupled to both memory areas MA1 and MA2 through the space between the two members CST and the space between the two members CST and the member SLTe. Therefore, the conductive layer 23 corresponding to the word line WL8 can electrically couple the corresponding contact CC and memory cell transistor MT. The same applies to the other conductive layers 23 having terrace portions in the staircase area SA2.

Figure 10:
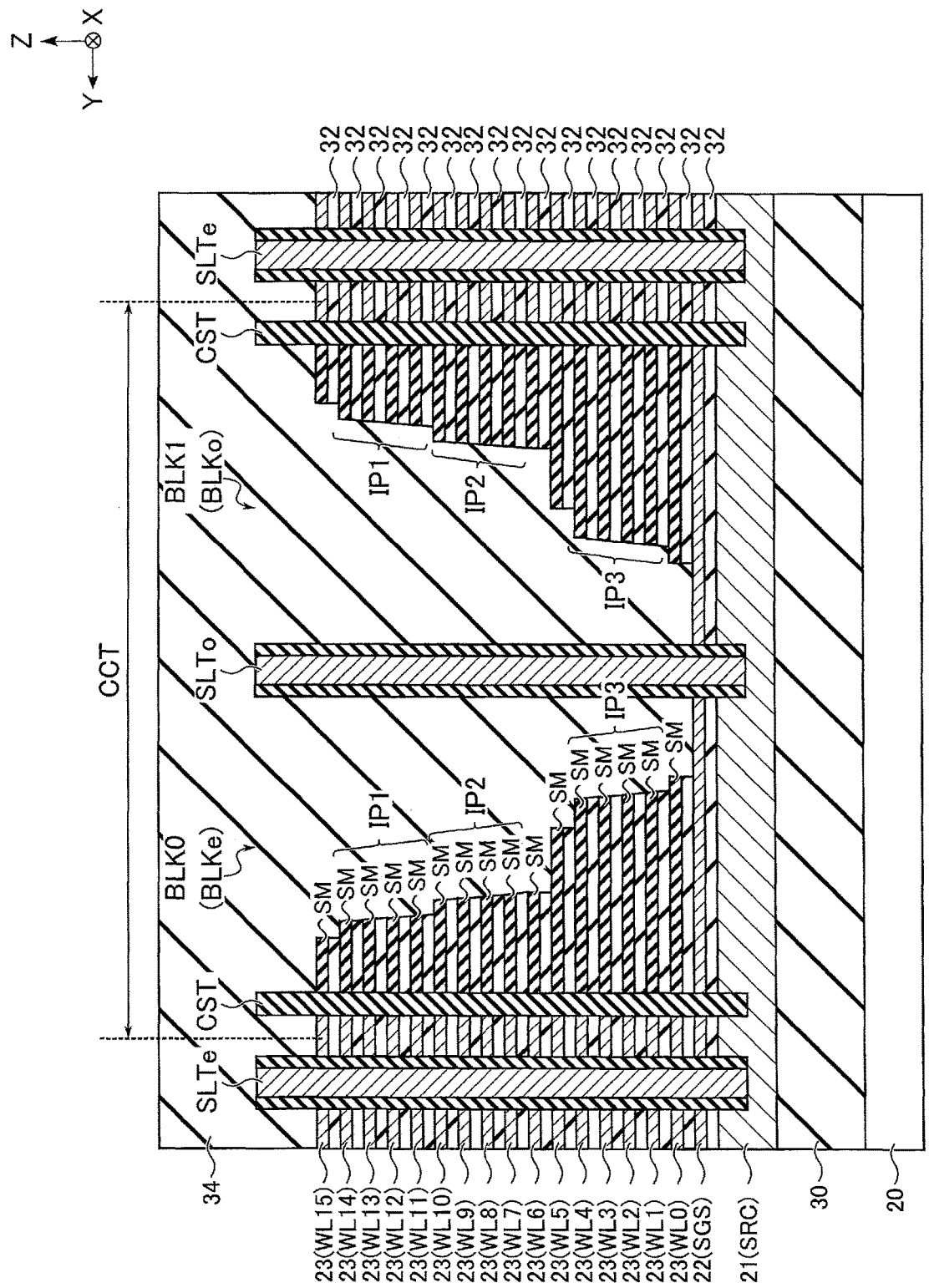
FIG. 10 is a cross-sectional view taken along line X-X in FIG. 7, showing an example of a cross-sectional structure of a part of the hookup area of the memory cell array included in the semiconductor memory device according to the embodiment.

FIG. 10 is a cross-sectional view taken along line X-X of FIG. 7, showing an example of a cross-sectional structure of a part of the hookup area of the memory cell array included in the semiconductor memory device according to the embodiment. FIG. 10 shows an area including the staircase area SA4.

In the cross section shown in FIG. 10, the levels of the top surfaces of the members CST are, for example, higher than the level of the top surface of the conductive layer 23 corresponding to the word line WL15. The levels of the bottom surfaces of the members CST are, for example, lower than the level of the bottom surface of the conductive layer 22. The levels of the top surfaces of the members CST are, for example, similar to the levels of the top surfaces of the members SLT. The levels of the bottom surfaces of the members CST are, for example, similar to the levels of the bottom surfaces of the members SLT.

Between the member SLTe and the member CST, the layer stack of the memory cell array 10 includes a conductive layer 22 and a plurality of conductive layers 23. The conductive layer 22 and conductive layers 23 are each in contact with the member SLTe and the member CST.

Between the member CST and the member SLTo, the layer stack of the memory cell array 10 includes a conductive layer 22 and a plurality of sacrificial members SM. In each block BLK, the sacrificial members SM are provided in correspondence with the conductive layers 23. The sacrificial members SM are each provided at a level similar to that of the corresponding conductive layer 23. The conductive layer 22 is in contact with the members SLTo and CST. The sacrificial members SM are in contact with the member CST. However, the sacrificial members SM are in contact with the insulating layer 34, and thus not in contact with the member SLTo. The conductive layer 22 and sacrificial members SM form, for example, a V-shaped structure together with a plurality of insulating layers 32 in the YZ cross section including the staircase area SA4 of the contact area CCT. That is, a plurality of stacked-layer members SL form staircase structures whose heights each increase from the member SLTo side to the member SLTe side. In the V-shaped structure, an insulating layer 34 is embedded in the portion surrounded by the ends of the sacrificial members SM, the ends of the insulating layers 32, and the conductive layer 22.

In the block BLK0, the sacrificial members SM include inclined portions IP1 to IP3 whose heights each increase in the +Y direction. In the block BLK1, the sacrificial members SM include inclined portions IP1 to IP3 whose heights each increase in the −Y direction. Specifically, at the same levels as the word lines WL11 to WL14 in each block BLK, the ends of the four sacrificial members SM are included in the inclined portion IP1. At the same levels as the word lines WL7 to WL10 in each block BLK, the ends of the four sacrificial members SM are included in the inclined portion IP2. At the same levels as the word lines WL1 to WL4 in each block BLK, the ends of the four sacrificial members SM are included in the inclined portion IP3. The inclined portions IP included in the block BLKe and the inclined portions IP included in the block BLKo are provided plane-symmetrically with respect to, for example, the XZ plane.

1.2 Method of Manufacturing Semiconductor Memory Device

Figure 11:
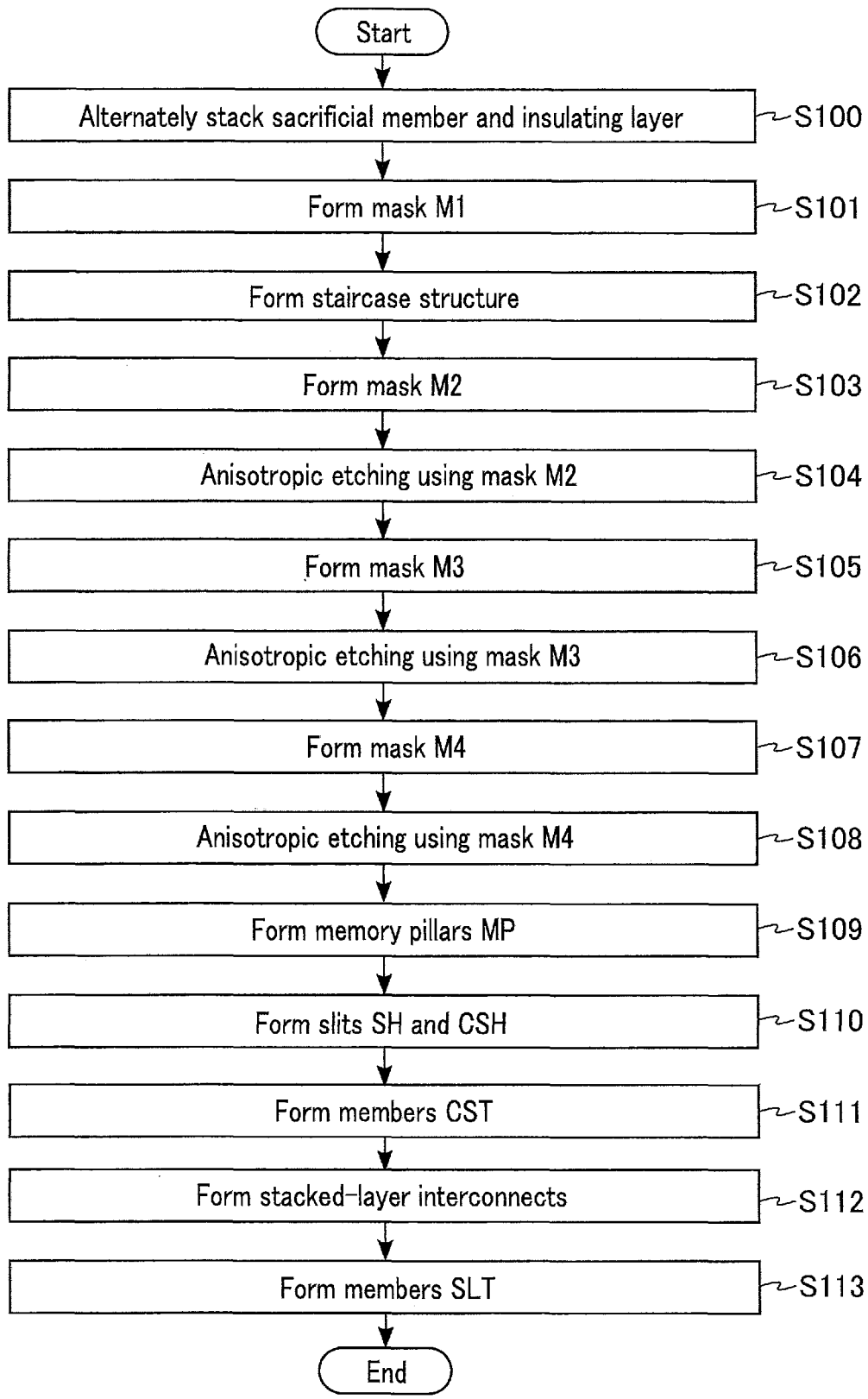
FIG. 11 is a flowchart showing an example of a method of manufacturing the semiconductor memory device according to the embodiment.

FIG. 11 is a flowchart showing an example of a method of manufacturing the semiconductor memory device according to the embodiment. FIGS. 12 to 33 are each a plan view or a cross-sectional view showing an example of an in-process structure of the memory cell array 10 included in the semiconductor memory device 1 according to the embodiment. The plan views of FIGS. 13, 14, 17, 20, 23, 27, 29, and 32 show the area corresponding to FIG. 7. The cross-sectional views of FIGS. 12, 15, 18, 21, 24, 26, and 33 show the area corresponding to FIG. 8. The cross-sectional views of FIGS. 16, 19, 22, 25, 28, 30, and 31 show the area corresponding to FIG. 10. Hereinafter, an example of a manufacturing process relating to the formation of a staircase structure of the layer stack in the semiconductor memory device 1 according to the embodiment will be described with reference to FIG. 11 as appropriate.

As shown in FIG. 11, in the manufacturing process of the semiconductor memory device 1 according to the embodiment, steps S100 to S113 are sequentially performed.

First, a sacrificial member and an insulating layer are alternately stacked (S100).

Figure 12:
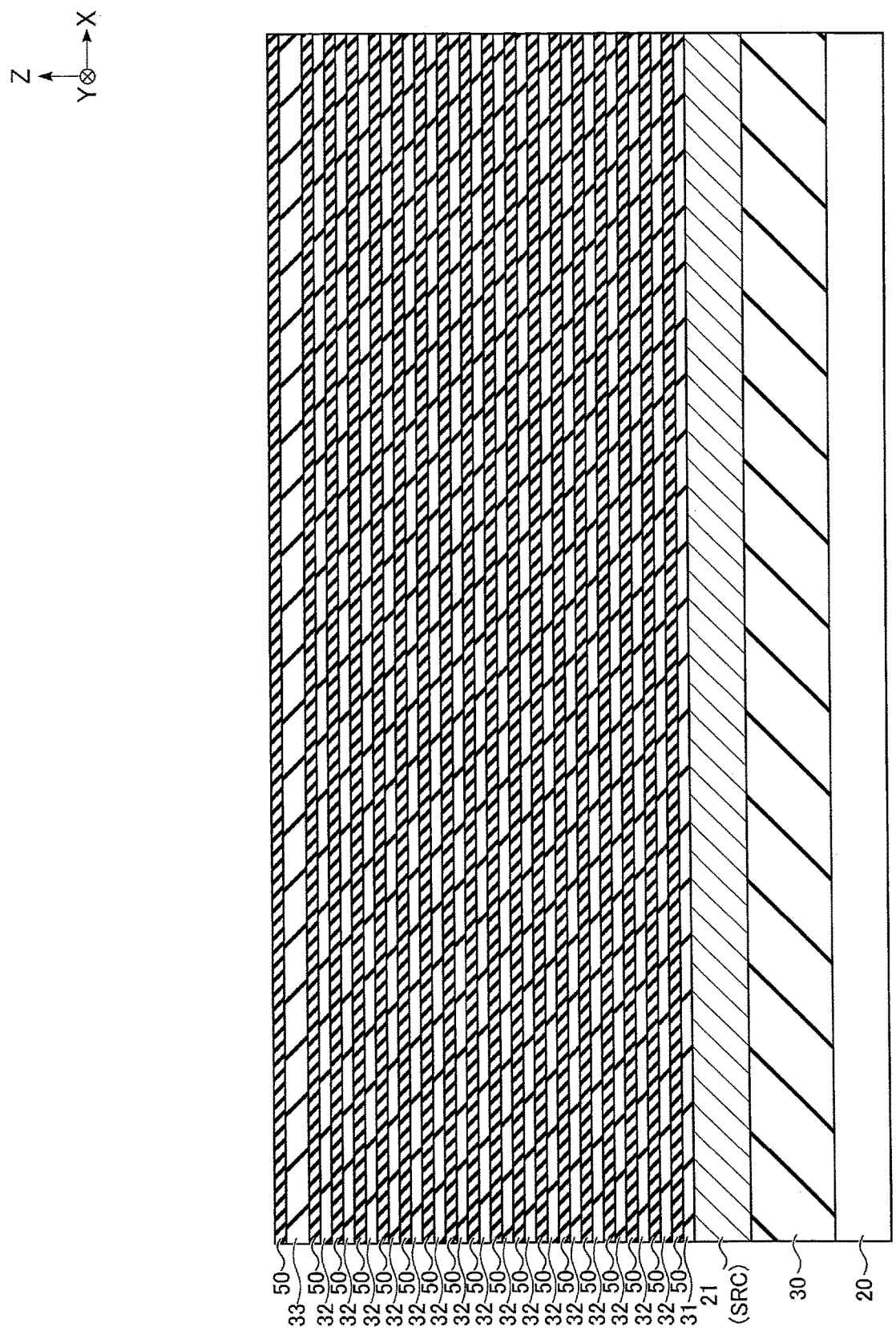
FIG. 12 is a cross-sectional view for explaining an example of a method of manufacturing the memory cell array included in the semiconductor memory device according to the embodiment.

Specifically, as shown in FIG. 12, an insulating layer 30 including circuits (not shown) corresponding to the row decoder module 15 and the like is formed on a semiconductor substrate 20. A conductive layer 21 and an insulating layer 31 are sequentially formed on the insulating layer 30. On the insulating layer 31, 16 sacrificial members 50 and 16 insulating layers 32 are formed in the order of the sacrificial member 50, the insulating layer 32, the sacrificial member 50, ..., the sacrificial member 50, and the insulating layer 32. On the uppermost insulating layer 32, two sacrificial members 50 and one insulating layer 33 are stacked in the order of the sacrificial member 50, the insulating layer 33, and the sacrificial member 50. The sacrificial members 50 shown in FIG. 12 are associated with the select gate line SGS, stacked-layer members SL0 to SL15, and select gate line SGD.

In the hookup area HA, one sacrificial member 50 is partially removed.

Figure 13:
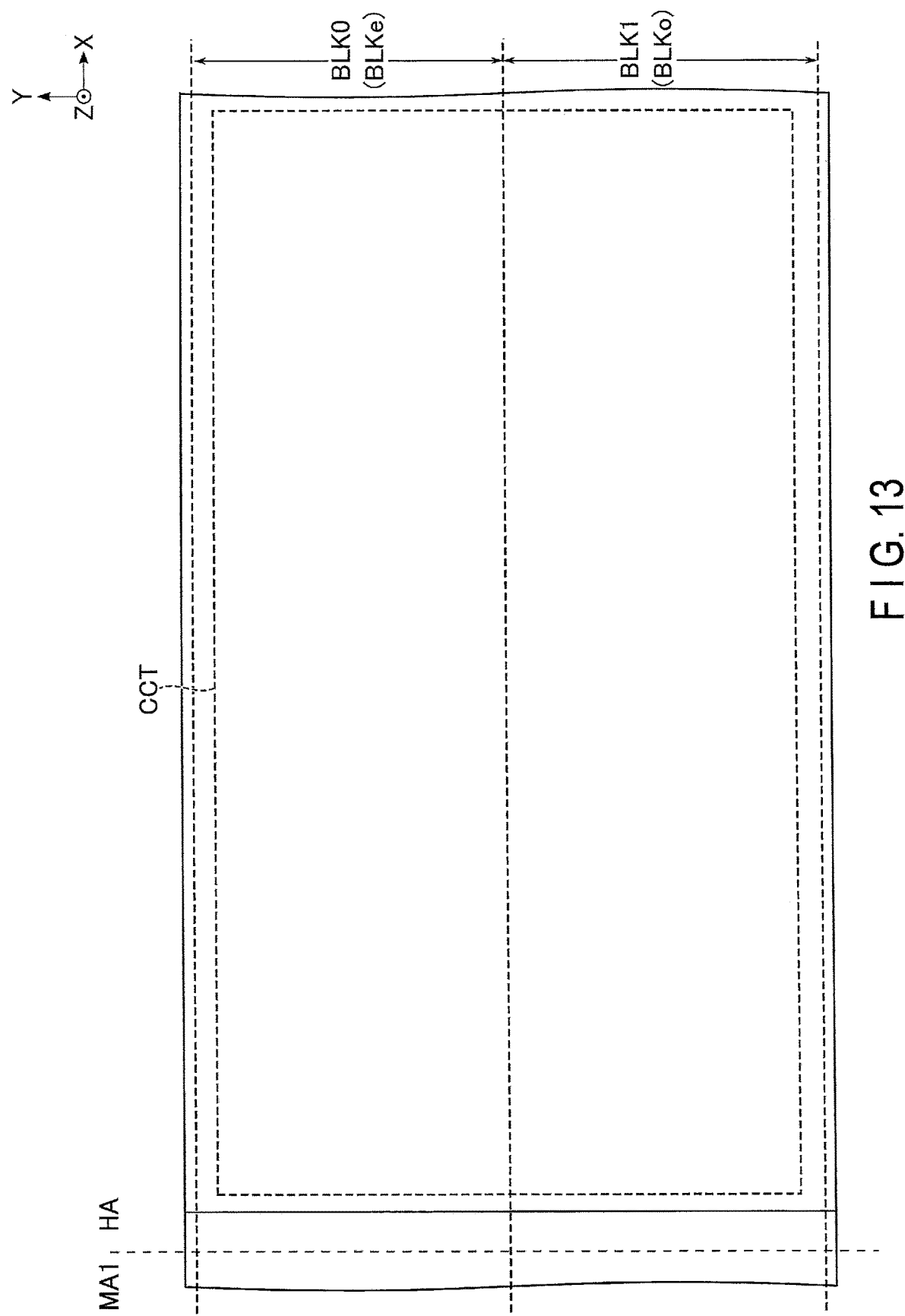
FIG. 13 is a plan view for explaining an example of the method of manufacturing the memory cell array included in the semiconductor memory device according to the embodiment.

Specifically, as shown in FIG. 13, at least one sacrificial member 50 is removed in the hookup area HA other than an end on the memory area MA1 side. Accordingly, a step is formed by at least one sacrificial member 50 in the vicinity of the border between the hookup area HA and the memory area MA1. In the contact area CCT, the aforementioned sacrificial member 50 and insulating layer 33 are removed.

Figure 14:
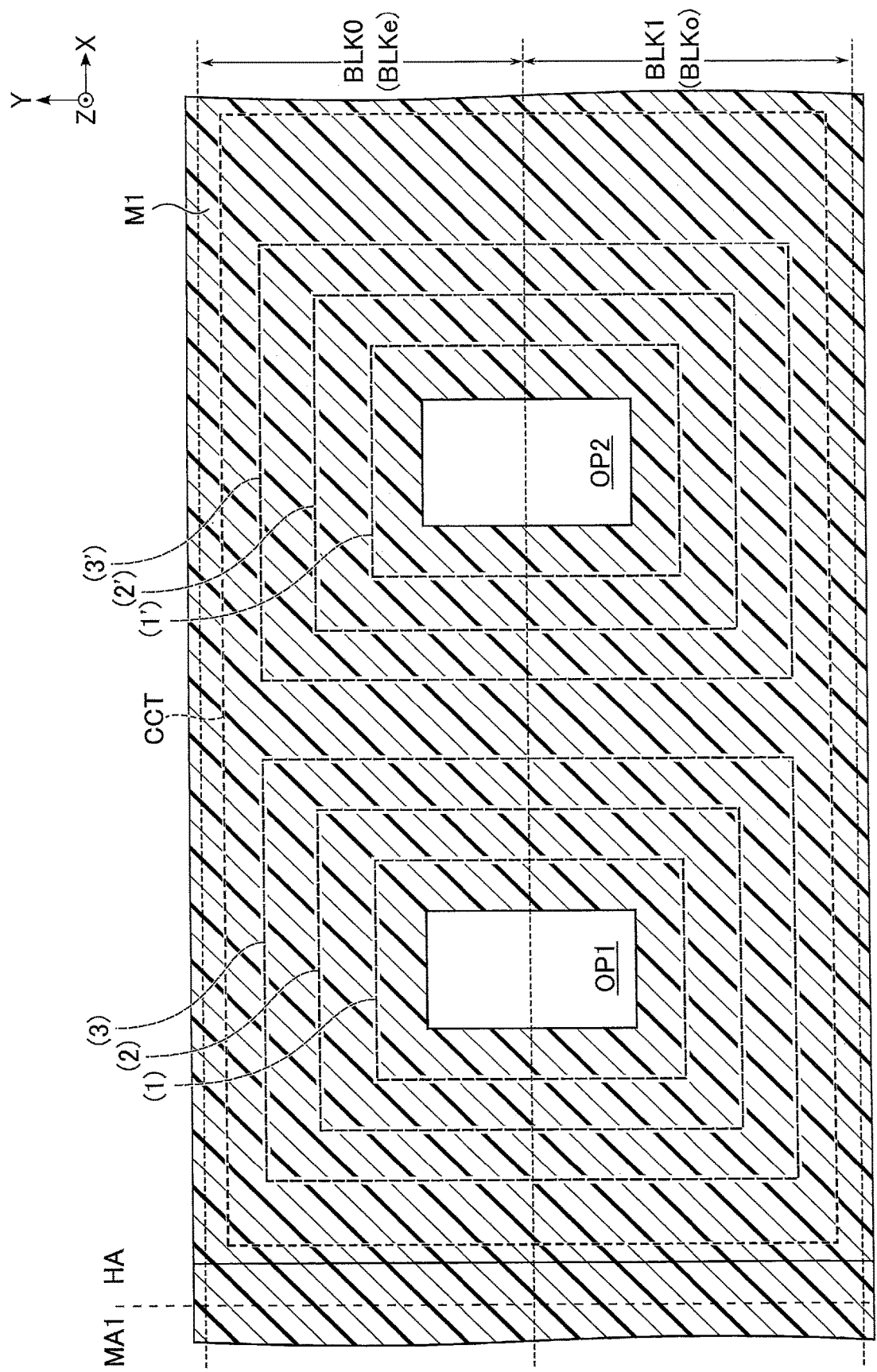
FIG. 14 is a plan view for explaining an example of the method of manufacturing the memory cell array included in the semiconductor memory device according to the embodiment.

Then, a mask M1 is formed as shown in FIG. 14 (S101). The mask M1 includes openings OP1 and OP2. The openings OP1 and OP2 are formed by, for example, lithography. The opening OP1 includes a portion corresponding to an area where the terrace portions of the stacked-layer members SL11 and SL7 are formed. The opening OP2 includes a portion corresponding to an area where the terrace portions of the stacked-layer member SL3 and select gate line SGS are formed.

By repeating anisotropic etching and isotropic etching, two stadium-like staircase structures are formed (S102).

Specifically, anisotropic etching using the mask M1 is executed, and one sacrificial member 50 is thereby removed. Then, isotropic etching of the mask M1 is executed. The openings OP1 and OP2 are thereby isotropically enlarged to the portions indicated by the dashed lines (1) and (1') in FIG. 14. Then, anisotropic etching using the mask M1 is executed. Accordingly, at each of the openings OP1 and OP2 enlarged to the portions indicated by the dashed lines (1) and (1'), one sacrificial member 50 is removed. Thereafter, isotropic etching of the mask M1 is executed. The openings OP1 and OP2 are thereby isotropically enlarged to the portions indicated by the dashed lines (2) and (2') in FIG. 14. Then, anisotropic etching using the mask M1 is executed. Accordingly, at each of the openings OP1 and OP2 enlarged to the portions indicated by the dashed lines (2) and (2'), one sacrificial member 50 is removed. Thereafter, isotropic etching of the mask M1 is executed. The openings OP1 and OP2 are thereby isotropically enlarged to the portions indicated by the dashed lines (3) and (3') in FIG. 14. Then, anisotropic etching using the mask M1 is executed. Accordingly, at each of the openings OP1 and OP2 enlarged to the portions indicated by the dashed lines (3) and (3'), one sacrificial member 50 is removed.

Figure 15:
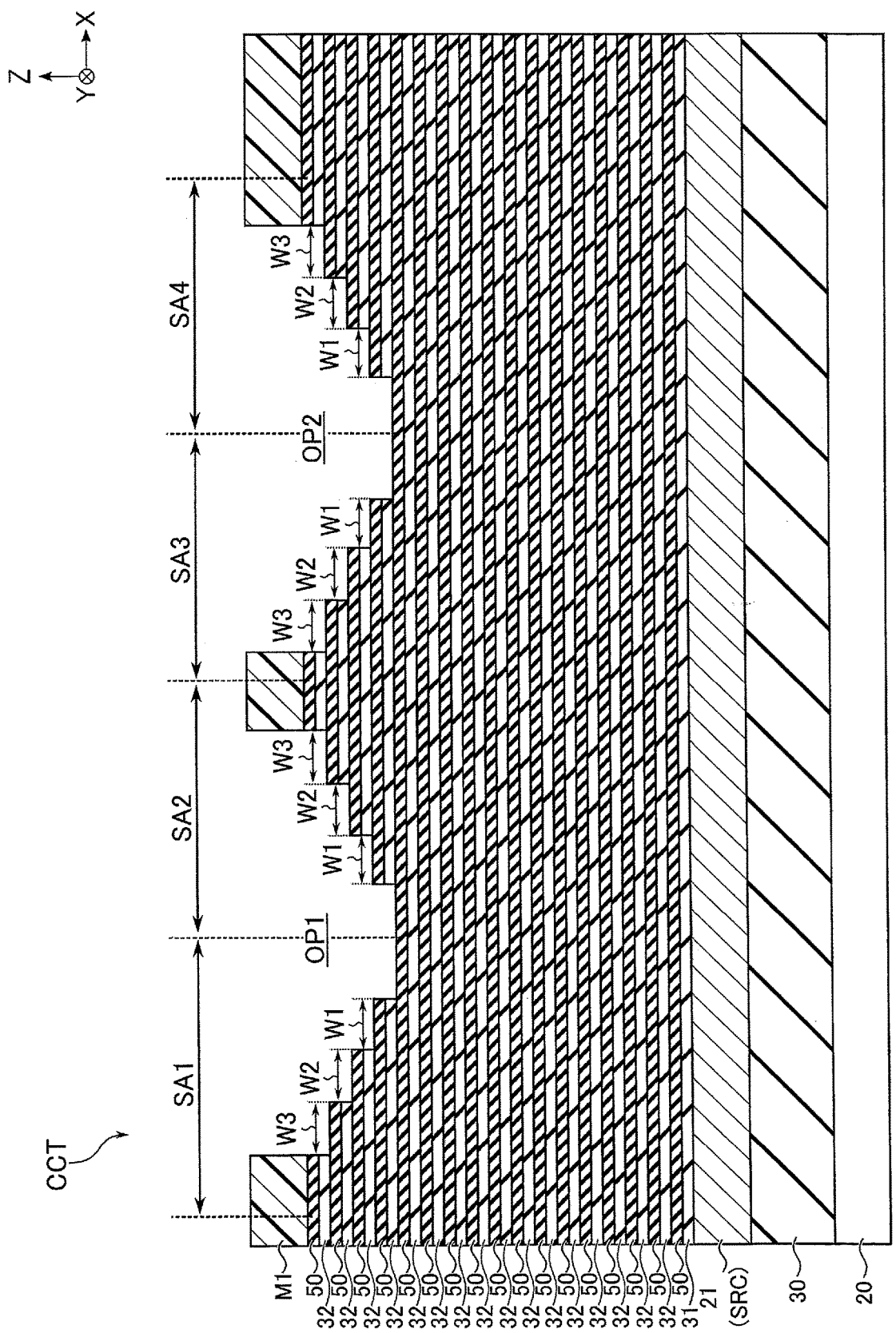
FIG. 15 is a cross-sectional view for explaining an example of the method of manufacturing the memory cell array included in the semiconductor memory device according to the embodiment.
Figure 16:
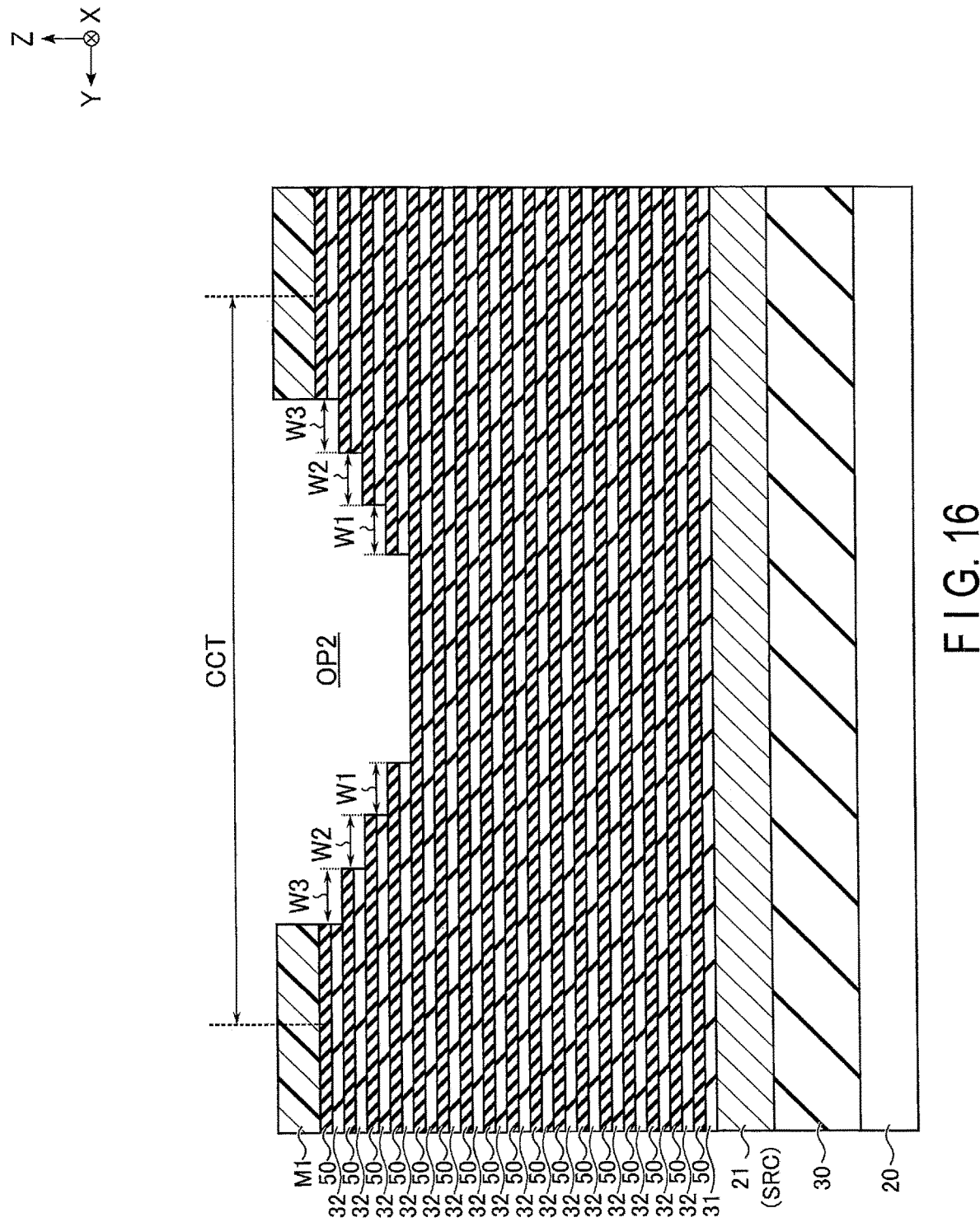
FIG. 16 is a cross-sectional view for explaining an example of the method of manufacturing the memory cell array included in the semiconductor memory device according to the embodiment.

Through the processing of S102, as shown in FIGS. 15 and 16, a staircase structure extending in the X direction and Y direction is formed in each of an area corresponding to the staircase areas SA1 and SA2 and an area corresponding to the staircase areas SA3 and SA4. The first terrace portion from the bottom in the area corresponding to the staircase areas SA1 and SA2, and the first terrace portion from the bottom in the area corresponding to the staircase areas SA3 and SA4, have substantially the same width W1 in each of the X direction and the Y direction. The second terrace portion from the bottom in the area corresponding to the staircase areas SA1 and SA2, and the second terrace portion from the bottom in the area corresponding to the staircase areas SA3 and SA4, have substantially the same width W2 in each of the X direction and the Y direction. The third terrace portion from the bottom in the area corresponding to the staircase areas SA1 and SA2, and the third terrace portion from the bottom in the area corresponding to the staircase areas SA3 and SA4, have substantially the same width W3 in each of the X direction and the Y direction. The widths W1 to W3 are, for example, substantially the same, but may be different from one another. After completion of the processing of S102, the mask M1 is removed.

Figure 17:
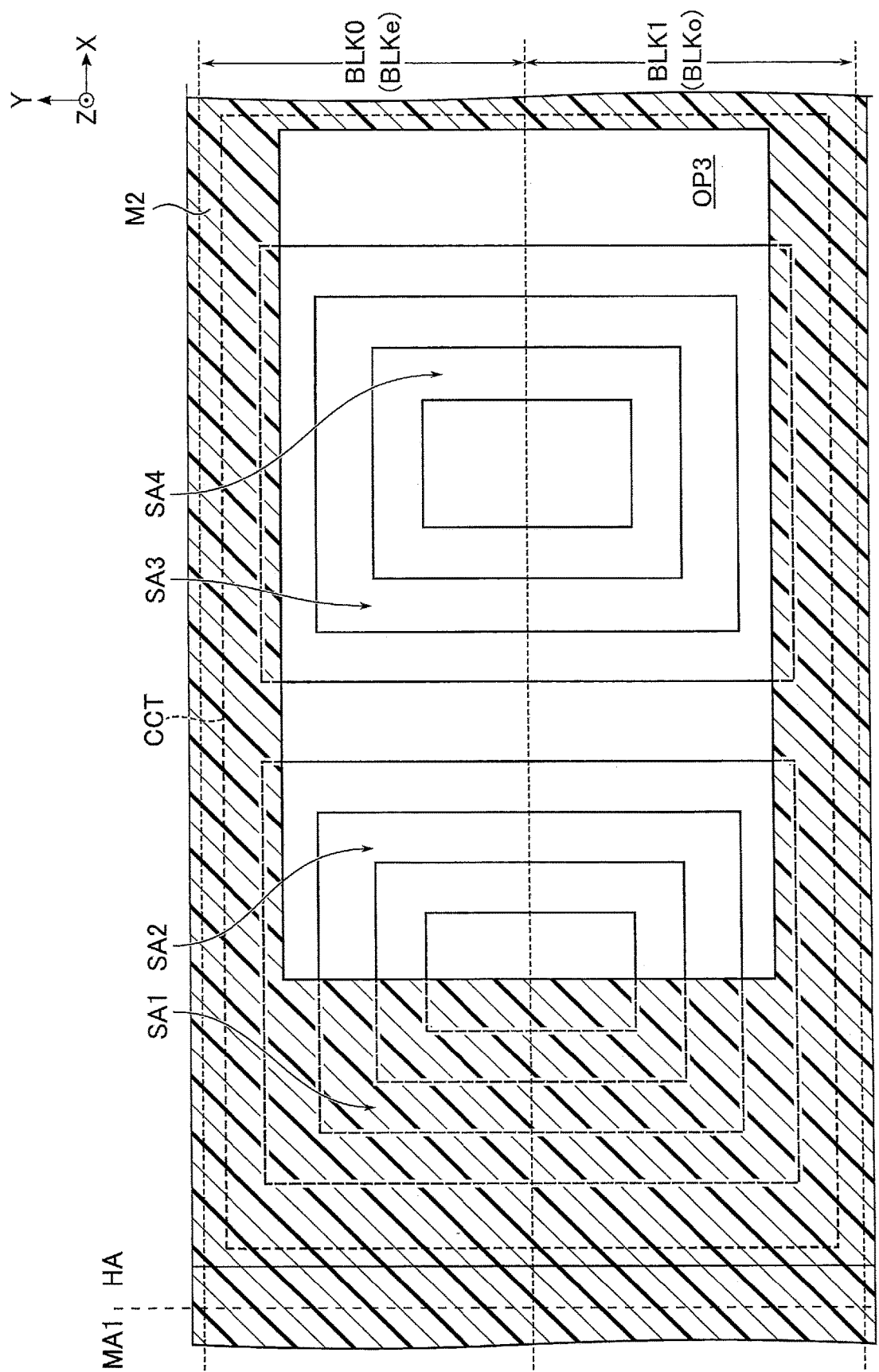
FIG. 17 is a plan view for explaining an example of the method of manufacturing the memory cell array included in the semiconductor memory device according to the embodiment.

Next, a mask M2 is formed as shown in FIG. 17 (S103). The mask M2 includes an opening OP3. The opening OP3 is formed by, for example, lithography. The opening OP3 includes a portion corresponding to an area where the staircase areas SA2, SA3, and SA4 are formed. The opening OP3 corresponds to an area where the inclined portion IP1 is formed.

Then, anisotropic etching using the mask M2 is executed (S104).

Figure 18:
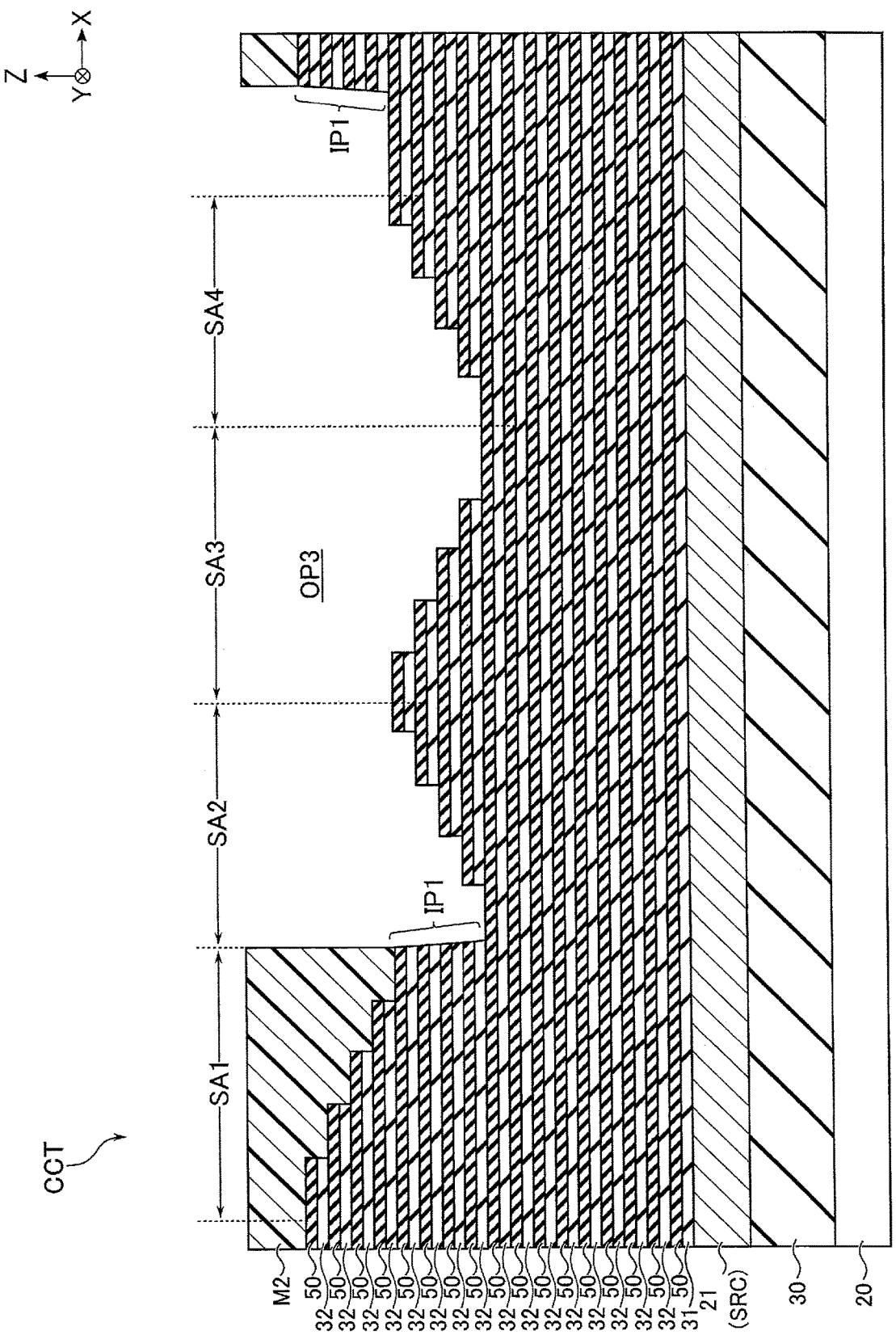
FIG. 18 is a cross-sectional view for explaining an example of the method of manufacturing the memory cell array included in the semiconductor memory device according to the embodiment.
Figure 19:
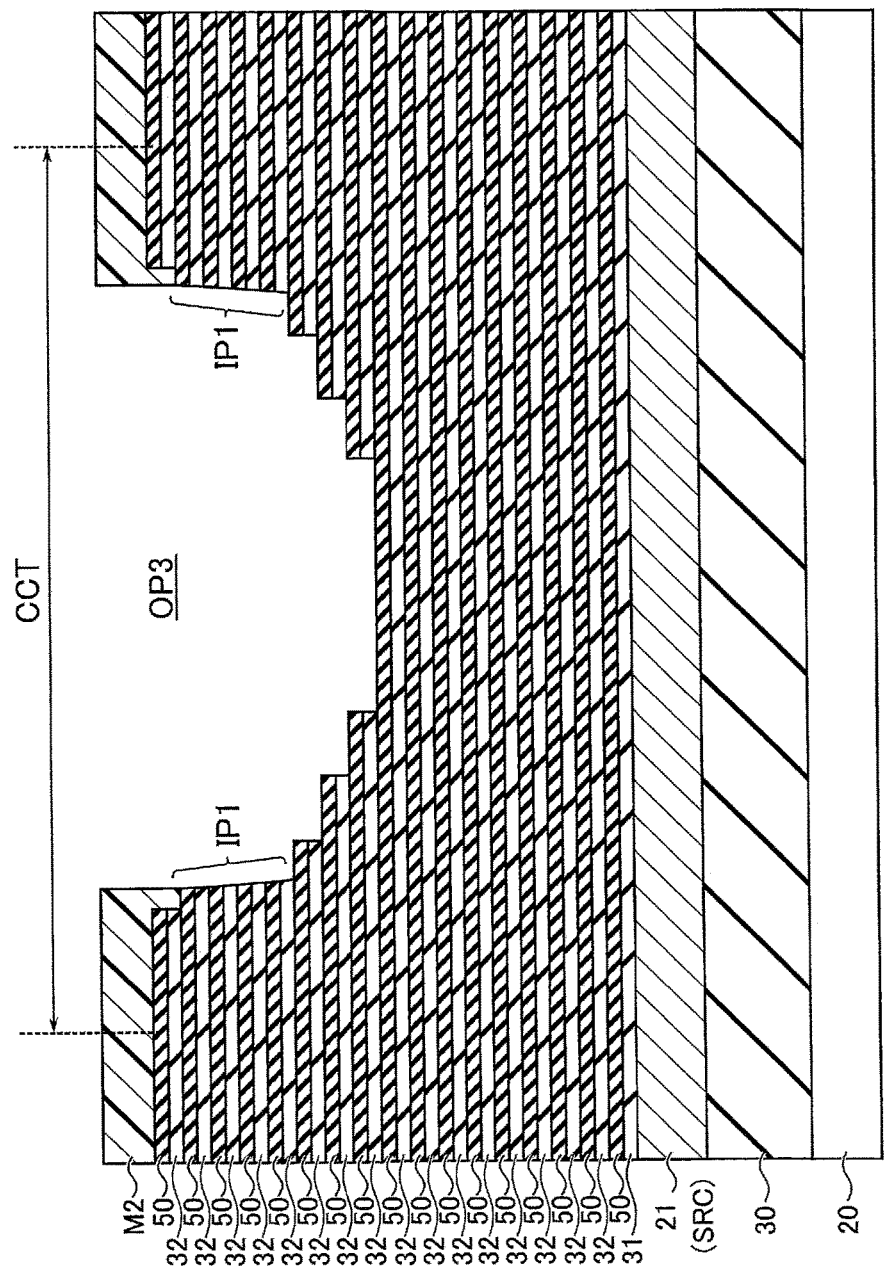
FIG. 19 is a cross-sectional view for explaining an example of the method of manufacturing the memory cell array included in the semiconductor memory device according to the embodiment.

Specifically, at the opening OP3, four sacrificial members 50 and four insulating layers 32 are removed by anisotropic etching using the mask M2. An inclined portion IP1 is thereby formed as shown in FIGS. 18 and 19. As shown in FIG. 18, in the staircase area SA2, a portion is formed where the terrace portions of the stacked-layer members SL7 to SL10 are to be formed. After completion of the processing of S104, the mask M2 is removed.

Figure 20:
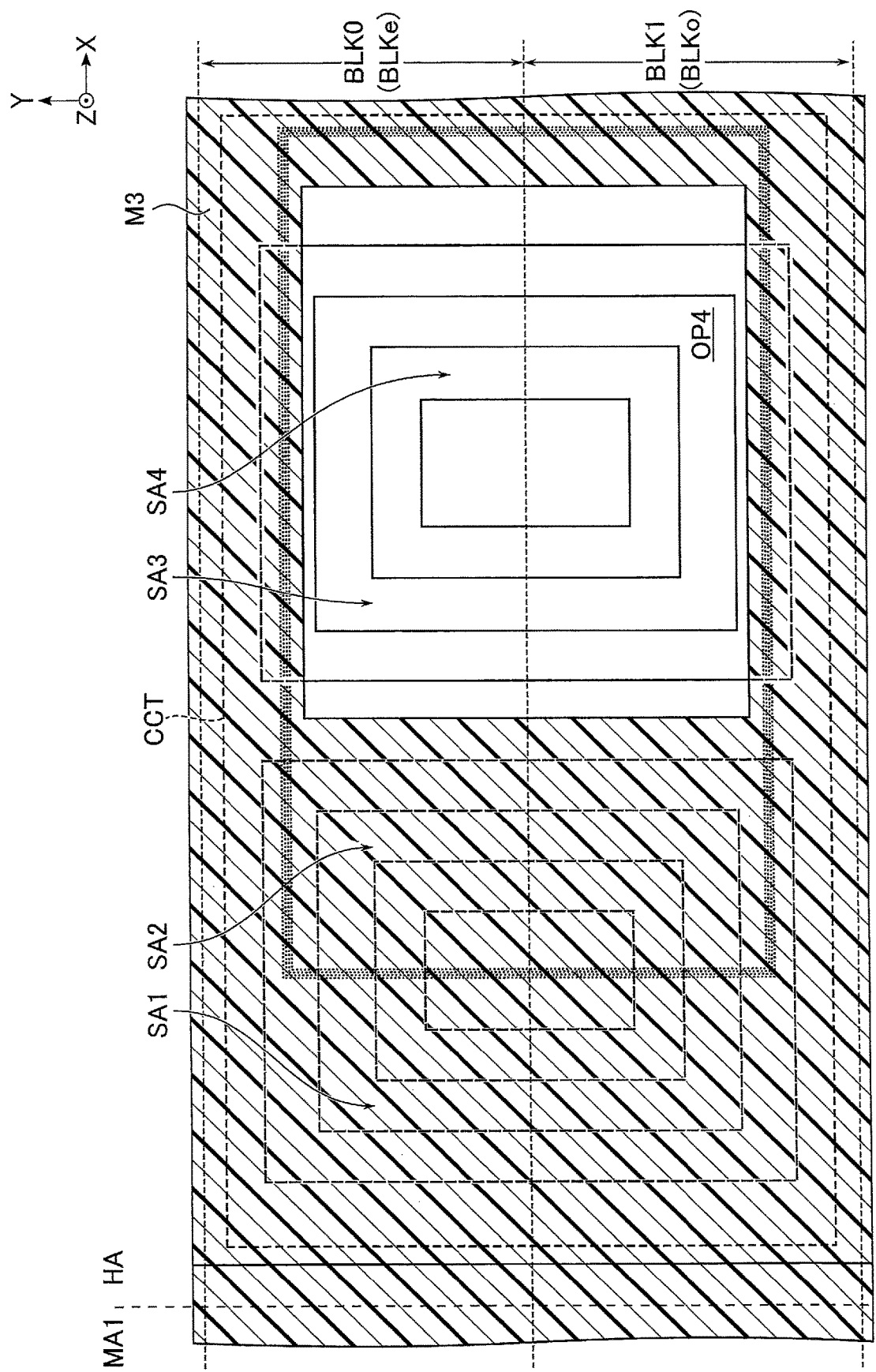
FIG. 20 is a plan view for explaining an example of the method of manufacturing the memory cell array included in the semiconductor memory device according to the embodiment.

Then, a mask. M3 is formed as shown in FIG. 20 (S105). The mask M3 includes an opening OP4. The opening OP4 is formed by, for example, lithography. The opening OP4 includes a portion corresponding to an area where the staircase areas SA3 and SA4 are formed. The opening OP4 corresponds to an area where the inclined portion IP2 is formed.

Next, anisotropic etching using the mask M3 is executed (S106).

Figure 21:
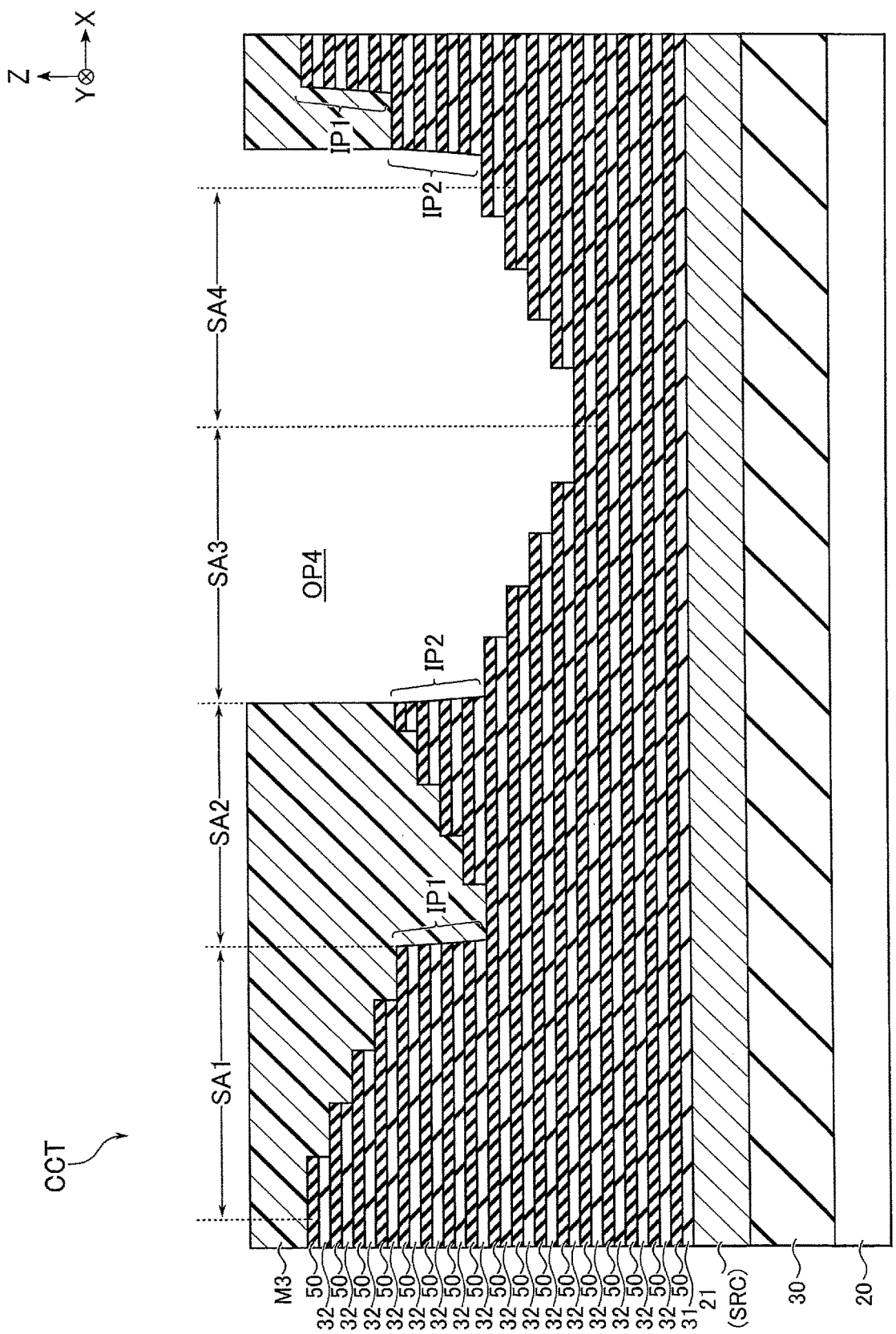
FIG. 21 is a cross-sectional view for explaining an example of the method of manufacturing the memory cell array included in the semiconductor memory device according to the embodiment.
Figure 22:
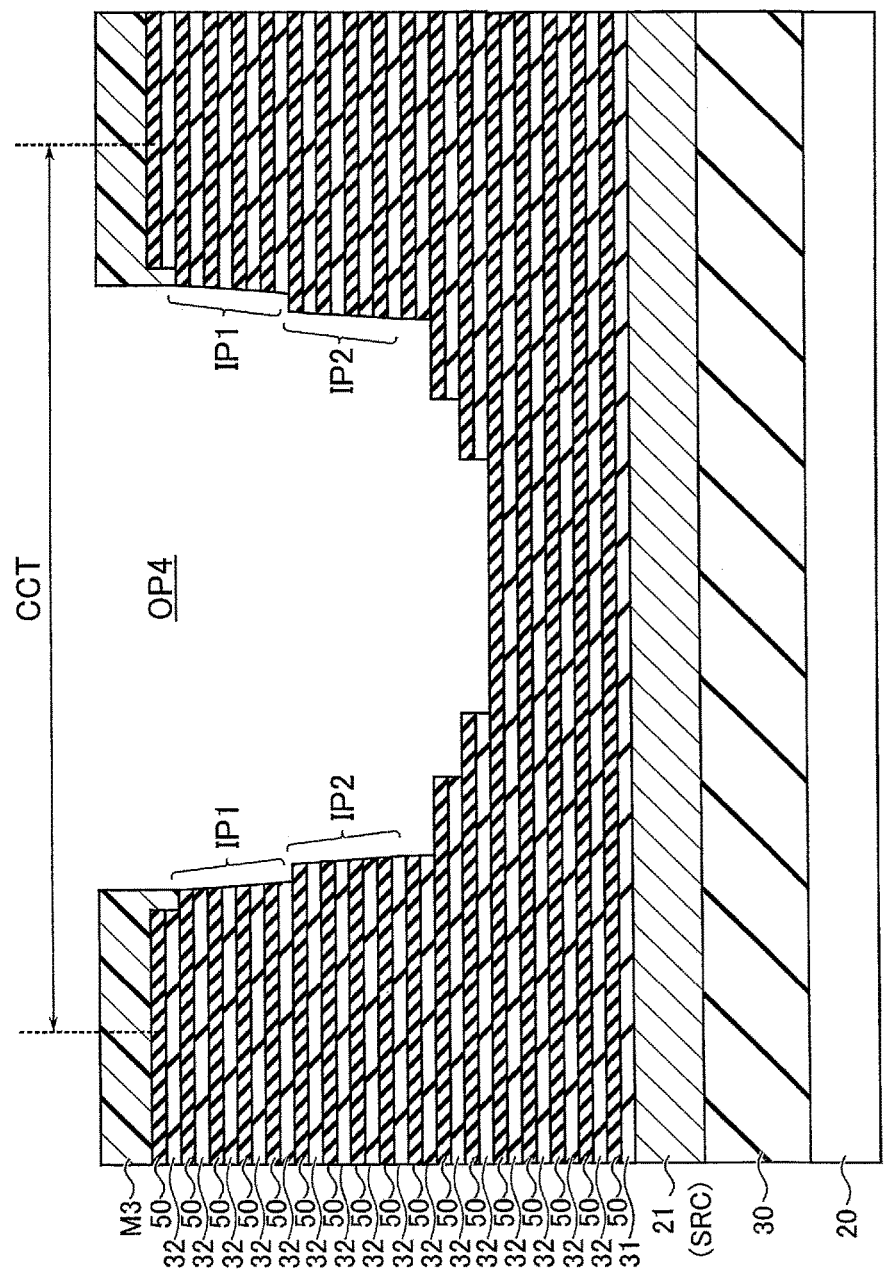
FIG. 22 is a cross-sectional view for explaining an example of the method of manufacturing the memory cell array included in the semiconductor memory device according to the embodiment.

Specifically, at the opening OP4, four sacrificial members 50 and four insulating layers 32 are removed by anisotropic etching using the mask M3, and an inclined portion IP2 is formed as shown in FIG. 21. Accordingly, in the staircase area SA3, a portion is formed where the terrace portions of the stacked-layer members SL3 to SL6 are to be formed. As shown in FIG. 22, the inclined portion IP2 is also formed in a cross section along the Y direction including the staircase area SA4. After completion of the processing of S106, the mask M3 is removed.

Figure 23:
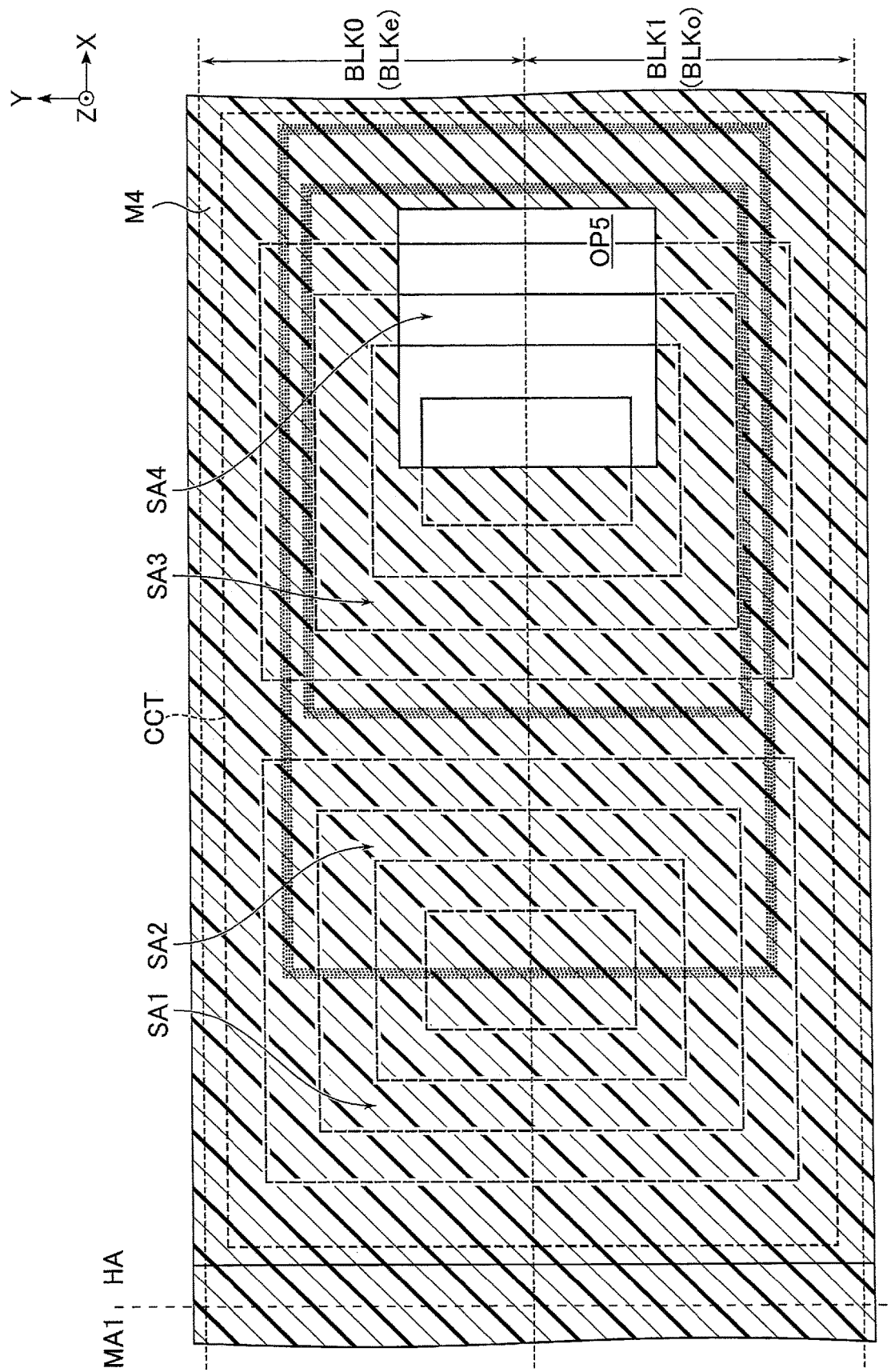
FIG. 23 is a plan view for explaining an example of the method of manufacturing the memory cell array included in the semiconductor memory device according to the embodiment.

Then, a mask M4 is formed as shown in FIG. 23 (S107). The mask M4 includes an opening OP5. The opening OP5 is formed by, for example, lithography. The opening OP5 includes a portion corresponding to an area where the staircase area SA4 is formed. The opening OP5 corresponds to an area where the inclined portion IP3 is formed.

Then, anisotropic etching using the mask M4 is executed (S108).

Figure 24:
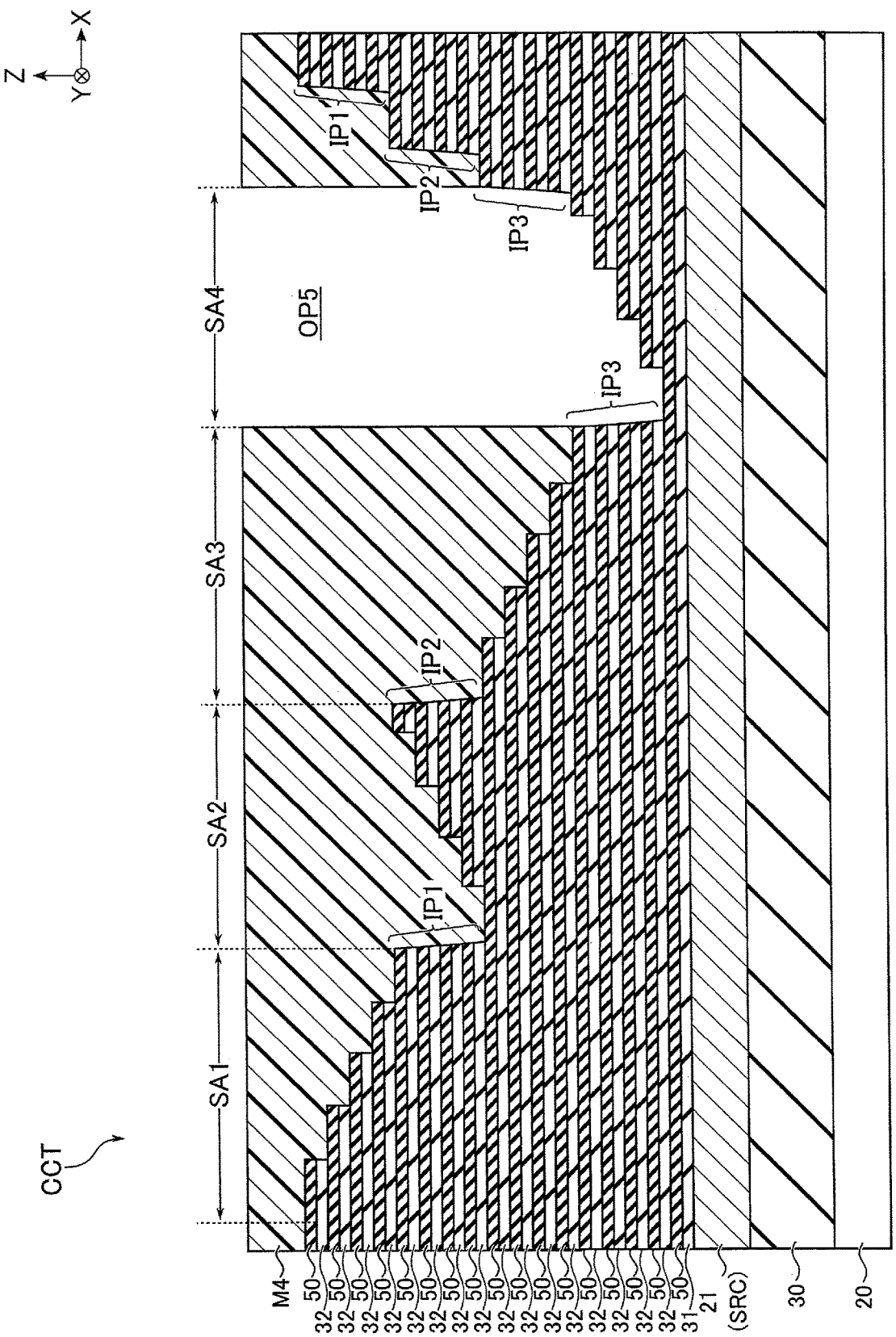
FIG. 24 is a cross-sectional view for explaining an example of the method of manufacturing the memory cell array included in the semiconductor memory device according to the embodiment.
Figure 25:
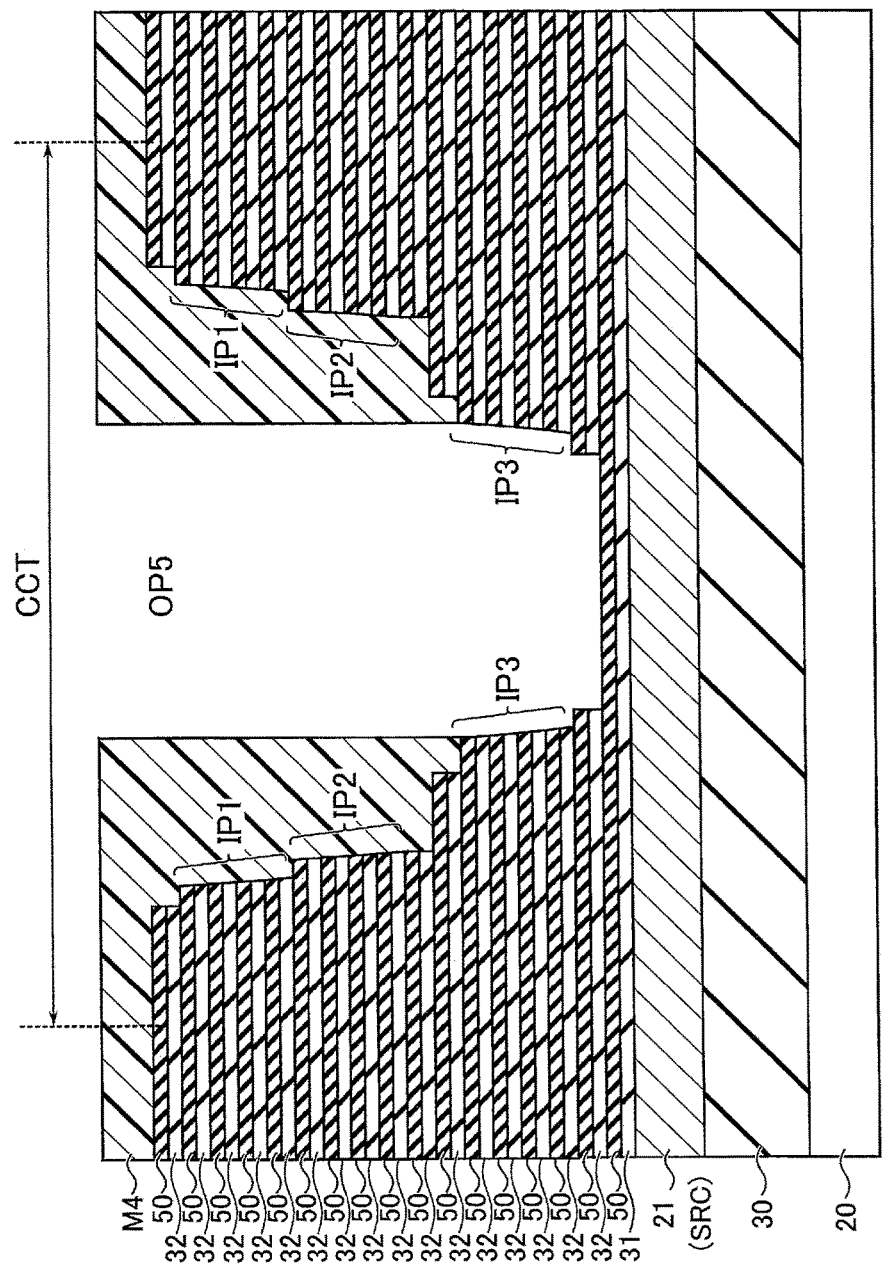
FIG. 25 is a cross-sectional view for explaining an example of the method of manufacturing the memory cell array included in the semiconductor memory device according to the embodiment.

Specifically, at the opening OP5, four sacrificial members 50 and four insulating layers 32 are removed by anisotropic etching using the mask M4. An inclined portion IP3 is thereby formed as shown in FIG. 24. As shown in FIG. 25, the inclined portion IP3 is also formed in a cross section along the Y direction including the staircase area SA4. Accordingly, in the staircase area SA4, a portion is formed where the terrace portions of the stacked-layer members SL0 to SL2 and select gate line SGS are to be formed. After completion of the processing of S108, the mask M4 is removed.

Figure 26:
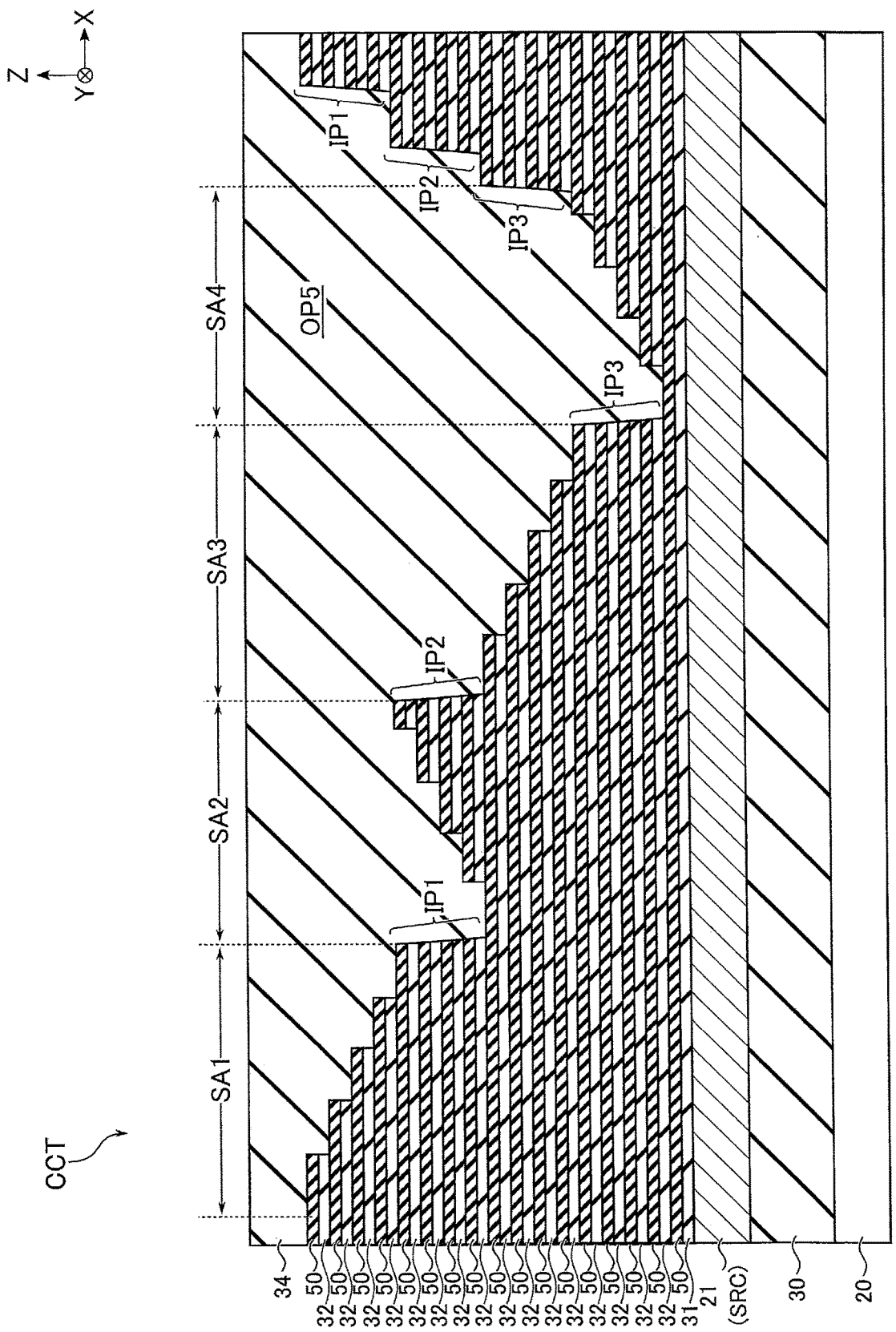
FIG. 26 is a cross-sectional view for explaining an example of the method of manufacturing the memory cell array included in the semiconductor memory device according to the embodiment.

Next, as shown in FIG. 26, an insulating layer 34 is formed on the terrace portions of the sacrificial members 50 provided in the hookup portion HP.

Specifically, the steps formed in the hookup portion HP of the hookup area HA are filled with the insulating layer 34. Then, the top surface of the insulating layer 34 is planarized by, for example, chemical mechanical polishing (CMP). The insulating layer 34 is formed by, for example, chemical vapor deposition (CVD).

Thereafter, memory pillars MP are formed in the memory areas MA (S109).

Figure 27:
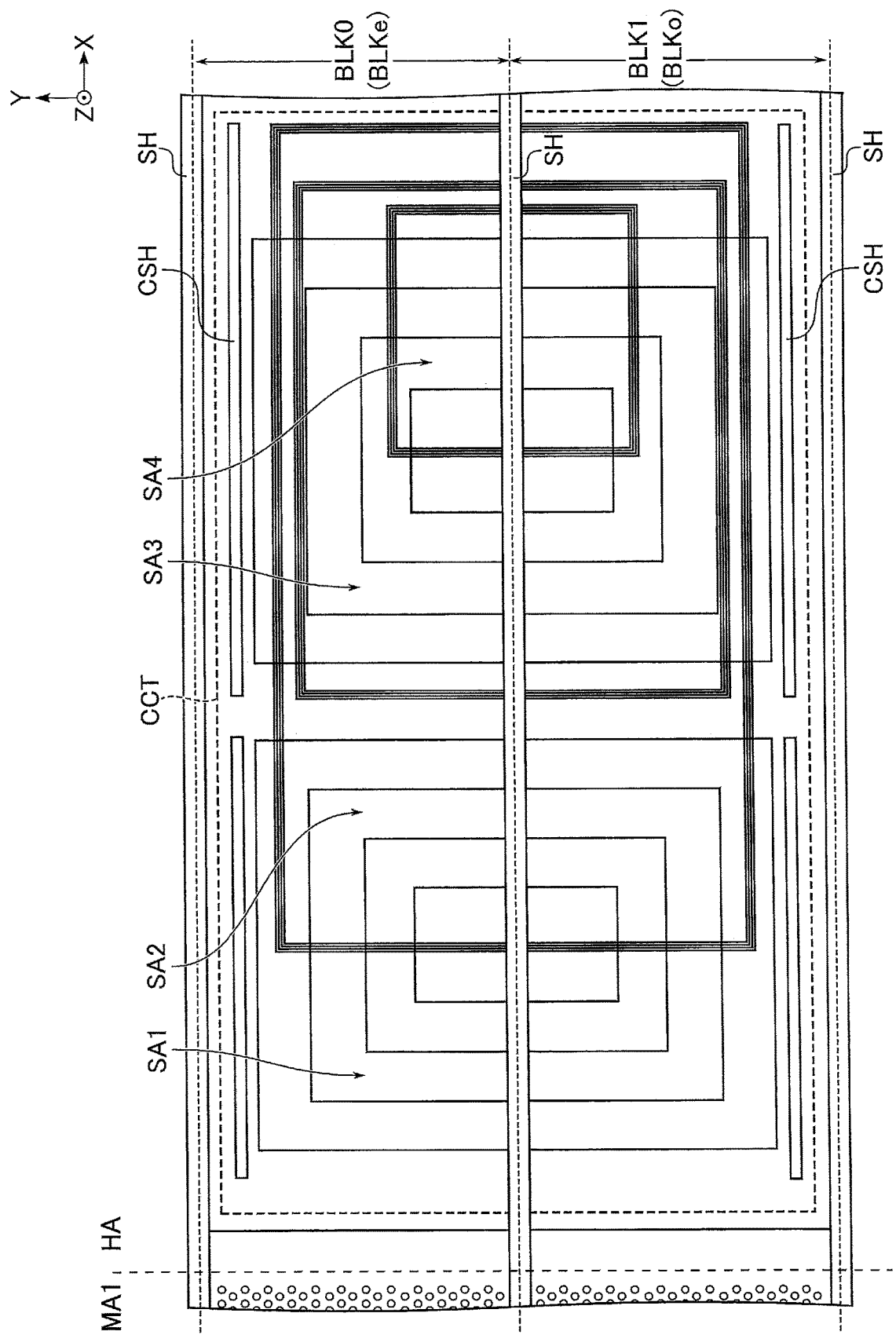
FIG. 27 is a plan view for explaining an example of the method of manufacturing the memory cell array included in the semiconductor memory device according to the embodiment.
Figure 28:
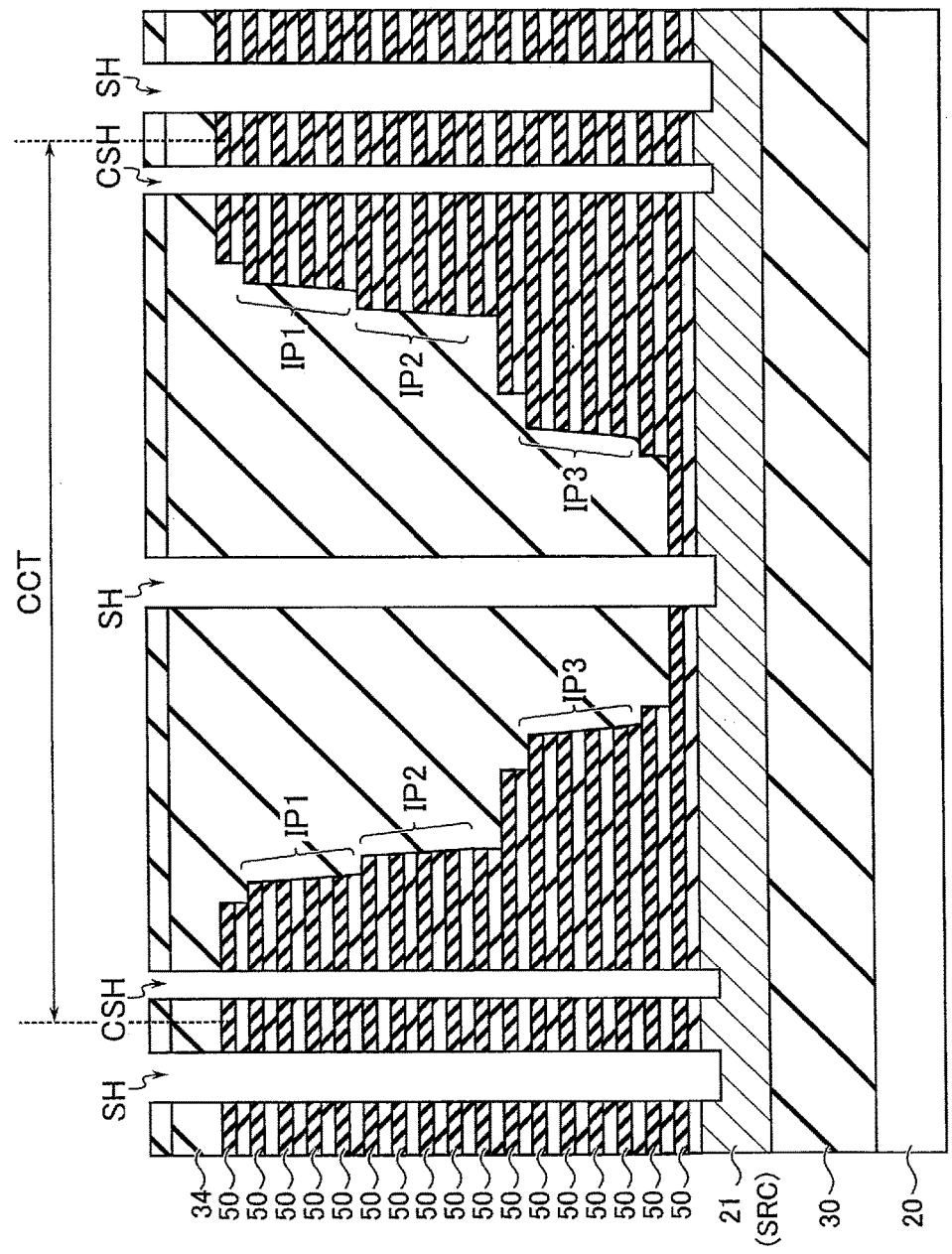
FIG. 28 is a cross-sectional view for explaining an example of the method of manufacturing the memory cell array included in the semiconductor memory device according to the embodiment.

Then, a plurality of slits SH and CSH are formed as shown in FIGS. 27 and 28 (S110).

Specifically, a mask including openings in areas corresponding to the members SLT and members CST is formed by, for example, photolithography. Then, the slits SH and CSH, which divide, for example, the insulating layers 31 and 34, the insulating layers 32, and the sacrificial members 50, are formed by anisotropic etching using the mask. In an area outside the contact area CCT, slits SH also divide the sacrificial member 50 and insulating layer 33 corresponding to the select gate line SGD.

Figure 29:
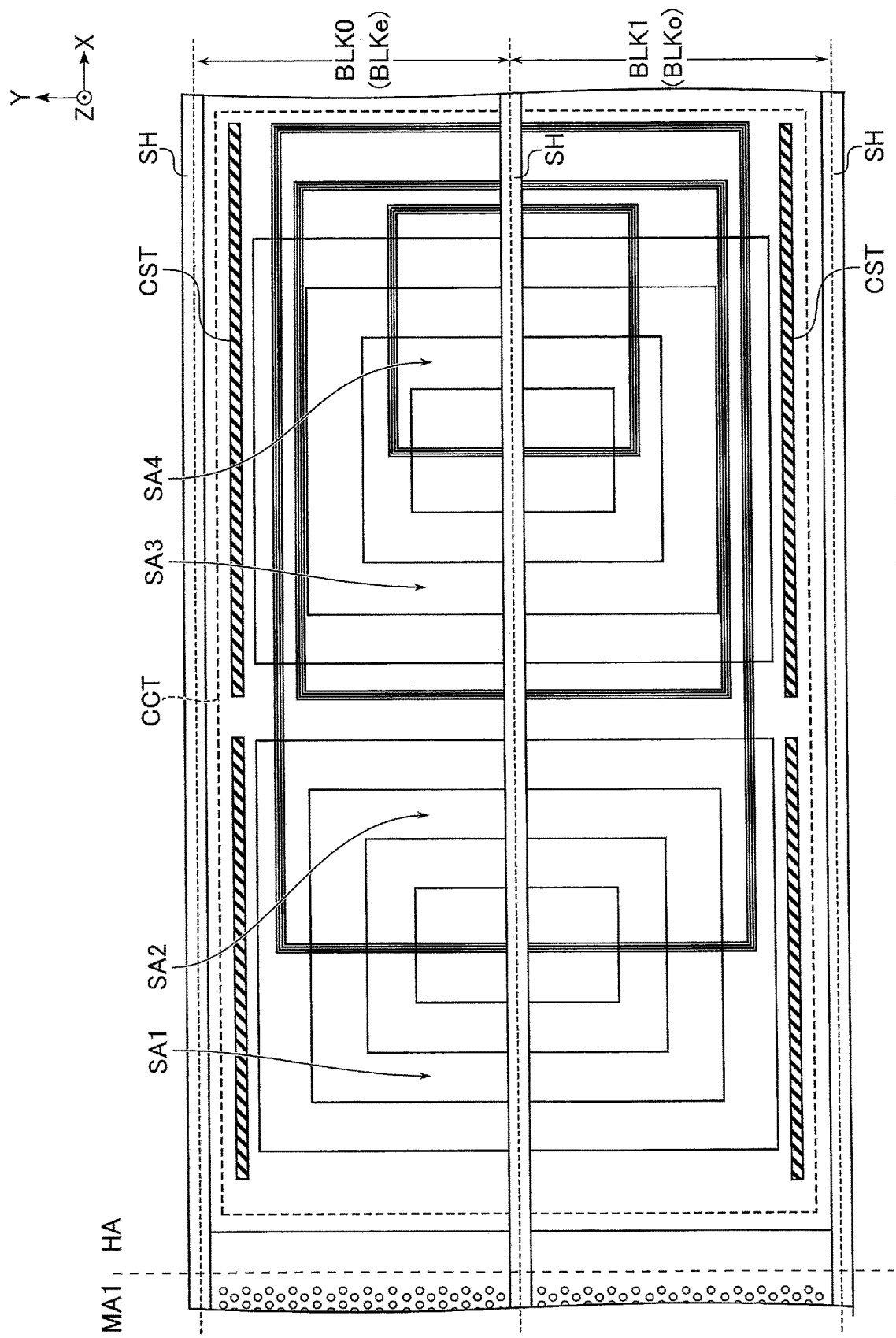
FIG. 29 is a plan view for explaining an example of the method of manufacturing the memory cell array included in the semiconductor memory device according to the embodiment.
Figure 30:
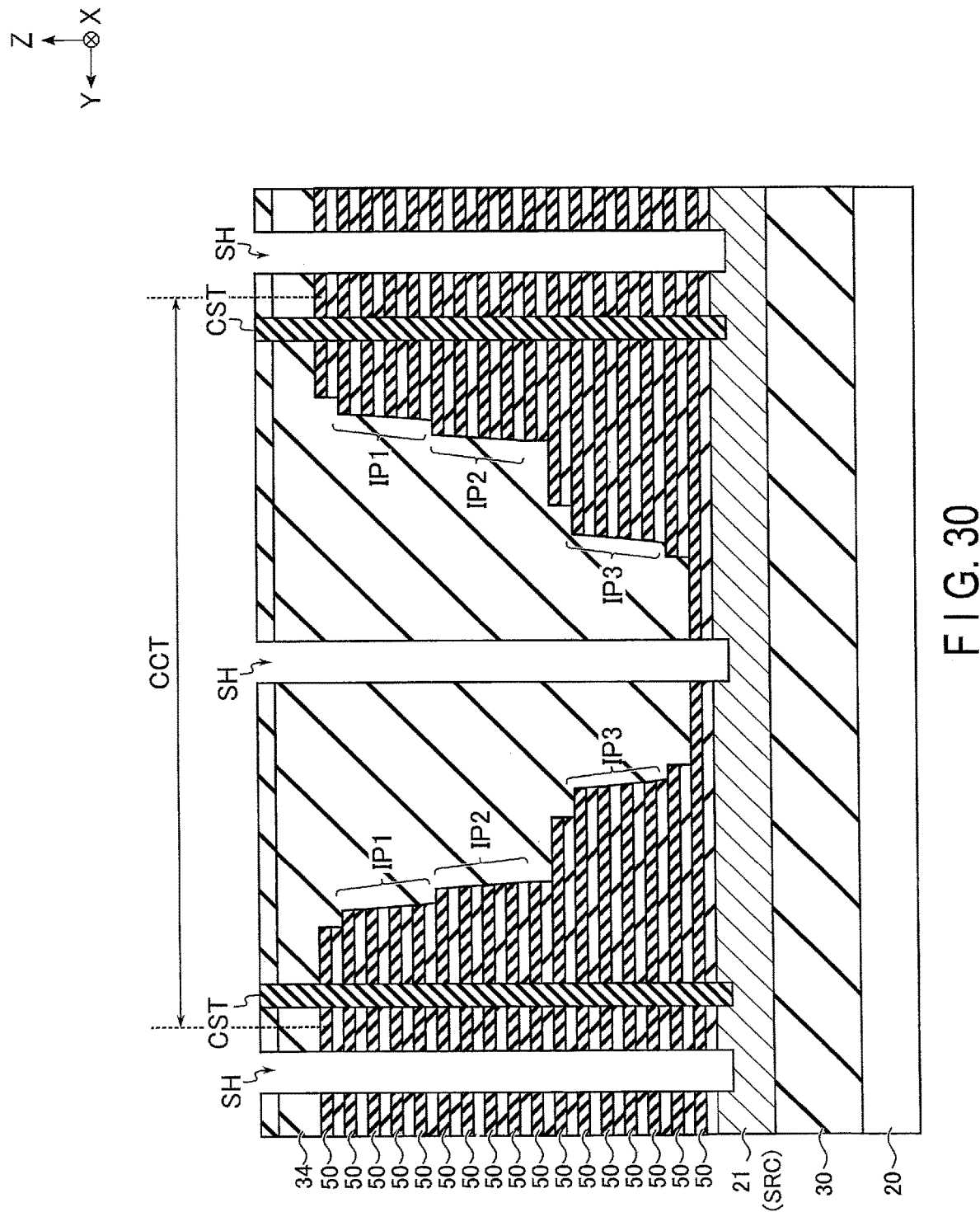
FIG. 30 is a cross-sectional view for explaining an example of the method of manufacturing the memory cell array included in the semiconductor memory device according to the embodiment.

Next, a member CST is formed in each slit CSH as shown in FIGS. 29 and 30 (S111).

Specifically, an insulating portion is formed so as to cover the side and bottom surfaces of the slit CSH. Then, the insulating portion formed outside the slit CSH is removed by, for example, CMP.

Figure 31:
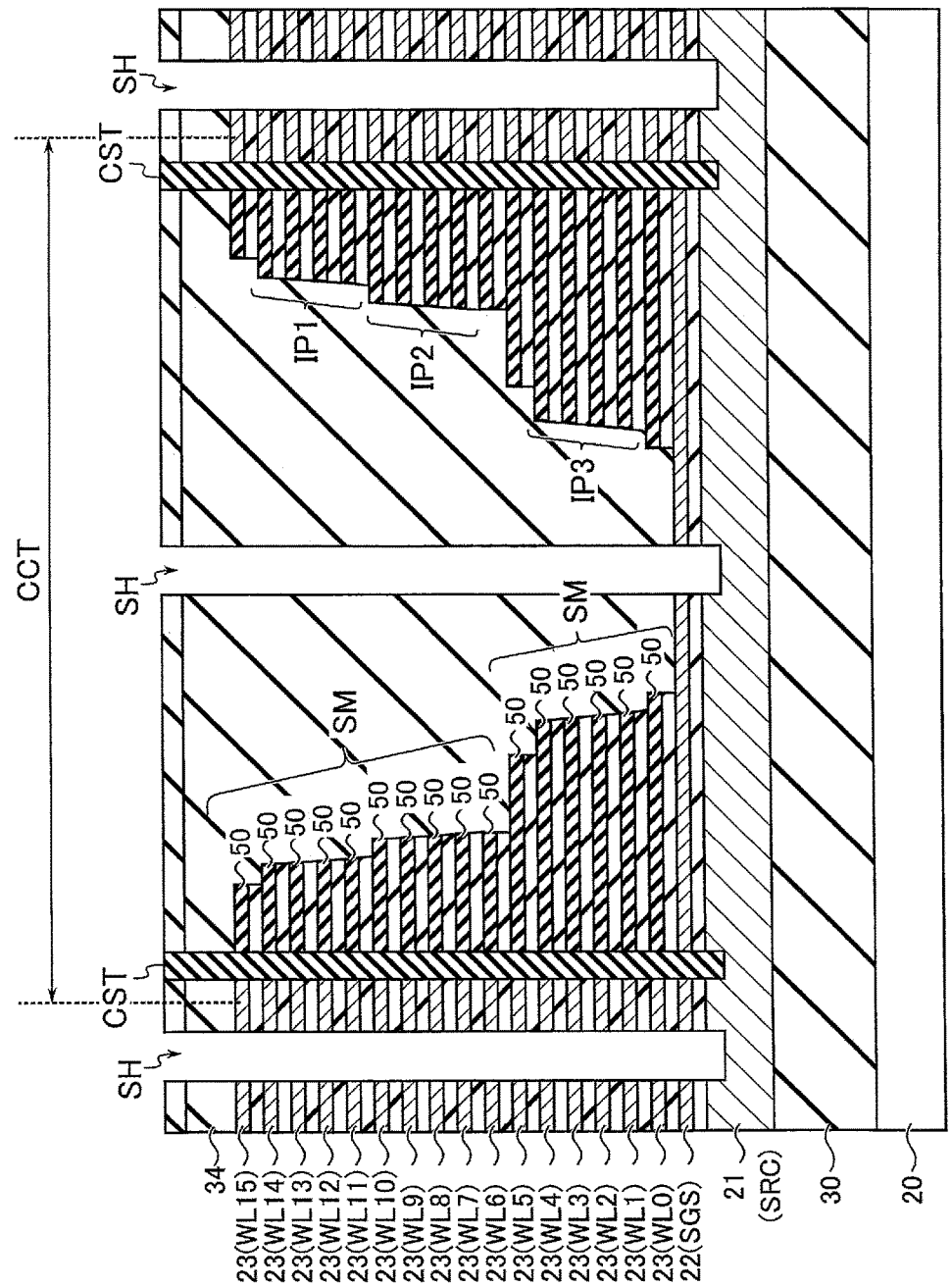
FIG. 31 is a cross-sectional view for explaining an example of the method of manufacturing the memory cell array included in the semiconductor memory device according to the embodiment.

Thereafter, replacement processing of the sacrificial members 50 is executed, and stacked-layer interconnects of the word lines WL0 to WL15, etc. are formed as shown in FIG. 31 (S112). For example, the portions of the sacrificial members 50 in contact with the slits SH in the cross section shown in FIG. 30 are each replaced with a conductive layer 22 or 23. In contrast, for example, the portions of the sacrificial members 50 out of contact with the slits SH are not replaced. The portions of the sacrificial members 50 which are not replaced remain as sacrificial members SM.

Specifically, portions of sacrificial members 50 are selectively removed via the slits SH by wet etching using, for example, thermal phosphoric acid. In the cross section shown in FIG. 30, the portions of the sacrificial members 50 between the member CST in each block BLK and the slit SH corresponding to the member SLTe in contact with the block BLK are removed via the slit SH. In the cross section shown in FIG. 30, of the portions of the sacrificial members 50 between the member CST in each block BLK and the slit SH corresponding to the member SLTo in contact with the block BLK, the portion of the sacrificial member 50 corresponding to the select gate line SGS is wholly removed via the slit SH corresponding to the member SLTo. In contrast, in the cross section shown in FIG. 30, of the portions of the sacrificial members 50 between the member CST in each block BLK and the slit SH corresponding to the member SLTo in contact with the block BLK, the portions of the sacrificial members 50 corresponding to the stacked-layer members SL0 to SL15 are not wholly removed as they are not in contact with the slit SH. The portions of the sacrificial members 50 which are not removed remain as sacrificial members SM. The structure of the memory cell array 10 from which portions of sacrificial members 50 have been removed is maintained by, for example, the remaining sacrificial members SM, the memory pillars MP, the members CST, and support pillars (not shown). Then, a conductor is embedded, via the slit SH, in the spaces from which the sacrificial members 50 have been removed. For the formation of the conductor in this step, for example, CVD is used.

Thereafter, the conductor formed inside the slit SH is removed via an etchback process, and the conductors formed in adjacent interconnect layers is separated. Accordingly, a conductive layer 22 which functions as the select gate line SGS, a plurality of conductive layers 23 which respectively function as the word lines WL0 to WL15, and a conductive layer 24 which functions as the select gate line SGD are formed. The conductive layers 22 to 24 formed in this step may include a barrier metal. In this case, when the conductor is formed after removal of the sacrificial members 50, tungsten is formed after, for example, a film of titanium nitride is formed as a barrier metal.

Figure 32:
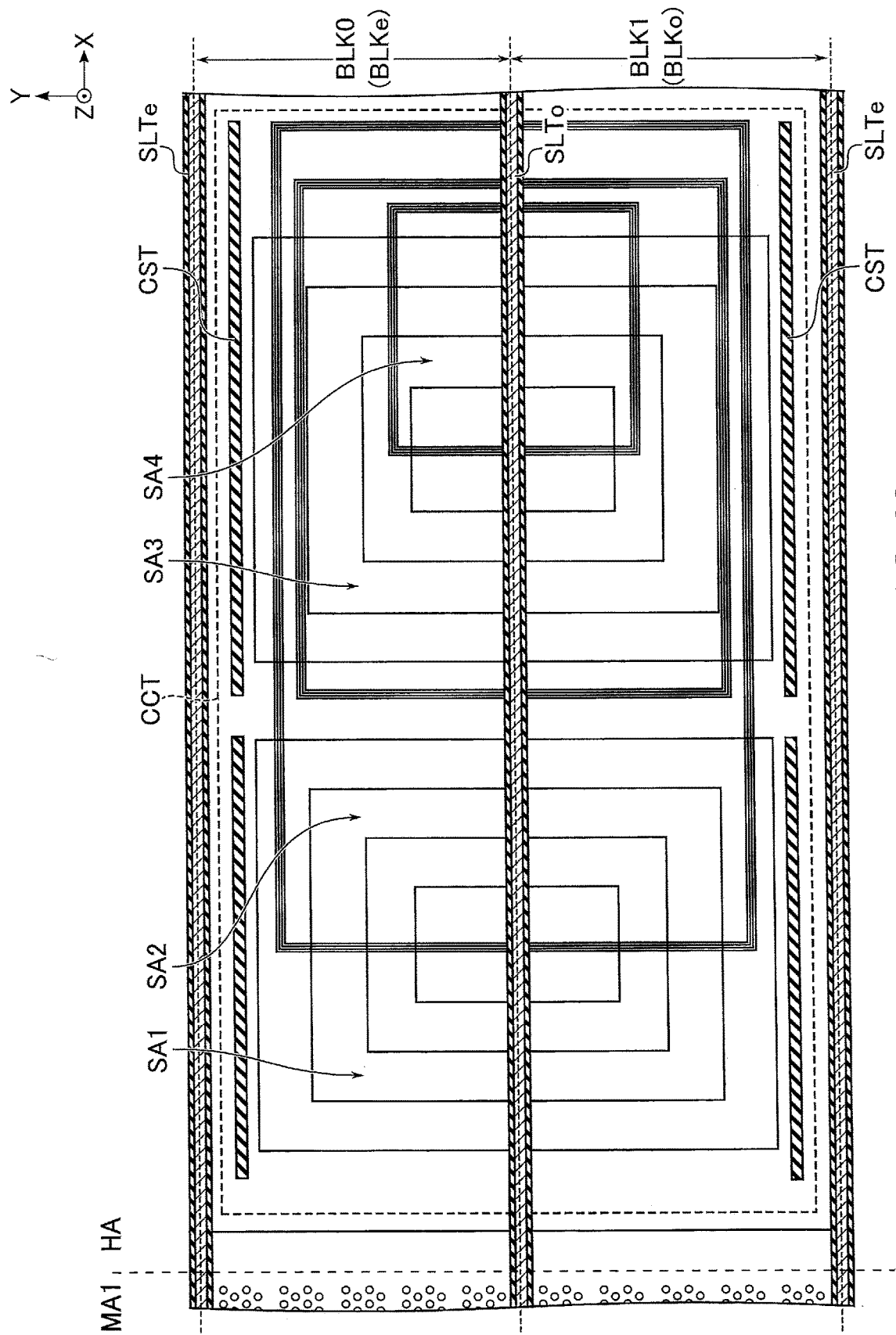
FIG. 32 is a plan view for explaining an example of the method of manufacturing the memory cell array included in the semiconductor memory device according to the embodiment.

Then, a member SLT is formed in each slit SH as shown in FIG. 32 (S113).

Specifically, an insulating film (spacer SP) is formed so as to cover the side and bottom surfaces of the slit SH. Then, a portion of the spacer SP provided at the bottom of the slit SH is removed, and a part of the conductive layer 21 is exposed at the bottom of the slit SH. Then, a conductor (contact LI) is formed in the slit SH, and the conductor formed outside the slit SH is removed by, for example, CMP. Thereafter, in areas (not shown) corresponding to members SHE between members SLT adjacent to each other in the Y direction, a plurality of trenches are formed in parallel with the members SLT. By embedding an insulating film in the trenches, members SHE, which divide the conductive layer 24 in the Y direction, are formed.

Figure 33:
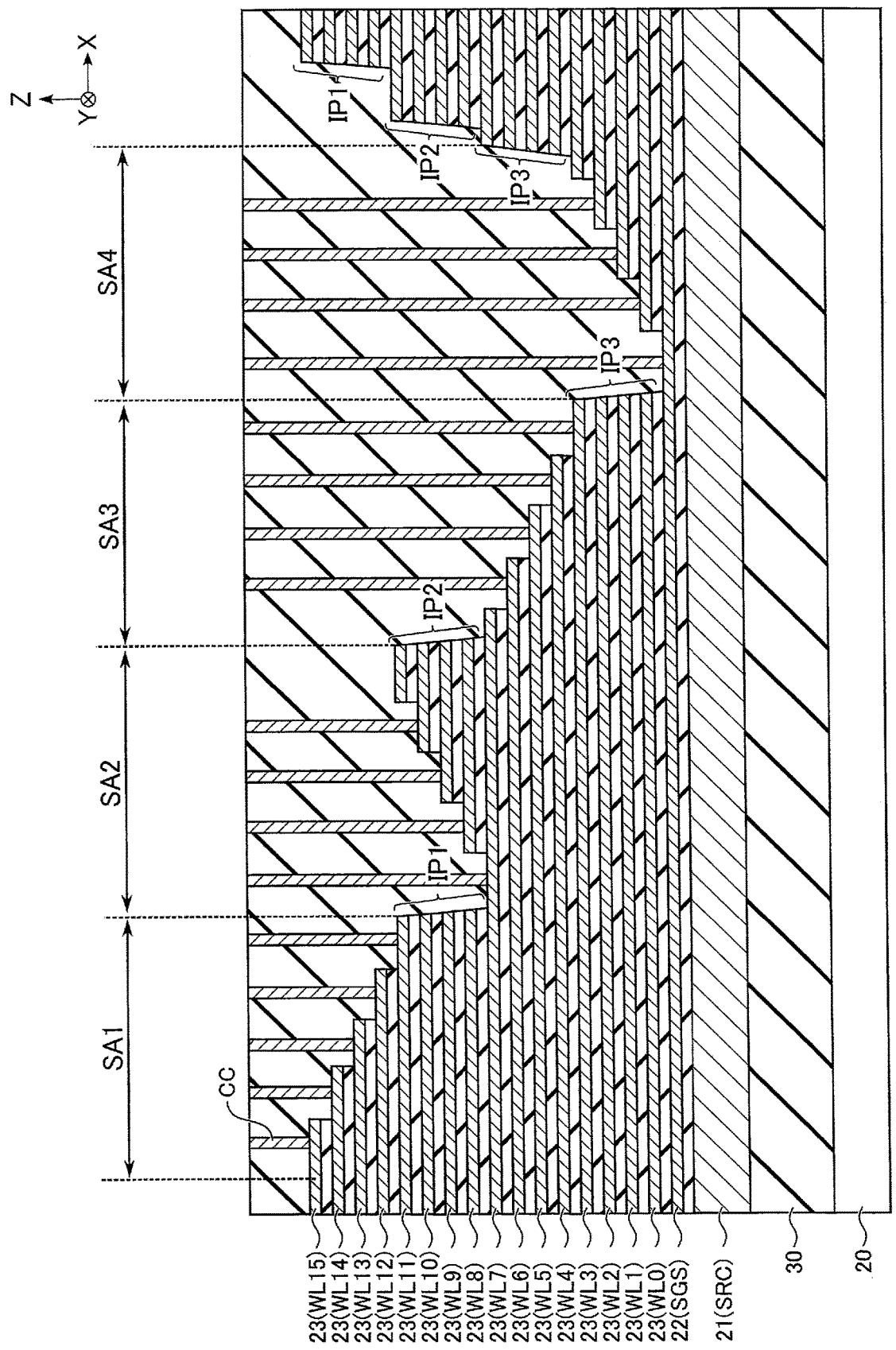
FIG. 33 is a cross-sectional view for explaining an example of the method of manufacturing the memory cell array included in the semiconductor memory device according to the embodiment.

Then, a plurality of contacts CC are formed as shown in FIG. 33.

Specifically, a mask including openings in areas corresponding to the contacts CC is formed by, for example, photolithography. Then, for example, holes that pass through the insulator formed above the terrace portions are formed by anisotropic etching using the mask. At the bottoms of the holes, the corresponding conductive layers 22 to 24 are exposed. Thereafter, the holes are filled with a conductor. Through the conductor formed on the top surface of the layer stack being removed by, for example, CMP, the surfaces corresponding to the upper ends of the contacts CC are exposed.

The structure of the memory cell array 10 is formed by the above-described steps.

The above-described manufacturing process is merely an example, and the manufacturing process is not limited thereto. For example, another step may be inserted between manufacturing steps, and some steps may be omitted or integrated. Manufacturing steps may be interchanged where possible. For example, the step of forming memory pillars MP and the step of forming a staircase structure in the contact area CCT may be interchanged.

1.3 Advantageous Effects of Present Embodiment

The embodiment can suppress a decrease in the yield of the semiconductor memory device 1. Advantageous effects of the embodiment will be described below.

According to the embodiment, in the manufacturing process of the semiconductor memory device 1, after a staircase structure including the terrace portions in the contact area CCT is formed, portions of sacrificial members 50 are removed by wet etching via slits SH in step S112. Through embedding a conductor in the spaces from which the sacrificial members 50 have been removed, conductive layers 22 and 24 and conductive layers 23 are formed. In the embodiment, members CST are formed before sacrificial members 50 are replaced in step S112. Accordingly, as shown in, for example, FIG. 30, the sacrificial members 50 include portions interposed between a member CST and a corresponding slit SH and portions interposed between a member CST and an insulating layer 34 in the YZ cross section of the semiconductor memory device 1. Of the sacrificial members 50, the portions interposed between the member CST and the insulating layer 34 are not replaced by step S112. Therefore, the portions of the sacrificial members 50 interposed between the member CST and the insulating layer 34 remain as sacrificial members SM. Therefore, the incline of the layer stack caused when the conductive layers 22 and 24 and conductive layers 23 are formed can be suppressed.

Supplementarily, the structure of the layer stack on the YZ cross section of the semiconductor memory device 1 in each block BLK in the contact area CCT is asymmetrical with respect to the XZ plane. Namely, in each block BLK in the contact area CCT, the semiconductor memory device 1 has asymmetricity attributed to the staircase structure that extends in the Y direction in the staircase area SA4 as shown in, for example, FIG. 10. Accordingly, for example, when all of the sacrificial members 50 in such a staircase structure are replaced with a conductive layer 22 and a plurality of conductive layers 23, a relatively large degree of stress occurs in the Y direction due to the asymmetricity. In the replacement processing, the upper part of the layer stack is not supported; therefore, the layer stack of the semiconductor memory device 1 may collapse or sustain damage due to the stress in the Y direction.

According to the embodiment, in the area interposed between the members CST in each block BLK and the member SLTo in contact with the block BLK, the semiconductor memory device 1 includes portions of sacrificial members 50 which remain as sacrificial members SM without being replaced. Therefore, the conductive layer 22 and conductive layers 23 are formed more symmetrically, thereby causing lower degrees of stress than in the case where all sacrificial members 50 are replaced. Therefore, the incline of the layer stack caused when the conductive layer 22 and conductive layers 23 are formed can be suppressed. In addition, the yield of the semiconductor memory device 1 can be improved.

Moreover, the space between two members CST and the border between the stadium-like staircase portions SS1 and SS2 are aligned in the Y direction. This makes it possible to couple the portion of the interconnect layer isolated from both memory areas MA1 and MA2, between a member CST and a member SLTo, to the portion of the interconnect layer between a member CST and a member SLTe through the space between the two members CST in the replacement processing.

2 Modifications

Various modifications can be made to the above-described embodiment.

Hereinafter, semiconductor memory devices according to modifications will be described. Configurations and manufacturing processes of the semiconductor memory devices according to the modifications will be described below, focusing on differences from the semiconductor memory device 1 according to the embodiment. The semiconductor memory devices according to the modifications produce similar advantageous effects to those of the embodiment.

2.1 First Modification

In the above-described embodiment, the member CST is formed in each slit CSH; however, the embodiment is not limited thereto. For example, the member CST may be formed via the use of holes. The configuration and manufacturing method of the semiconductor memory device 1 according to the first modification are similar to those of the embodiment except for the part relating to the member CST. The configuration and manufacturing method of the member CST will be mainly described below.

Figure 34:
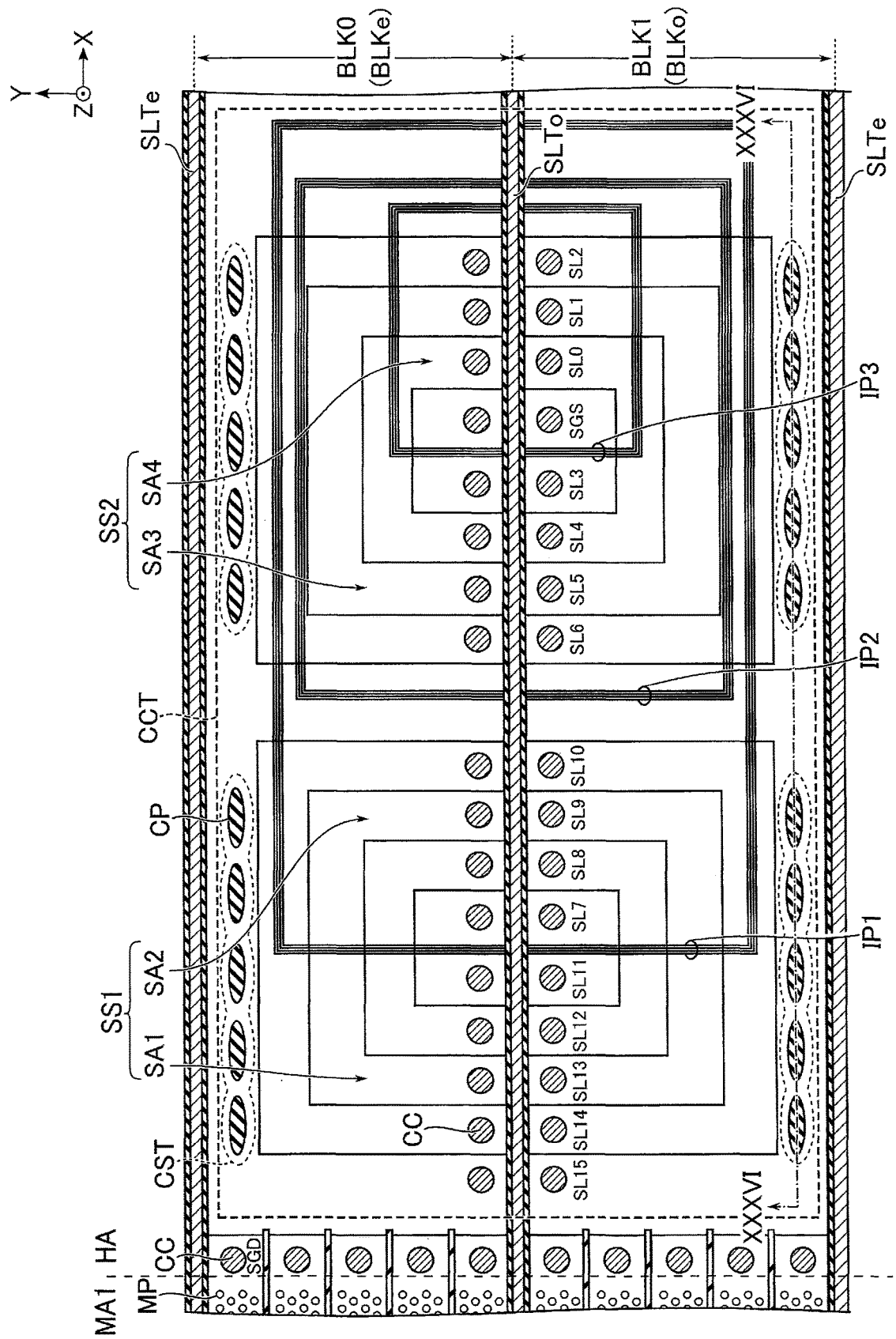
FIG. 34 is a plan view showing an example of a planar layout of a contact area, and its vicinity, of a memory cell array included in a semiconductor memory device according to a first modification.
Figure 35:
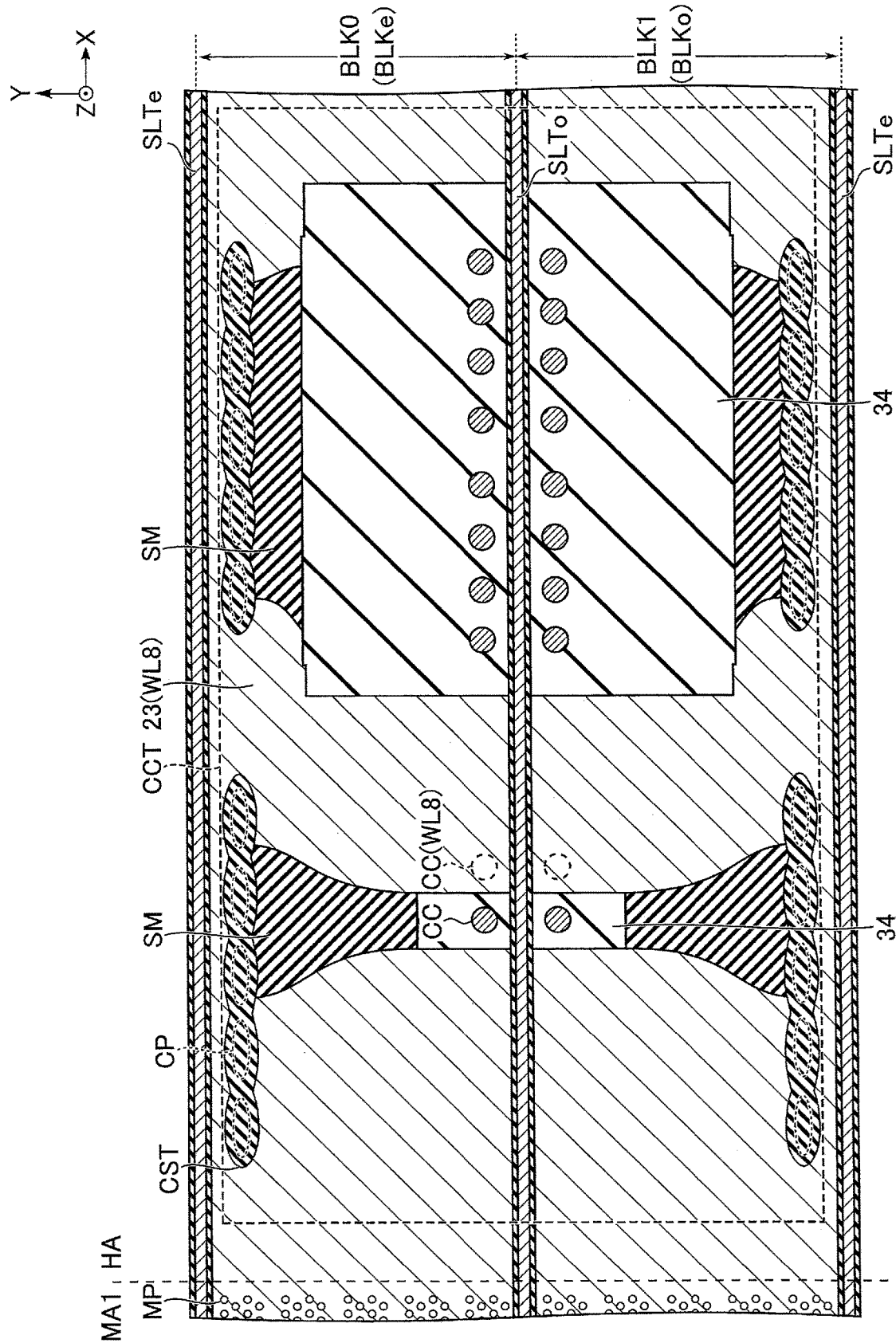
FIG. 35 is a cross-sectional view showing an example of a cross-sectional structure of the memory cell array included in the semiconductor memory device according to the first modification.
Figure 36:
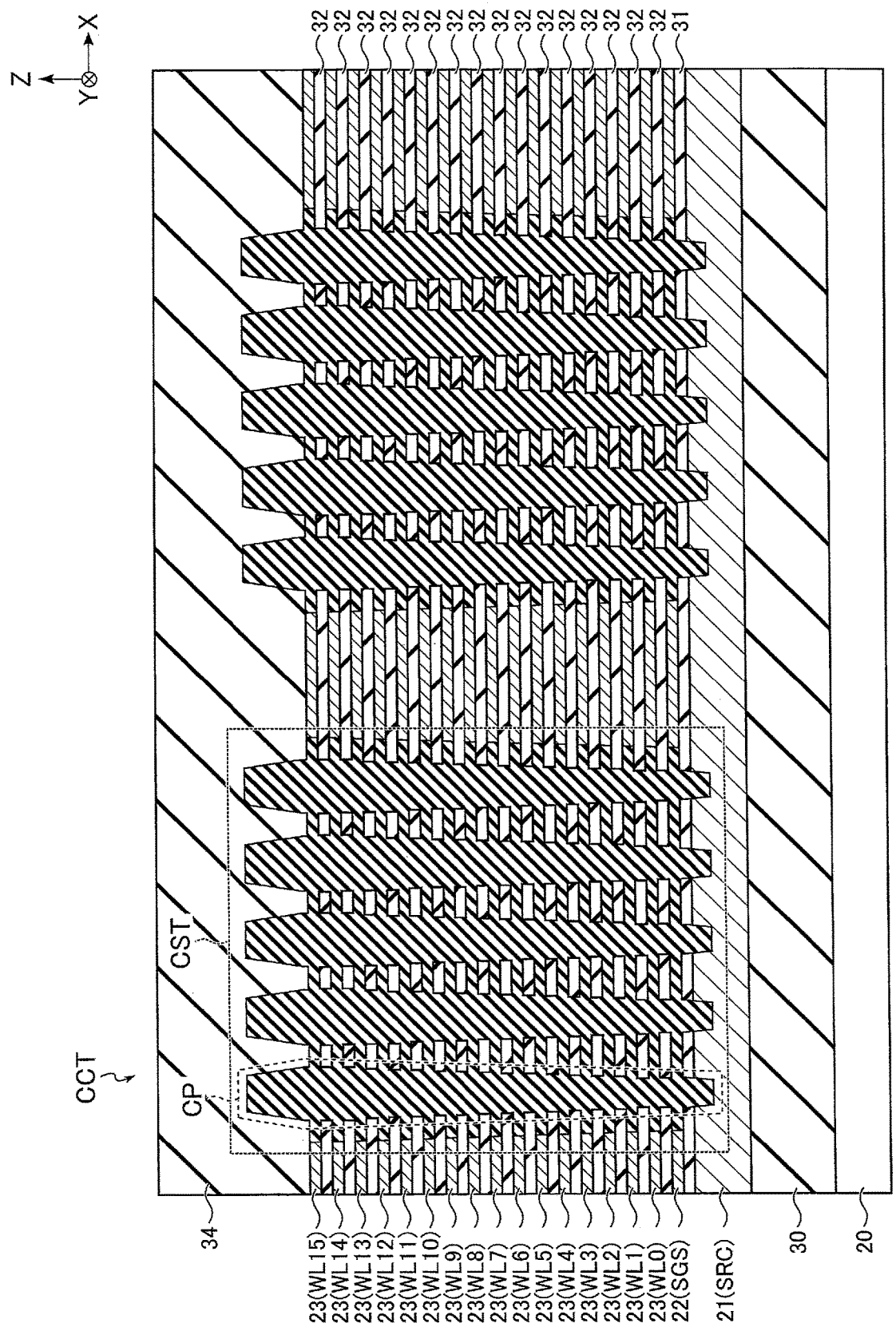
FIG. 36 is a cross-sectional view taken along line XXXVI-XXXVI in FIG. 34, showing an example of a cross-sectional structure of a part of a hookup area of the memory cell array included in the semiconductor memory device according to the first modification.

The configuration of the semiconductor memory device 1 according to the first modification will be described with reference to FIGS. 34, 35, and 36. FIG. 34 is a plan view showing an example of a planar layout of a contact area, and its vicinity, of a memory cell array included in the semiconductor memory device according to the first modification. FIG. 35 is a cross-sectional view showing an example of a cross-sectional structure of the memory cell array included in the semiconductor memory device according to the first modification. FIG. 35 shows a structure in an XY cross section of the stacked-layer member SL8 of the memory cell array 10 in the area shown in FIG. 34. FIG. 36 is a cross-sectional view taken along line XXXVI-XXXVI in FIG. 34, showing an example of a cross-sectional structure of a part of a hookup area of the memory cell array included in the semiconductor memory device according to the first modification.

In the plan view of FIG. 34, each member CST includes, for example, five portions CP. The five portions CP each have a pillar-shaped structure, in which an insulator is embedded, with an elliptical cross section whose long axis direction is parallel to the X direction and short axis direction is parallel to the Y direction. The five portions CP are arranged, for example, to be distanced from one another in the X direction.

A cross-sectional structure of the member CST will be described with reference to FIG. 35.

In the cross section shown in FIG. 35, each of the members CST is provided to surround an area corresponding to the five portions CP included in the member CST shown, for example, in the plan view of FIG. 34. Specifically, each member CST has, for example, a cross-sectional shape in which five elliptical shapes provided around the planar structures of the portions CP are aligned in the X direction. Of the five elliptical shapes aligned in the X direction, two adjacent elliptical shapes are arranged to at least partly overlap each other.

The cross-sectional structure of the member CST will be further described with reference to FIG. 36.

As shown in FIG. 36, each portion CP passes through the stacked-layer members SL. The top of each portion CP is in contact with the insulating layer 34. The bottom of each portion CP is in contact with the conductive layer 21.

Of the five portions CP included in each member CST, two adjacent portions CP are coupled by portions of the member CST at levels similar to those of the conductive layer 22 and stacked-layer members SL0 to SL15.

The member CST has a cross-sectional structure similar to that of the member CST shown in FIG. 35 at each of levels similar to those of the conductive layer 22 and conductive layers 23. The member CST also has a cross-sectional structure similar to the planar structure of the member CST shown in FIG. 34 at each level similar to those of the conductive layer 21 and insulating layers 31, 32, and 34.

With the above-described configuration, the semiconductor memory device 1 according to the first modification includes sacrificial members SM at levels similar to those of the conductive layers 23 as in the embodiment.

Next, the method of manufacturing the semiconductor memory device 1 according to the first modification will be described with reference to FIGS. 37 to 40. The plan view of FIG. 37 corresponds to the area shown in FIG. 34. The cross-sectional views of FIGS. 38 and 39 correspond to the area shown in FIG. 36. The cross-sectional view of FIG. 40 corresponds to the area shown in FIG. 35. The method of manufacturing the semiconductor memory device 1 according to the first modification is substantially the same as that according to the embodiment, except for the steps for forming the members CST. Hereinafter, the steps for forming the members CST (i.e., the steps corresponding to FIGS. 27 to 30) will be mainly described.

Figure 37:
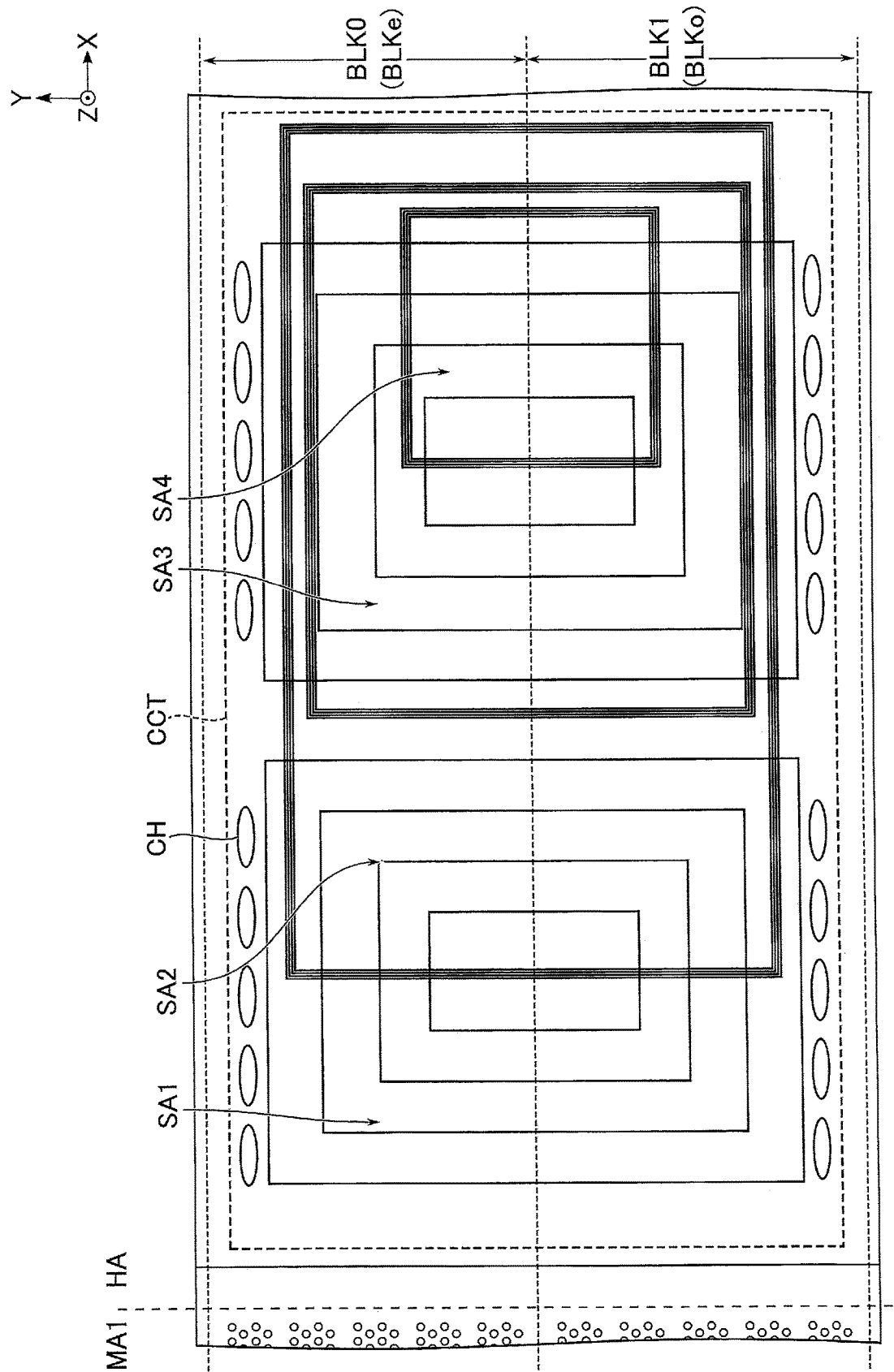
FIG. 37 is a plan view for explaining an example of a method of manufacturing the memory cell array included in the semiconductor memory device according to the first modification.
Figure 38:
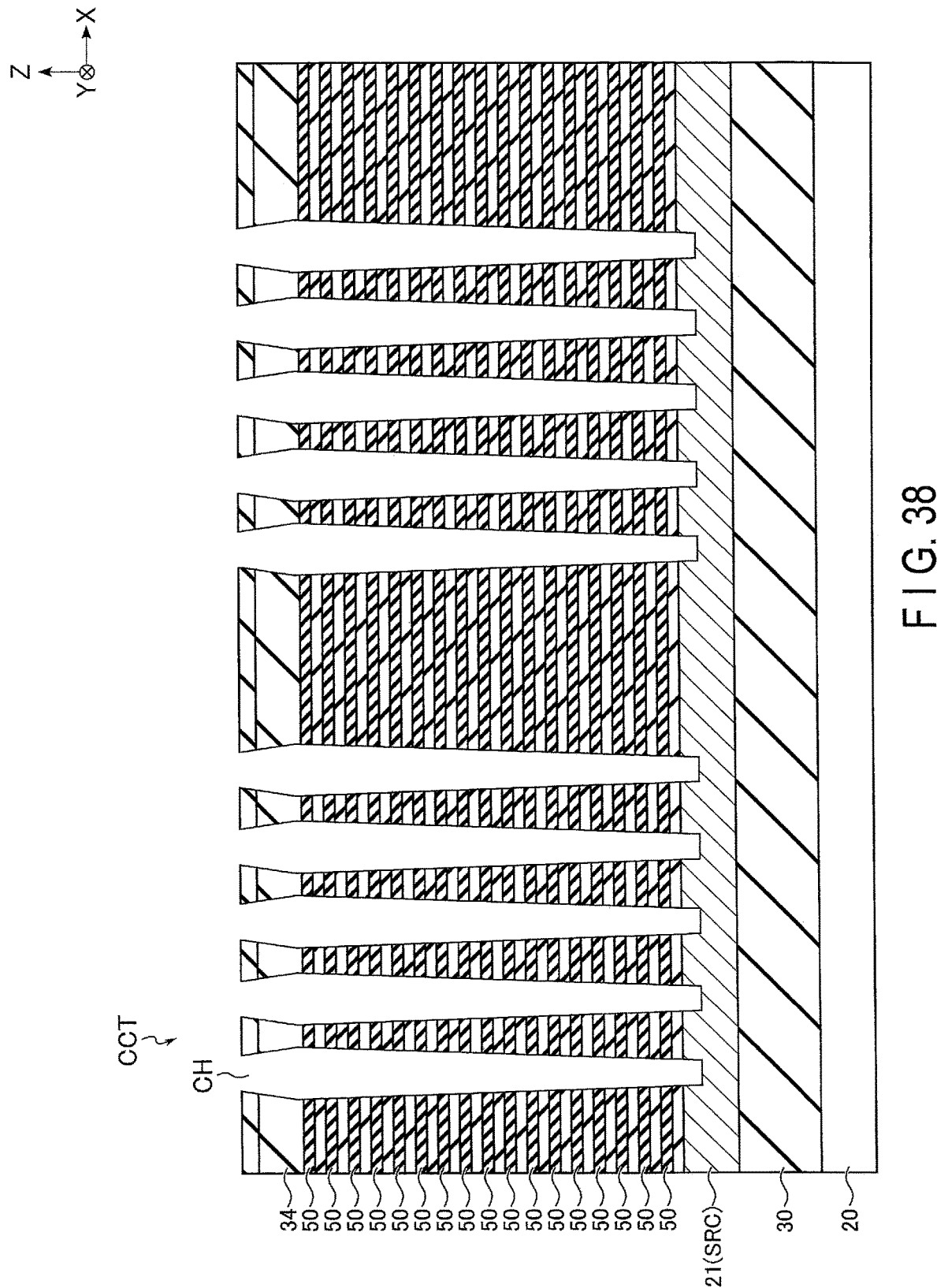
FIG. 38 is a cross-sectional view for explaining an example of the method of manufacturing the memory cell array included in the semiconductor memory device according to the first modification.

In the first modification, after the staircase structure of the layer stack is formed, step S111 of the embodiment is incorporated into step S109 of the embodiment so that members CST are formed in addition to the memory pillars MP. As shown in FIGS. 37 and 38, holes CH corresponding to the portions CP are formed, for example, by the same process as that for forming holes corresponding to the memory pillars MP.

Specifically, a mask including openings in areas corresponding to the memory pillars MP and portions CP is formed by, for example, photolithography. Then, holes CH, which pass through, for example, the insulating layers 31 and 34, the insulating layers 32, and the sacrificial members 50, are formed by anisotropic etching using the mask.

Thereafter, memory pillars MP are formed in the holes for forming memory pillars MP.

Figure 39:
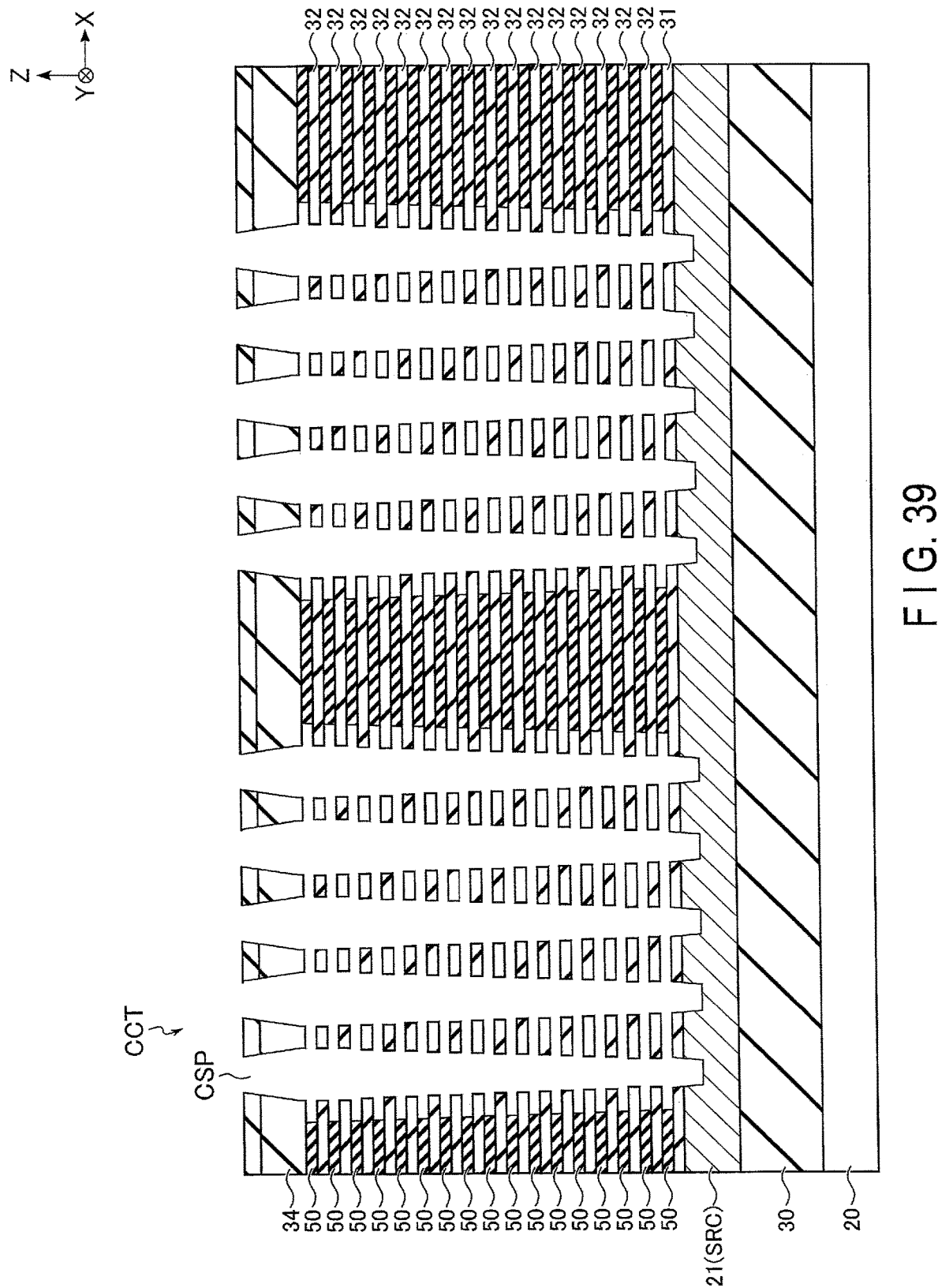
FIG. 39 is a cross-sectional view for explaining an example of the method of manufacturing the memory cell array included in the semiconductor memory device according to the first modification.

Then, as shown in FIG. 39, portions of the sacrificial members 50 are selectively removed by wet etching using, for example, thermal phosphoric acid via the holes CH. Spaces CSP in which members CST are to be formed are thereby formed. The insulating layers 32 are not removed by wet etching.

Figure 40:
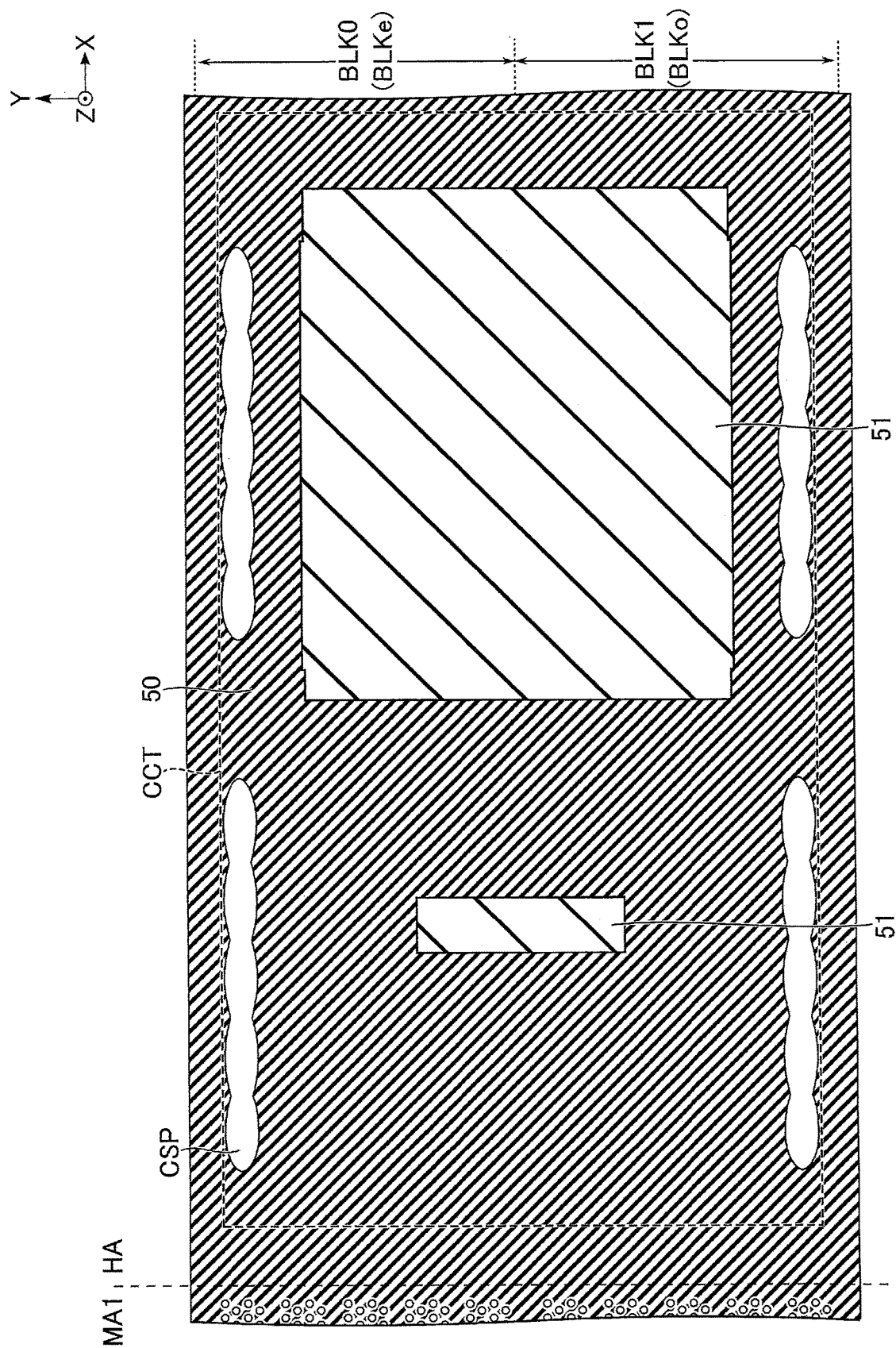
FIG. 40 is a cross-sectional view for explaining an example of the method of manufacturing the memory cell array included in the semiconductor memory device according to the first modification.

Through this step, spaces CSP in shapes corresponding to the cross-sectional structures of the members CST shown in FIG. 35 are formed at levels similar to those of the sacrificial members 50 as shown in FIG. 40.

Thereafter, an insulator is embedded in each space CSP. The insulator embedded in each space CSP is, for example, silicon oxide.

Through the above steps, the members CST are formed. Slits SH are then formed in step S110 of the embodiment. Unlike in the embodiment, the slits SH are formed after the members CST are formed.

The above-described configuration and manufacturing method can produce advantageous effects similar to those of the embodiment.

2.2 Second Modification

In the above first modification, portions of sacrificial members 50 are removed by wet etching via holes CH in the manufacturing process; however, the manufacturing process is not limited to this. For example, wet etching via the holes CH may not only remove the portions of the sacrificial members 50 but also a portion of the insulating layer 31 and portions of the insulating layers 32.

The configuration and manufacturing method of the semiconductor memory device 1 according to the second modification are substantially the same as those of the semiconductor memory device 1 according to the first modification, except for the part relating to the member CST. The configuration and manufacturing method of the member CST will be mainly described below.

Figure 41:
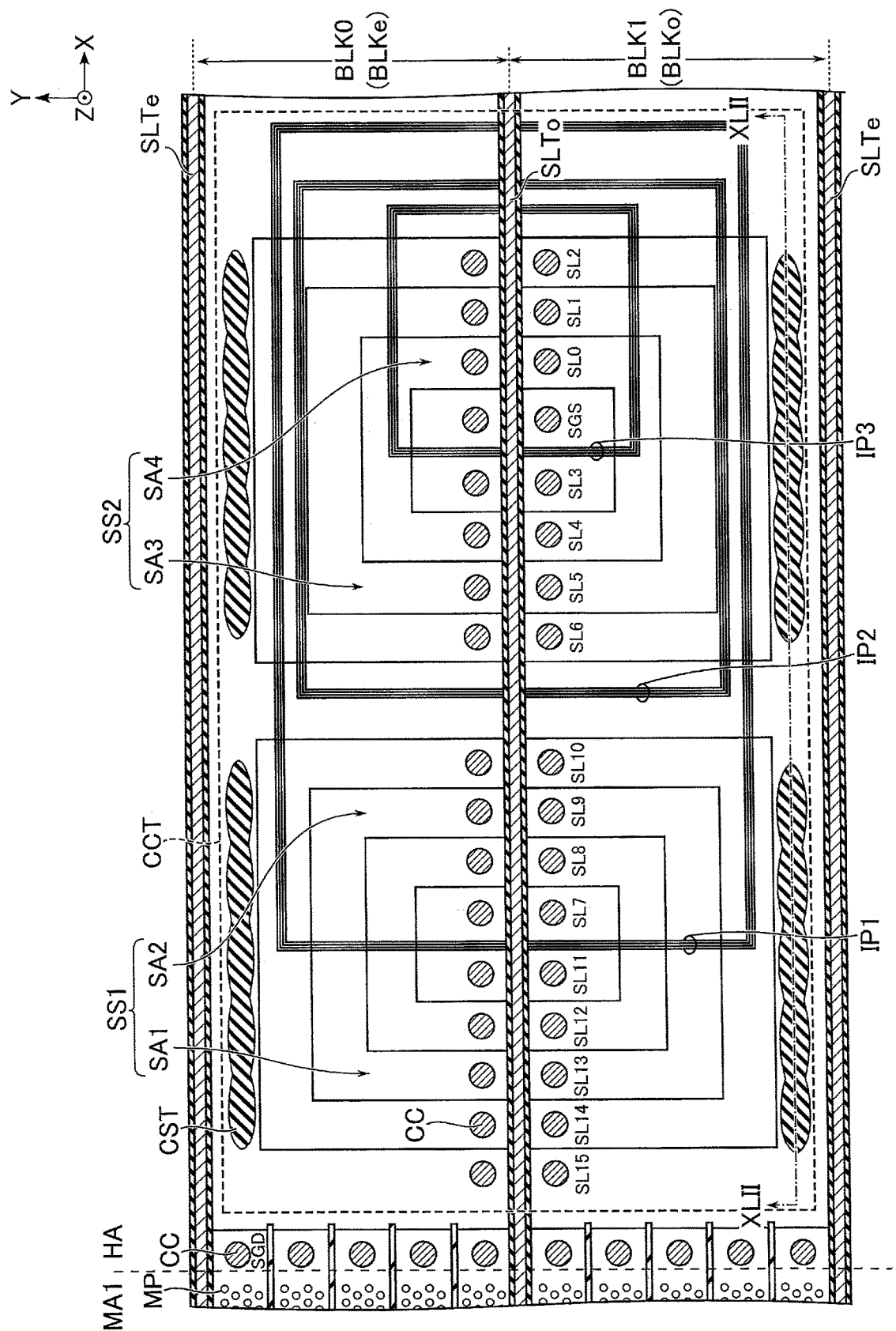
FIG. 41 is a plan view showing an example of a planar layout of a contact area, and its vicinity, of a memory cell array included in a semiconductor memory device according to a second modification.
Figure 42:
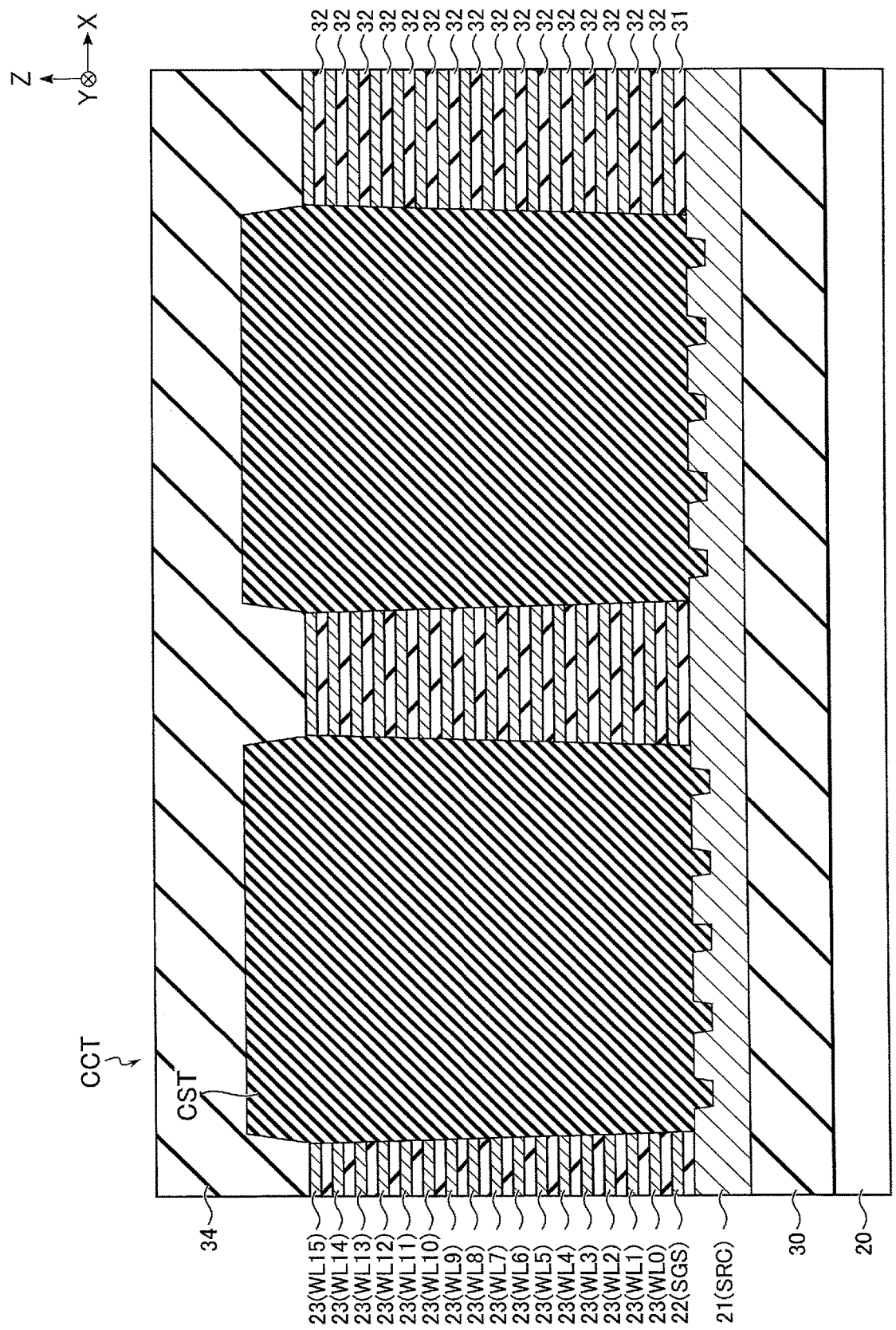
FIG. 42 is a cross-sectional view taken along line XLII-XLII in FIG. 41, showing an example of a cross-sectional structure of a part of a hookup area of the memory cell array included in the semiconductor memory device according to the second modification.

The configuration of the semiconductor memory device 1 according to the second modification will be described with reference to FIGS. 41 and 42. FIG. 41 is a plan view showing an example of a planar layout of a contact area, and its vicinity, of a memory cell array included in the semiconductor memory device according to the second modification. FIG. 42 is a cross-sectional view taken along line XLII-XLII in FIG. 41, showing an example of a cross-sectional structure of a part of a hookup area of the memory cell array included in the semiconductor memory device according to the second modification.

In the planer layout shown in FIG. 41, each of the members CST has a cross-sectional structure in which two adjacent elliptical shapes of the five elliptical shapes aligned in the X direction at least partly overlap each other. That is, the planer structures of the members CST in FIG. 41 are similar to the cross-sectional structures of the members CST (shown in FIG. 35) in the first modification.

At levels similar to those of the stacked-layer members SL0 to SL15, the conductive layer 22, and the insulating layers 32, the cross-sectional structures of the members CST are substantially the same as the planar structures of the members CST shown in FIG. 41.

Next, the cross-sectional structure of each member CST will be described with reference to FIG. 42.

As shown in FIG. 42, the members CST pass through the stacked-layer members SL in the contact area CCT. The top of each member CST is in contact with the insulating layer 34. The bottom of each member CST is in contact with the conductive layer 21. Specifically, the bottom of each member CST includes, for example, portions with bottom surfaces at levels similar to that of the lower surface of the insulating layer 31, and portions with bottom surfaces in contact with the conductive layer 21 at levels lower than the lower surface of the insulating layer 31.

With the above-described configuration, the semiconductor memory device 1 according to the second modification includes sacrificial members SM at levels similar to those of the conductive layers 23 as in the embodiment.

The method of manufacturing the semiconductor memory device 1 according to the second modification will be described with reference to FIG. 43. The cross-sectional view of FIG. 43 corresponds to the area shown in FIG. 42. The method of manufacturing the semiconductor memory device 1 according to the second modification will be described below, focusing on differences from the manufacturing method of the first modification.

First, holes CH are formed in a step similar to that of the first modification shown in FIG. 38.

Figure 43:
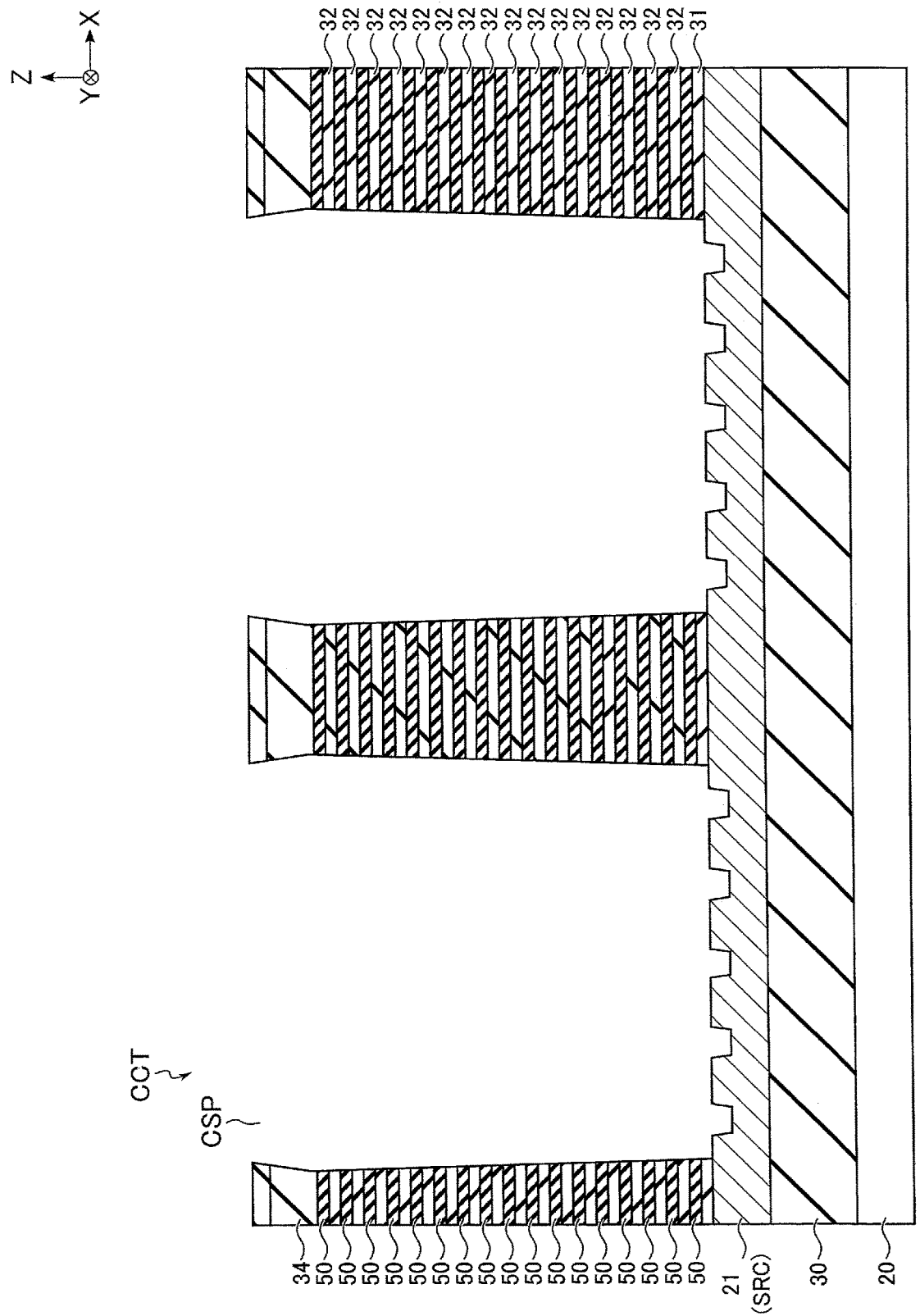
FIG. 43 is a cross-sectional view for explaining an example of a method of manufacturing the memory cell array included in the semiconductor memory device according to the second modification.

Then, as shown in FIG. 43, through wet etching via the holes CH, portions of sacrificial members 50, portions of insulating layers 31 and 34, and portions of insulating layers 32 are selectively removed. Accordingly, spaces CSP in which members CST are to be formed are formed.

Specifically, portions of sacrificial members 50 are selectively removed by, for example, a step similar to that of the first modification shown in FIG. 39. After the portions of the sacrificial members 50 are removed, portions of insulating layers 31 and 34 and portions of insulating layers 32 are selectively removed by wet etching using hydrofluoric acid or the like via the holes CH. Note that, for example, the portions of the insulating layers 31 and 34 and the portions of the insulating layers 32 may be removed earlier than the portions of the sacrificial members 50.

Thereafter, an insulator is embedded in each space CSP.

Via the above steps, the members CST are formed.

The above-described configuration and manufacturing method can produce advantageous effects similar to those of the embodiment and the first modification.

2.3 Third Modification

In the above embodiment, first modification, and second modification, a plurality of terrace portions corresponding to a plurality of stacked-layer interconnects form stadium-like staircase structures in the XZ cross section; however, the configuration is not limited to these. The semiconductor memory device 1 may have, for example, a structure in which a plurality of terrace portions corresponding to a plurality of stacked-layer interconnects are aligned in the X direction to ascend or descend from the memory area MA1 side to the memory area MA2 side.

The configuration and manufacturing method of the semiconductor memory device 1 according to the third modification are substantially the same as those of the semiconductor memory devices 1 according to the embodiment, the first modification, and the second modification, except for the part relating to the staircase structure of the layer stack. The configuration and manufacturing method of the staircase structure of the layer stack will be mainly described below.

Figure 44:
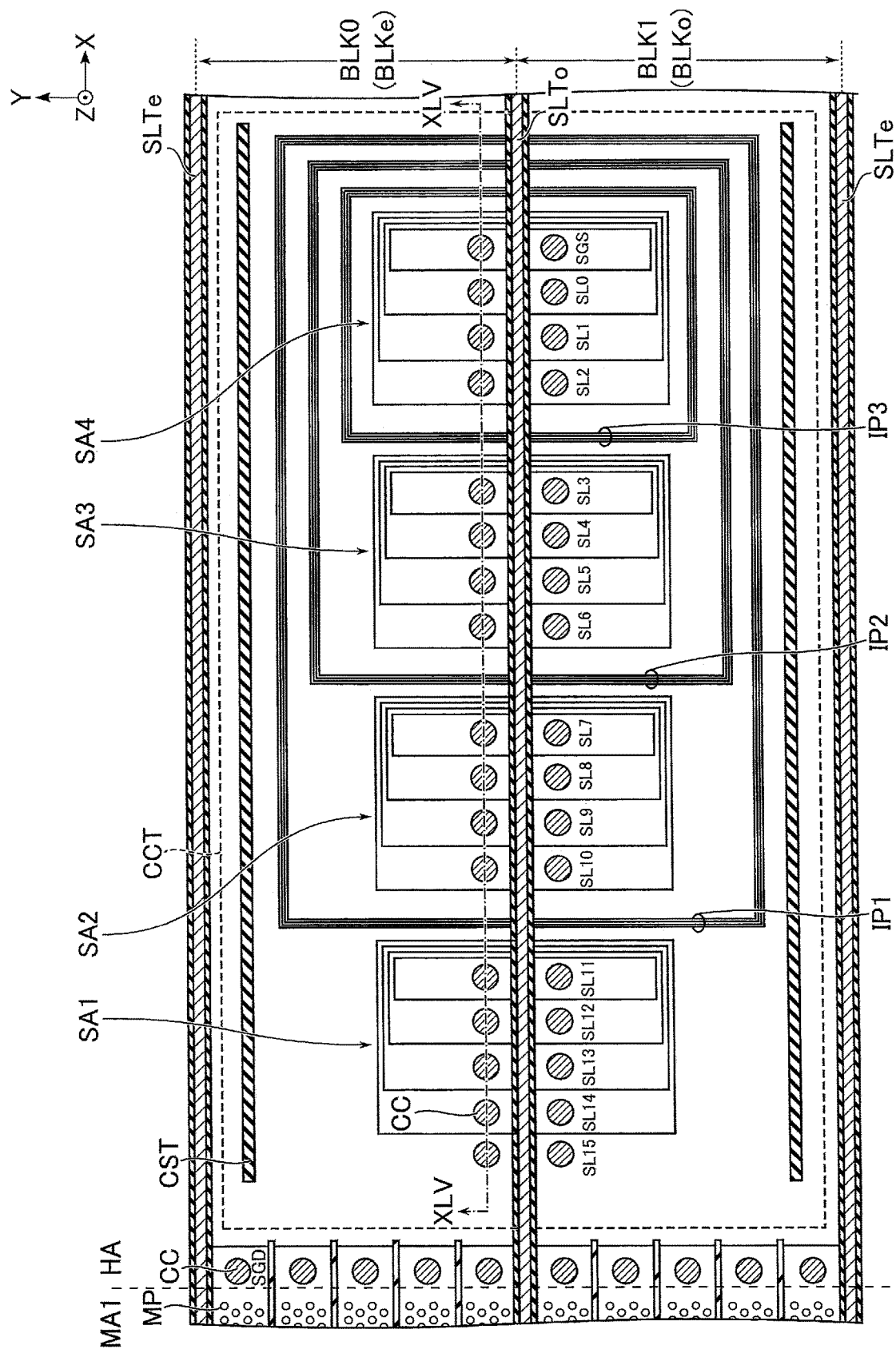
FIG. 44 is a plan view showing an example of a planar layout of a contact area, and its vicinity, of a memory cell array included in a semiconductor memory device according to a third modification.
Figure 45:
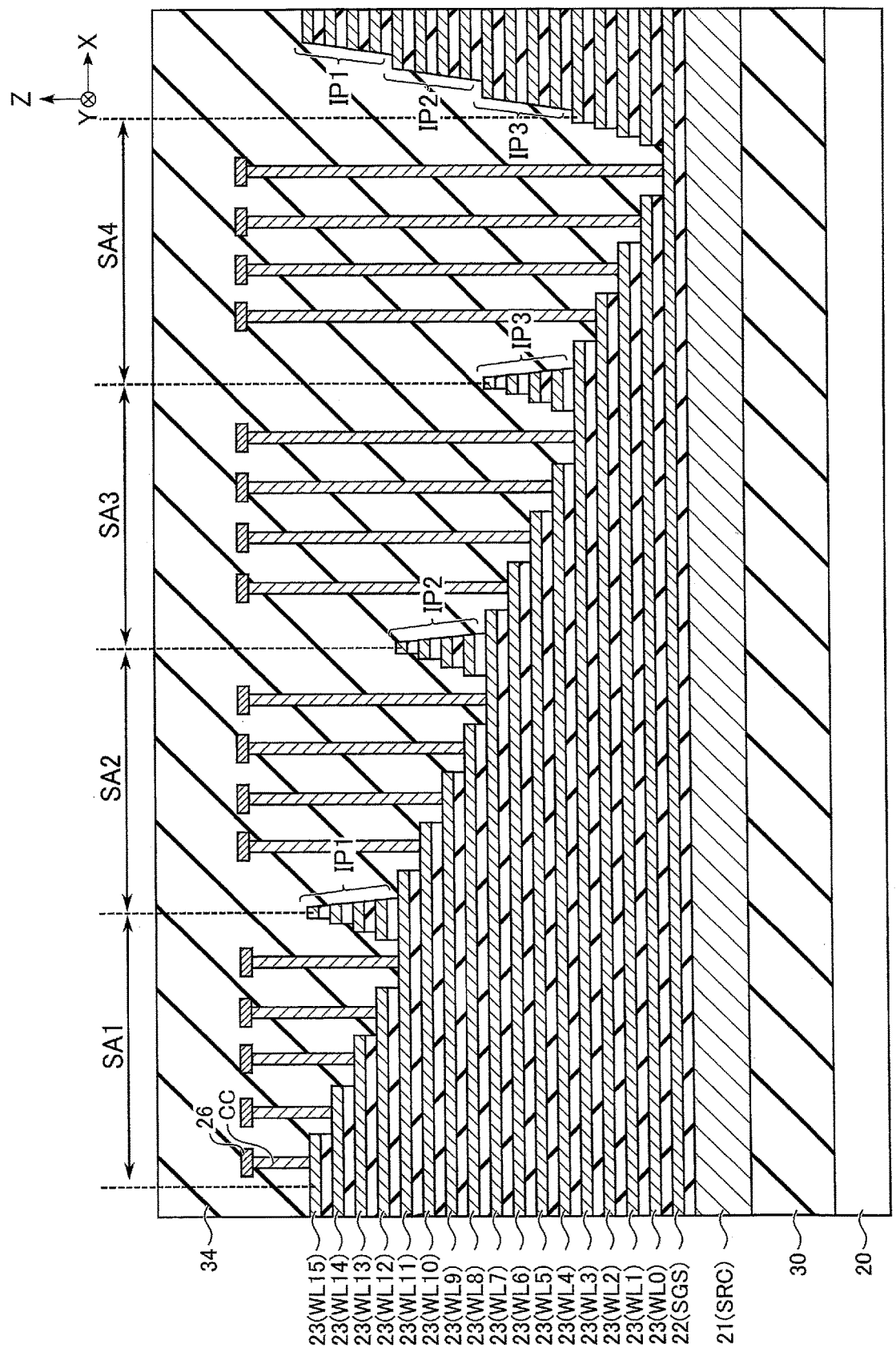
FIG. 45 is a cross-sectional view taken along line XLV-XLV in FIG. 44, showing an example of a cross-sectional structure of a part of a hookup area of the memory cell array included in the semiconductor memory device according to the third modification.

The configuration of the semiconductor memory device 1 according to the third modification will be described with reference to FIGS. 44 and 45. FIG. 44 is a plan view showing an example of a planar layout of a contact area, and its vicinity, of a memory cell array included in the semiconductor memory device according to the third modification. FIG. 45 is a cross-sectional view taken along line XLV-XLV in FIG. 44, showing an example of a cross-sectional structure of a part of a hookup area of the memory cell array included in the semiconductor memory device according to the third modification.

As shown in FIG. 44, in the contact area CCT, the memory cell array 10 includes inclined portions IP (IP1, IP2, and IP3), staircase areas SA1, SA2, SA3, and SA4, and a plurality of members CST, and a plurality of contacts CC.

Each inclined portion IP in the third embodiment is a step including the ends of four consecutive stacked-layer members SL provided in a rectangular shape in a plan view, which is similar to the inclined portions IP according to the embodiment. The inclined portion IP2 is provided on the memory area MA2 side inside the inclined portion IP1. The inclined portion IP3 is provided on the memory area MA2 side inside the inclined portion IP2.

The staircase area SA1 is an area on the memory area MA1 side outside the inclined portion IP1. The staircase area SA1 includes the terrace portions of the stacked-layer members SL11 to SL15. In the staircase area SA1, the terrace portions of the stacked-layer members SL11 to SL15 are arranged to descend in the X direction from the memory area MA1 side to the memory area MA2 side. Of the staircase area SA1, the terrace portions of the stacked-layer members SL11 to SL14 are surrounded by an end portion of the stacked-layer member SL15 to have a rectangular shape.

The staircase area SA2 is an area on the memory area MA1 side inside the inclined portion IP1 and outside the inclined portion IP2. The staircase area SA2 includes the terrace portions of the stacked-layer members SL7 to SL10. In the staircase area SA2, the terrace portions of the stacked-layer members SL7 to SL10 are arranged to descend in the X direction from the memory area MA1 side to the memory area MA2 side. In the staircase area SA2, the terrace portions of the stacked-layer members SL7 to SL10 are surrounded by an end portion of the stacked-layer member SL11 to have a rectangular shape.

The staircase area SA3 is an area on the memory area MA1 side inside the inclined portion IP2 and outside the inclined portion IP3. The staircase area SA3 includes the terrace portions of the stacked-layer members SL3 to SL6. In the staircase area SA3, the terrace portions of the stacked-layer members SL3 to SL6 are arranged to descend in the X direction from the memory area MA1 side to the memory area MA2 side. In the staircase area SA3, the terrace portions of the stacked-layer members SL3 to SL6 are surrounded by an end portion of the stacked-layer member SL7 to have a rectangular shape.

The staircase area SA4 is an area inside the inclined portion IP3. The staircase area SA4 includes the terrace portions of the stacked-layer members SL0 to SL2 and select gate line SGS. In the staircase area SA4, the terrace portions of the stacked-layer members SL0 to SL2 and select gate line SGS are arranged to descend in the X direction from the memory area MA1 side to the memory area MA2 side. In the staircase area SA4, the terrace portions of the stacked-layer members SL0 to SL2 and select gate line SGS are surrounded by an end portion of the stacked-layer member SL3 to have a rectangular shape.

In the third modification, the memory cell array 10 includes one member CST in each block BLK. That is, the memory cell array 10 includes two members CST per contact area CCT.

The member CST included in the block BLKe and the member CST included in the block BLKo are provided so as to interpose, for example, the area surrounded by the inclined portion IP1 therebetween in the Y direction.

In the contact area CCT, the contacts CC corresponding respectively to the select gate line SGS and stacked-layer members SL0 to SL15 included in each block BLK are arranged, for example, in the X direction in a straight line. The contacts CC corresponding respectively to the stacked-layer members SL15, SL14, SL13, SL12, SL11, S110, SL9, SL8, SL7, SL6, SL5, SL4, SL3, SL2, SL1, and SL0 and select gate line SGS are arranged in the order of appearance from the memory area MA1 side to the memory area MA2 side.

In the cross section shown in FIG. 45, the layer stack includes the terrace portions of the conductive layers 23.

In each of the staircase areas SA1, SA2, SA3, and SA4, the staircase structure formed by the conductive layers 22 and 23 has substantially the same structure except for the height, for example.

With the above-described configuration, the semiconductor memory device 1 according to the third modification includes sacrificial members SM at levels similar to those of the conductive layers 23 as in the embodiment, for example.

Next, the method of manufacturing the semiconductor memory device 1 according to the third modification will be briefly described. Hereinafter, a method of forming staircase structures of the layer stack (i.e., the steps corresponding to FIGS. 14 to 26 in the embodiment) will be mainly described.

The staircase structure included in each of the staircase areas SA1, SA2, SA3, and SA4 is formed by repeating the anisotropic etching using a mask.

Specifically, in the staircase area SA4 in the plan view of FIG. 44, one sacrificial member 50 and one insulating layer 32 are removed by anisotropic etching using a mask. Subsequently, in an area of the staircase area SA4 which includes the terrace portions of the stacked-layer members SL1 and SL0 and select gate line SGS, one sacrificial member 50 and one insulating layer 32 are removed by anisotropic etching using a mask. Then, in an area of the staircase area SA4 which includes the terrace portions of the stacked-layer member SL0 and select gate line SGS, one sacrificial member 50 and one insulating layer 32 are removed by anisotropic etching using a mask. Thereafter, in an area of the staircase area SA4 which includes the terrace portion of the select gate line SGS, one sacrificial member 50 and one insulating layer 32 are removed by anisotropic etching using a mask. By these steps, terrace portions (included in the staircase area SA4) relating to the stacked-layer members SL2 to SL0 and select gate line SGS are formed in the staircase area SA4. The terrace portions relating to the stacked-layer members SL11 to SL14 included in the staircase area SA1, the terrace portions relating to the stacked-layer members SL7 to SL10 included in the staircase area SA2, and the terrace portions relating to the stacked-layer members SL3 to SL6 included in the staircase area SA3 are formed by substantially the same steps as those for forming the terrace portions included in the staircase area SA4. The terrace portions included in the respective staircase areas SA1, SA2, SA3, and SA4 may be formed in parallel with each other.

Next, through steps similar to S103 and S104 of the embodiment, four sacrificial members 50 and four insulating layers 32 are collectively removed in an area including the staircase areas SA2, SA3, and SA4. An inclined portion IP1 is thereby formed.

Then, through steps similar to S105 and S106 of the embodiment, four sacrificial members 50 and four insulating layers 32 are collectively removed in an area including the staircase areas SA3 and SA4. An inclined portion IP2 is thereby formed.

Thereafter, through steps similar to S107 and S108 of the embodiment, four sacrificial members 50 and four insulating layers 32 are collectively removed in an area including the staircase area SA4. An inclined portion IP3 is thereby formed.

Via the above steps, the staircase structure of the layer stack of the semiconductor memory device 1 according to the third modification is formed.

The above-described manufacturing process is merely an example, and the manufacturing process is not limited thereto. For example, the staircase structure of the terrace portions included in each staircase area SA may be formed after the inclined portions IP1 to IP3 are formed.

The above-described configuration can produce advantageous effects similar to those of the embodiment, the first modification, and the second modification.

2.4 Fourth Modification

In the above embodiment, first modification, second modification, and third modification, the staircase structure of the layer stack includes areas surrounded by a plurality of inclined portions IP in the contact area CCT; however, the configuration is not limited to this. For example, the staircase structure of the layer stack may be provided to include an area surrounded by one inclined portion IP.

The configuration and manufacturing method of the semiconductor memory device 1 according to the fourth modification are substantially the same as those of the semiconductor memory device 1 according to the third modification, except for the part relating to the staircase structure of the layer stack. The configuration and manufacturing method of the staircase structure of the layer stack will be mainly described below.

Figure 46:
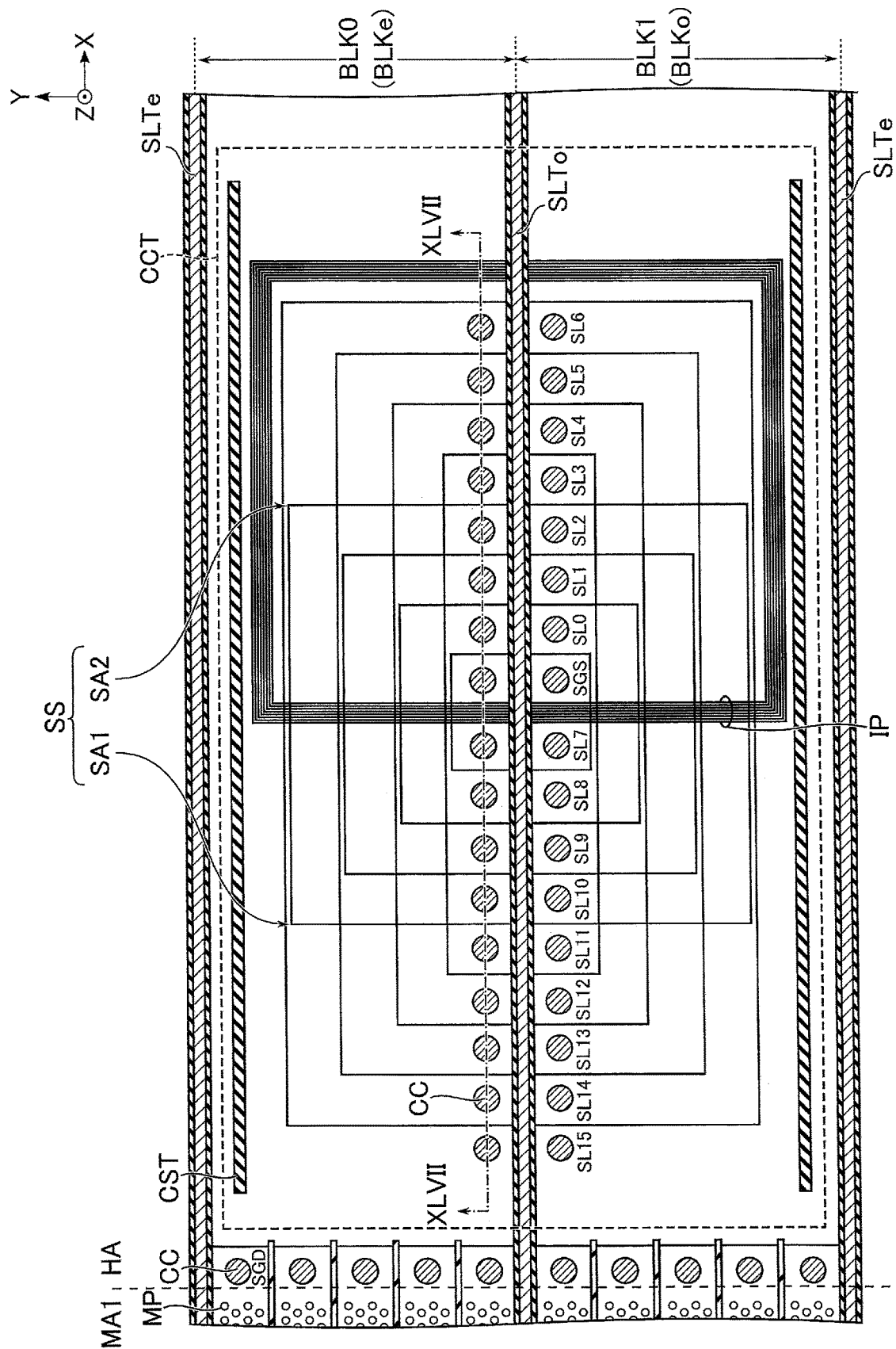
FIG. 46 is a plan view showing an example of a planar layout of a contact area, and its vicinity, of a memory cell array included in a semiconductor memory device according to a fourth modification.
Figure 47:
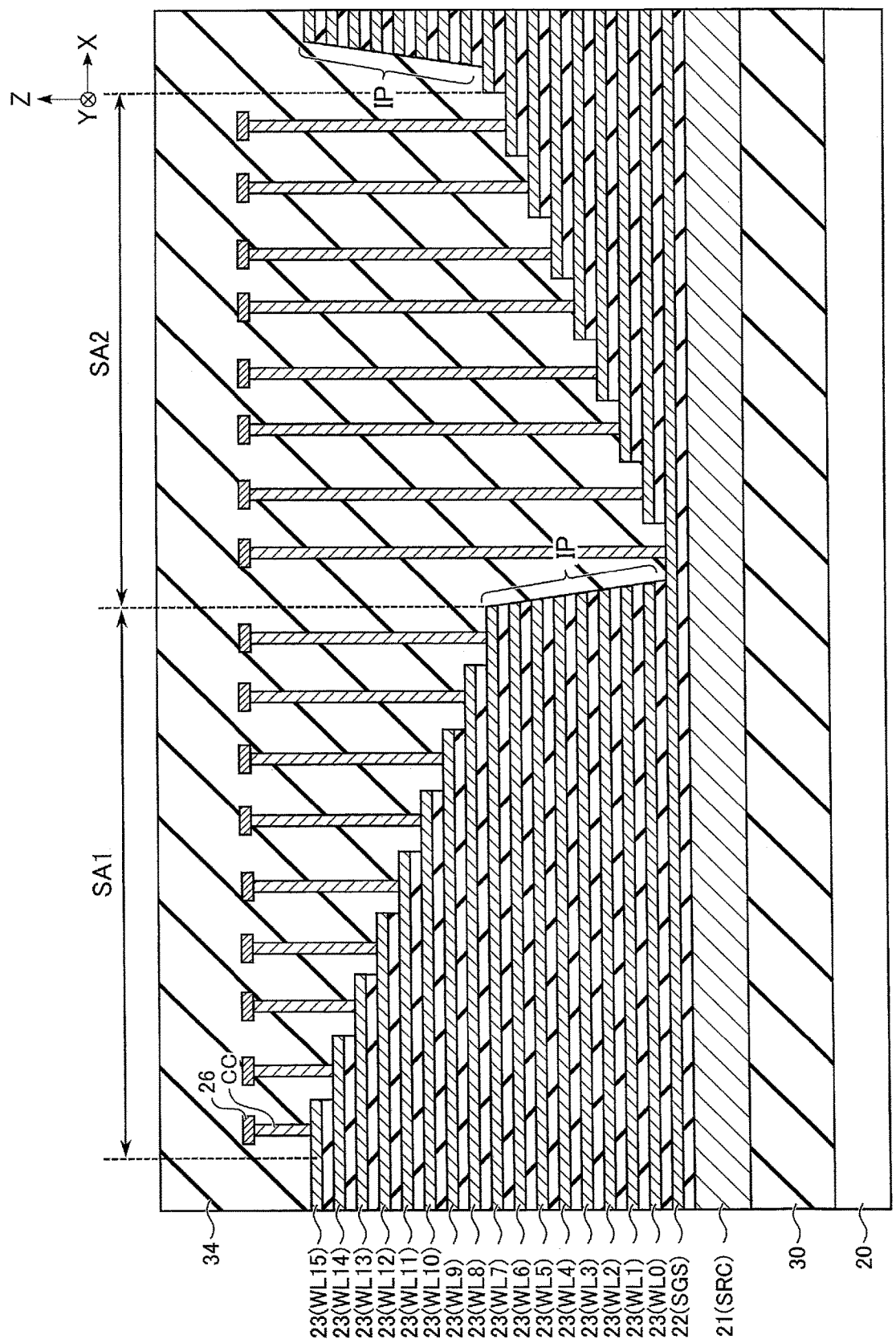
FIG. 47 is a cross-sectional view taken along line XLVII-XLVII in FIG. 46, showing an example of a cross-sectional structure of a part of a hookup area of the memory cell array included in the semiconductor memory device according to the fourth modification.

The configuration of the semiconductor memory device 1 according to the fourth modification will be described with reference to FIGS. 46 and 47. FIG. 46 is a plan view showing an example of a planar layout of a contact area, and its vicinity, of a memory cell array included in the semiconductor memory device according to the fourth modification. FIG. 46 shows a contact area CCT (included in the hookup portion HPe) corresponding to an area of adjacent blocks BLK0 (BLKe) and BLK1 (BLKo), and a part of a memory area MA1 in the vicinity of the contact area CCT. FIG. 47 is a cross-sectional view taken along line XLVII-XLVII in FIG. 46, showing an example of a cross-sectional structure of a part of a hookup area of the memory cell array included in the semiconductor memory device according to the fourth modification.

As shown in FIG. 46, in the contact area CCT, the memory cell array 10 includes a stadium-like staircase portion SS, an inclined portion IP, and a plurality of members CST, and a plurality of contacts CC.

In the fourth modification, the memory cell array 10 includes one stadium-like staircase portion SS in the contact area CCT. The stadium-like staircase portion SS in the fourth modification is similar in configuration to the stadium-like staircase portion SS according to the embodiment in that a step corresponding to one layer is formed along the X direction.

As with the inclined portions IP according to the embodiment, the inclined portion IP in the fourth modification is a step including the ends of a plurality of consecutive stacked-layer members SL provided in a rectangular shape in a plan view. In the fourth modification, the inclined portion IP includes the ends of eight consecutive stacked-layer members SL. The inclined portion IP is provided in the contact area CCT so as to laterally traverse the memory area MA2 side of the stadium-like staircase portion SS in the X direction and longitudinally traverse the center portion of the stadium-like staircase portion SS in the Y direction.

The stadium-like staircase portion SS is divided into staircase areas SA1 and SA2 by the inclined portion IP.

The staircase area SA1 is an area of the stadium-like staircase portion SS which lies outside the inclined portion IP. The staircase area SA1 includes, for example, the terrace portions of the stacked-layer members SL7 to SL15. In the staircase area SA1, the terrace portions of the stacked-layer members SL7 to SL15 are arranged to descend in the X direction from the memory area MA1 side to the memory area MA2 side.

The staircase area SA2 is an area of the stadium-like staircase portion SS which lies inside the inclined portion IP. The staircase area SA2 includes, for example, the terrace portions of the stacked-layer members SL0 to SL6 and select gate line SGS. In the staircase area SA2, the terrace portions of the stacked-layer members SL0 to SL6 and select gate line SGS are arranged to ascend in the X direction from the memory area MA1 side to the memory area MA2 side.

The contacts CC corresponding respectively to the stacked-layer members SL15, SL14, SL13, SL12, SL11, SL10, SL9, SL8, and SL7, select gate line SGS, and stacked-layer members SL0, SL1, SL2, SL3, SL4, SL5, and SL6 are arranged in the order of appearance from the memory area MA1 side to the memory area MA2 side.

In the cross section shown in FIG. 47, the layer stack includes terrace portions of the conductive layers 23.

The staircase structures provided respectively in the staircase area SA1 and the staircase area SA2 are plane-symmetrical with respect to the YZ plane except for the height, for example.

With the above-described configuration, the semiconductor memory device 1 according to the fourth modification includes sacrificial members SM at levels similar to those of the conductive layers 23 as in the embodiment, for example.

Next, the method of manufacturing the semiconductor memory device 1 according to the fourth modification will be briefly described. Hereinafter, a method of forming the staircase structures of the layer stack (i.e., the steps corresponding to FIGS. 14 to 26 in the embodiment) will be mainly described.

First, through a step similar to S102 of the embodiment, a structure including the terrace portions relating to the stacked-layer members SL15 to SL11 and the terrace portions relating to the stacked-layer members SL3 to SL6 are formed in an area including the staircase areas SA2 and SA2.

Then, through a step similar to S102 of the embodiment, a structure including the terrace portions relating to the stacked-layer members SL10 to SL7 and the terrace portions relating to the stacked-layer members SL2 to SL0 and select gate line SGS are formed in the area including the staircase areas SA1 and SA2.

Thereafter, via steps similar to S103 and S104 of the embodiment, eight sacrificial members 50 and eight insulating layers 32 are collectively removed in an area including the staircase area SA2. An inclined portion IP is thereby formed.

Via the above steps, the staircase structure of the layer stack of the semiconductor memory device 1 according to the fourth modification is formed.

The above-described configuration and manufacturing method can produce advantageous effects similar to those of the embodiment, the first modification, the second modification, and the third modification.

2.5 Fifth Modification

In the above embodiment, first modification, second modification, third modification, and fourth modification, the contact area CCT includes an inclined portion IP; however, the configuration is not limited to this. The contact area CCT need not include the inclined portion IP.

The configuration and manufacturing method of the semiconductor memory device 1 according to the fifth modification are similar to those of the semiconductor memory devices according to the third modification and the fourth modification, except for the staircase structure of the layer stack. The configuration and manufacturing method of the staircase structure of the layer stack will be mainly described below.

Figure 48:
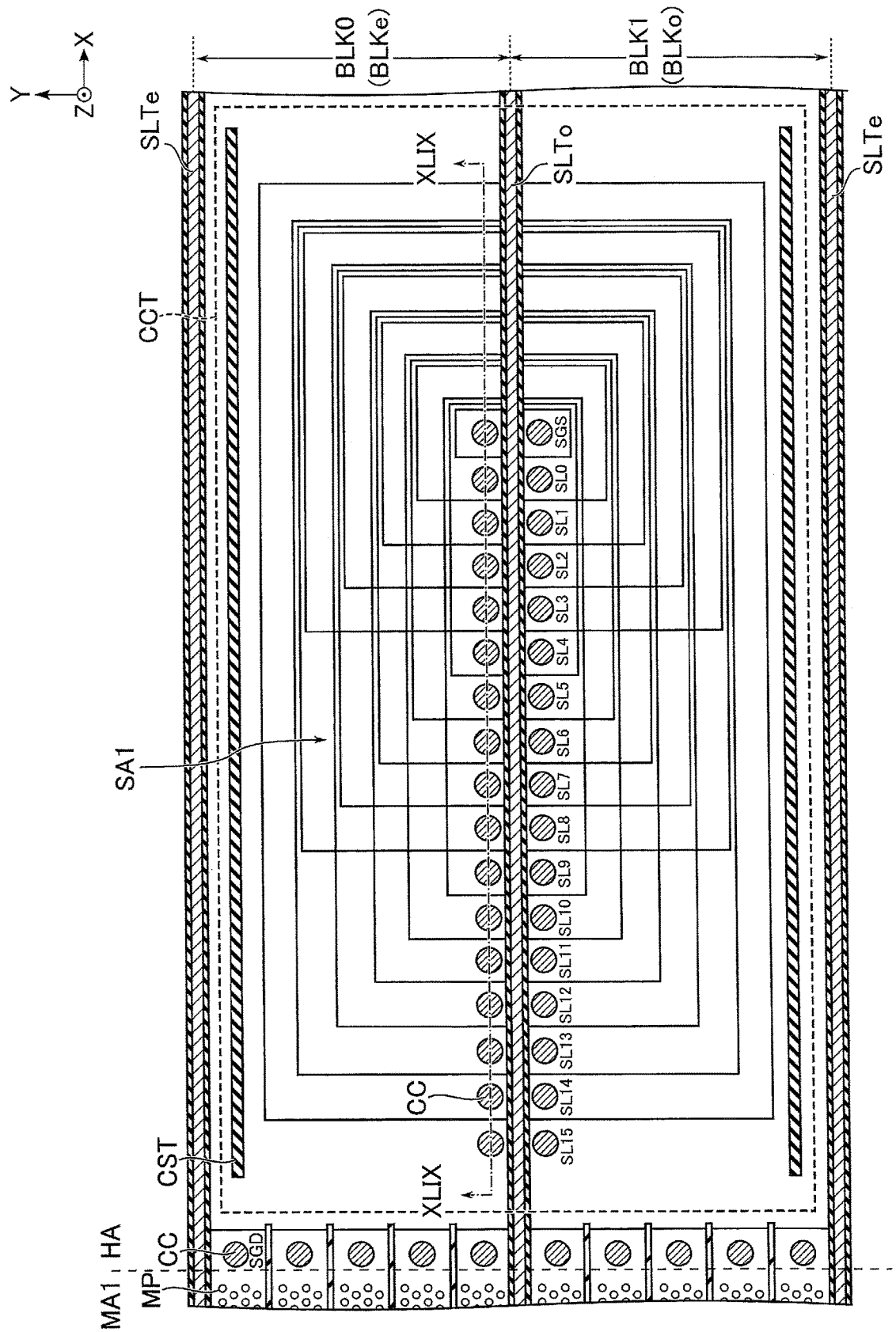
FIG. 48 is a plan view showing an example of a planar layout of a contact area, and its vicinity, of a memory cell array included in a semiconductor memory device according to a fifth modification.

The configuration of the semiconductor memory device 1 according to the fifth modification will be described with reference to FIGS. 48 and 49. FIG. 48 is a plan view showing an example of a planar layout of a contact area, and its vicinity, of a memory cell array included in the semiconductor memory device according to the fifth modification. FIG. 49 is a cross-sectional view taken along line XLIX-XLIX in FIG. 48, showing an example of a cross-sectional structure of a part of a hookup area of the memory cell array included in the semiconductor memory device according to the fifth modification.

As shown in FIG. 48, in the contact area CCT, the memory cell array 10 includes a staircase area SA1, a plurality of members CST, and a plurality of contacts CC.

The staircase area SA1 includes the terrace portions of the select gate line SGS and stacked-layer members SL0 to SL15. In the staircase area SA1, the terrace portions of the select gate line SGS and stacked-layer members SL0 to SL15 are arranged to descend in the X direction from the memory area MA1 side to the memory area MA2 side.

For example, the terrace portions of a plurality of stacked-layer members SL are arranged to ascend in the Y direction from the member SLTo to the member CST at an X-directional position included in the terrace portion of the select gate line SGS in each block BLK. Namely, in an area interposed between the member CST and the member SLTo in each block BLK, the memory cell array 10 includes a staircase structure formed by a plurality of terrace portions.

The contacts CC corresponding respectively to the stacked-layer members SL15, SL14, SL13, SL12, SL11, S110, SL9, SL8, SL7, SL6, SL5, SL4, SL3, SL2, SL1, and SL0, and select gate line SGS are arranged in the order of appearance from the memory area MA1 side to the memory area MA2 side.

In the cross section shown in FIG. 49, the layer stack includes the terrace portions of the conductive layers 23. In the cross section shown in FIG. 49, the memory cell array 10 includes a plurality of contacts CC corresponding to the word lines WL0 to WL15 and select gate line SGS.

With the above-described configuration, the semiconductor memory device 1 according to the fifth modification includes sacrificial members SM at levels similar to those of the conductive layers 23 as in the embodiment, for example.

Next, the method of manufacturing the semiconductor memory device 1 according to the fifth modification will be briefly described. Hereinafter, a method of forming the staircase structure of the layer stack (i.e., the steps corresponding to FIGS. 14 to 26) will be mainly described.

First, through a step similar to S102 of the embodiment, a structure including the terrace portions of the stacked-layer members SL9 to SL15 in the staircase area SA1 is formed.

Then, through a step similar to S102 of the embodiment, a structure including the terrace portions of the stacked-layer members SL4 to SL8 in the staircase area SA1 is formed.

Thereafter, through a step similar to S102 of the embodiment, a structure including the terrace portions of the select gate line SGS and stacked-layer members SL0 to SL3 in the staircase area SA1 is formed.

Via the above steps, the structure of the staircase area SA1 is formed.

The above-described configuration and manufacturing method can produce advantageous effects similar to those of the embodiment, the first modification, the second modification, the third modification, and the fourth modification.

2.6 Sixth Modification

In the above embodiment and first to fifth modifications, a plurality of members CST are each provided between a staircase area SA and a member SLTe, and pass through all of the stacked-layer members SL0 to SL15 and select gate line SGS; however, the configuration is not limited to this. The member CST may be provided to include, for example, an area in a staircase area SA, where the members CST pass through some stacked-layer members SL of the stacked-layer members SL0 to SL15 and select gate line SGS.

The configuration and manufacturing method of the semiconductor memory device 1 according to the sixth modification are similar to those of the semiconductor memory device 1 according to the embodiment, except for the part relating to the member CST. Therefore, the configuration and manufacturing method of the member CST will be mainly described below.

Figure 50:
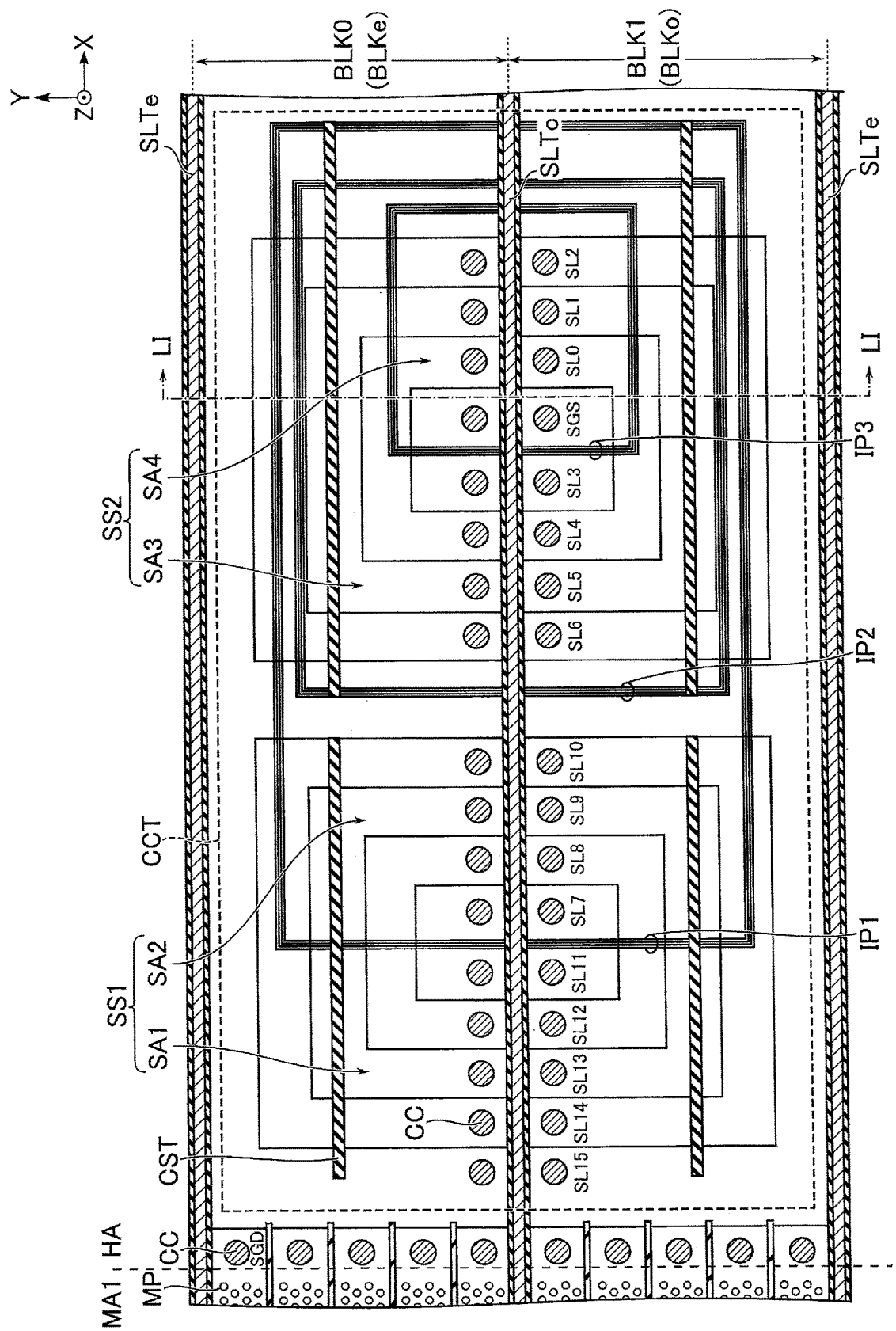
FIG. 50 is a plan view showing an example of a planar layout of a contact area, and its vicinity, of a memory cell array included in a semiconductor memory device according to a sixth modification.
Figure 51:
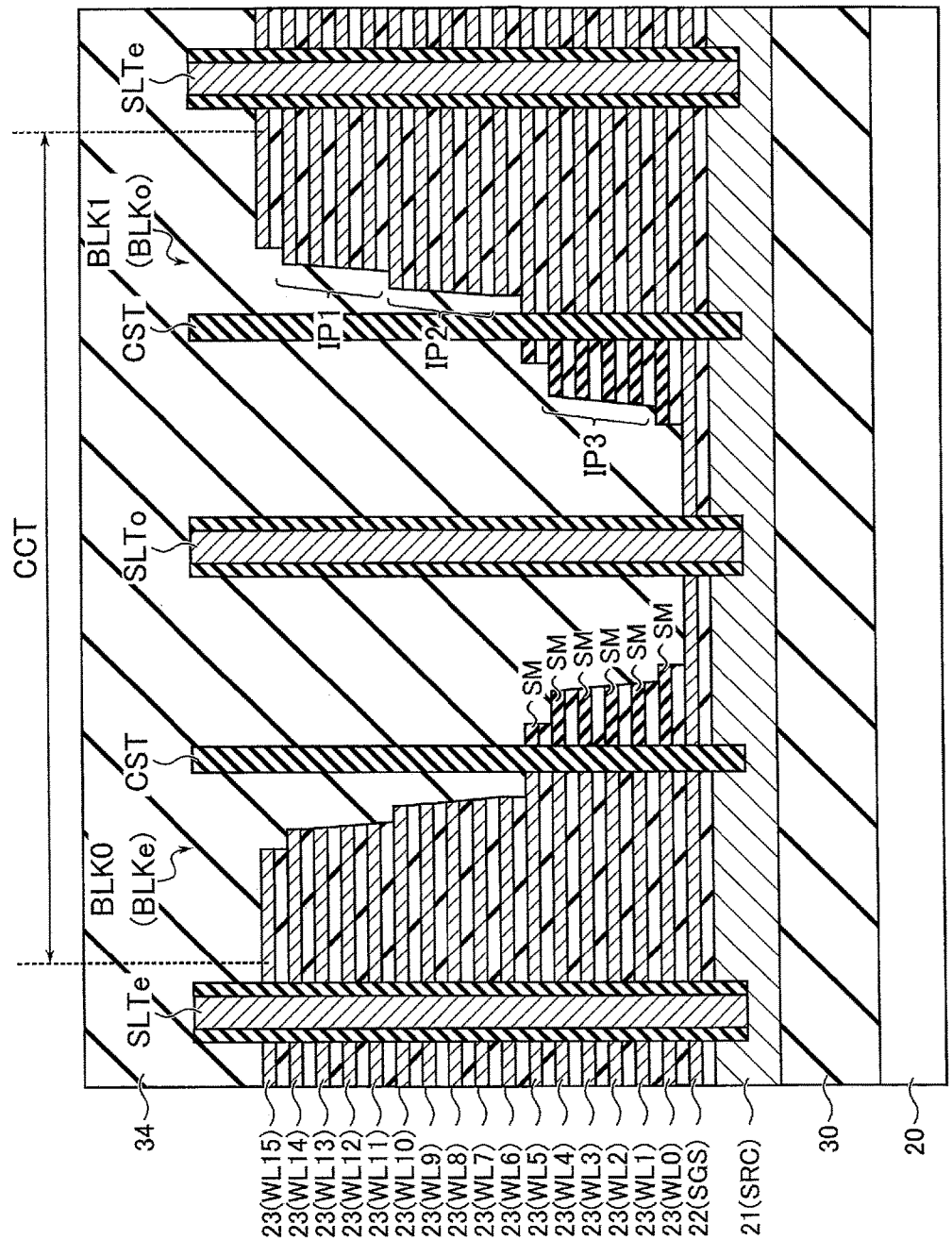
FIG. 51 is a cross-sectional view taken along line LI-LI in FIG. 50, showing an example of a cross-sectional structure of a part of a hookup area of the memory cell array included in the semiconductor memory device according to the sixth modification.

The structure of the contact area CCT when members CST are provided in staircase areas SA will be described with reference to FIGS. 50 and 51. FIG. 50 is a plan view showing an example of a planar layout of a contact area, and its vicinity, of a memory cell array included in the semiconductor memory device according to the sixth modification. FIG. 51 is a cross-sectional view taken along line LI-LI in FIG. 50, showing an example of a cross-sectional structure of a part of a hookup area of the memory cell array included in the semiconductor memory device according to the sixth modification.

As shown in FIG. 50, a plurality of members CST are provided to overlap, for example, the staircase structures of the stadium-like staircase portions SS1 and SS2 in a plan view. Specifically, in each block BLK, two members CST are provided in positions closer to the member SLTo than, for example, a portion of the inclined portion IP1 which extends in the X direction. That is, two members CST are provided to include portions that do not pass through all the stacked-layer members SL0 to SL15.

In the cross section shown in FIG. 51, the member CST is provided between the inclined portion IP2 and the inclined portion IP3 in the Y direction. Accordingly, the member CST is out of contact with stacked-layer members SL at levels higher than the stacked-layer member SL5, for example. The member CST is in contact with the conductive layers 23 and sacrificial members SM at the levels of those of the stacked-layer members SL0 to SL5. The member CST is also in contact with the conductive layers 22 on both of its Y-directional sides.

In the sixth modification, the contact area CCT of the memory cell array 10 includes six sacrificial members SM in contact with the member CST in each block BLK. The memory cell array 10 may be provided to include at least one sacrificial member SM in the contact area CCT.

The layer stack according to the sixth modification is not limited to one similar to those of the embodiment, the first modification, and the second modification. The staircase structure of the layer stack may be one similar to that of each of the third modification, the fourth modification, and the fifth modification, for example. In this case, each block BLK includes, for example, one member CST. The member CST may be formed in a similar manner to the member CST in each of the first modification and the second modification, instead of being formed using the slit SH as in the embodiment.

The semiconductor memory device 1 according to the sixth modification can be manufactured by substantially the same method as the semiconductor memory device 1 according to the embodiment. Therefore, descriptions of the method of manufacturing the semiconductor memory device 1 according to the sixth modification will be omitted.

The above-described configuration can produce advantageous effects similar to those of the embodiment and the first to fifth modifications.

3 Another Embodiment

In the above embodiment and modifications, the memory cell array 10 consists of one tier; however, the present invention is not limited to this. The semiconductor memory device 1 may include, for example, a memory cell array 10 consisting of two or more tiers. The case where the memory cell array 10 consists of two tiers will be described below.

Figure 52:
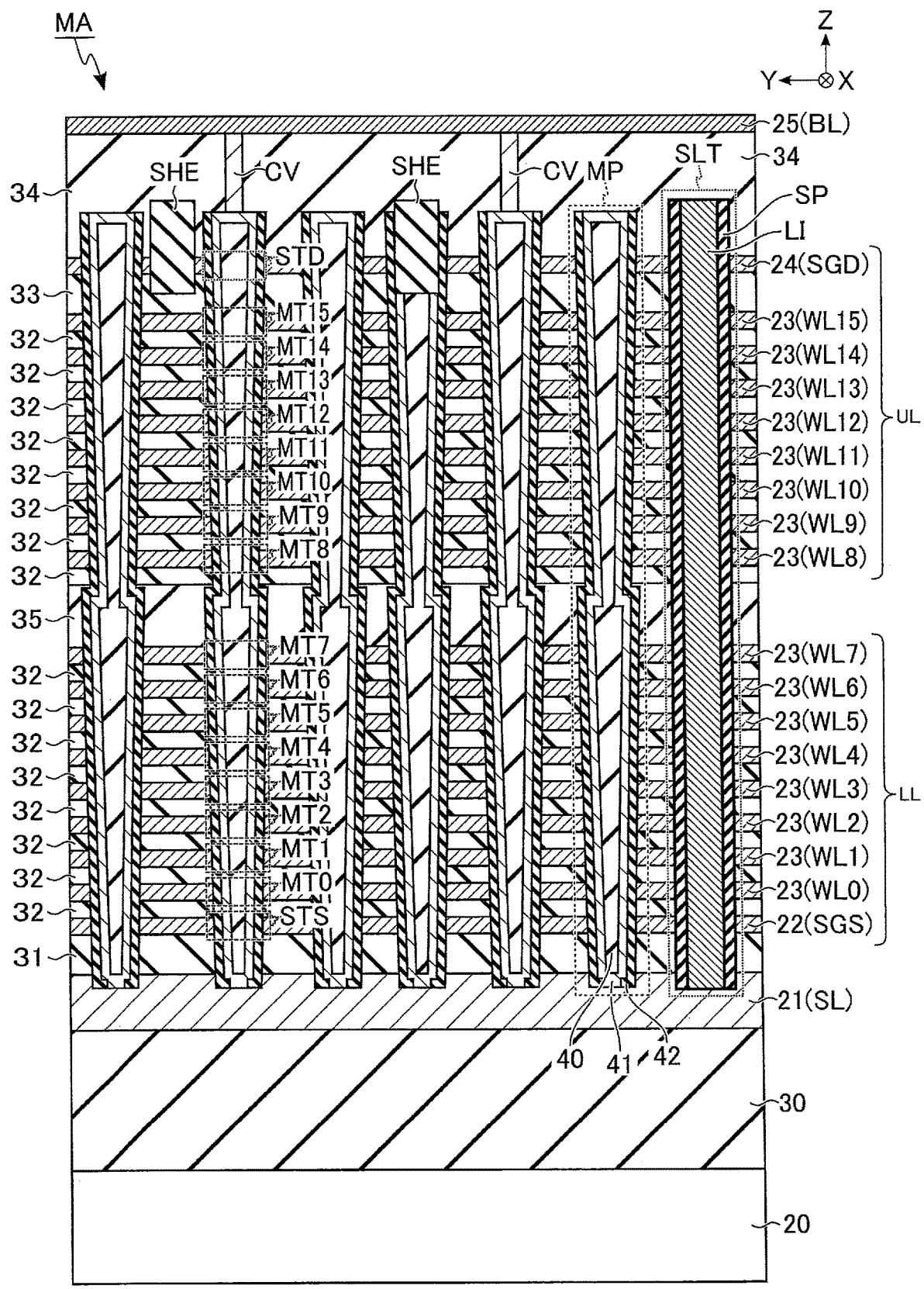
FIG. 52 is a cross-sectional view showing an example of a cross-sectional structure of a memory area of a memory cell array included in a semiconductor memory device according to another embodiment.

A cross-sectional structure of the memory cell array 10 in a memory area MA when the memory cell array 10 consists of two tiers will be described with reference to FIG. 52. FIG. 52 is a cross-sectional view showing an example of a cross-sectional structure of a memory area of a memory cell array included in a semiconductor memory device according to another embodiment. The cross-sectional view of FIG. 52 corresponds to the area shown in FIG. 5 of the embodiment.

In the cross section shown in FIG. 52, the memory cell array 10 includes a first-tier group LL and a second-tier group UL. The first-tier group LL includes, for example, a select gate line SGS and word lines WL0 to WL7. The second-tier group UL includes, for example, word lines WL8 to WL15 and a select gate line SGD.

Each memory pillar MP includes a first portion formed in a first hole passing through the first-tier group LL and a second portion formed in a second hole passing through the second-tier group UL. The bottom of the first portion is in contact with the conductive layer 21. The top of the first portion is coupled to the bottom of the second portion. The border between the first portion and the second portion is included in, for example, a joining layer 35. The joining layer 35 contains, for example, silicon oxide.

The cross-sectional structure of the memory pillar MP on the XY plane may be similar to the cross-sectional structure of the memory pillar MP on the XY plane according to the embodiment. The core member 40 has, for example, a tapered cross-sectional shape in each of the first portion and second portion of the memory pillar MP. Namely, the X-directional (and Y-directional) dimension (diameter) of a lower portion of the first portion is smaller than the X-directional (and Y-directional) dimension (diameter) of an upper portion of the first portion. The X-directional (and Y-directional) dimension (diameter) of a lower portion of the second portion is smaller than the X-directional (and Y-directional) dimension (diameter) of an upper portion of the second portion.

Next, a structure of the memory cell array 10 in the contact area CCT when the memory cell array 10 consists of two tiers will be described. The planar layout of the contact area CCT, and its vicinity, of the memory cell array 10 included in the semiconductor memory device 1 according to another embodiment is similar to, for example, the planer layout of FIG. 7. The cross-sectional structure on the XZ cross section and the cross-sectional structure on the YZ cross section in the contact area CCT of the memory cell array 10 are similar to the cross-sectional structures shown in FIG. 8 and FIG. 10, except that the joining layer 35 is provided.

The structure of the contact area CCT is not limited to this. The structure of the contact area CCT according to another embodiment may be substantially the same as the structure of the contact area CCT according to each of the third modification, fourth modification, and fifth modification, for example.

The shape of the structure of the member CST is not limited to one similar to that of the member CST according to the embodiment. The structure of the member CST may have a shape similar to that of the member CST according to, for example, the first modification or the second modification. When the structure of the member CST has a shape similar to that of the member CST according to the first modification or the second modification, the portion of the member CST passing through the first-tier group LL and the portion of the member CST passing through the second-tier group UL each have a tapered cross-sectional shape like, for example, the core member 40 of the memory pillar MP according to another embodiment.

The embodiments of the present invention have been explained. These are presented merely as examples and are not intended to restrict the scope of the invention. These embodiments may be realized in various other forms, and various omissions, replacements, and changes can be made without departing from the gist of the invention. Such embodiments and modifications are included in the scope and gist of the invention, and are included in the scope of the invention described in the claims and its equivalents.

The invention claimed is:

1. A semiconductor memory device comprising:
a substrate expanding in a first direction and a second direction and including a first area and a second area arranged in the first direction, the first direction intersecting the second direction;
a plurality of conductive layers arranged in a third direction with a distance therebetween, the third direction intersecting the first direction and the second direction, the conductive layers including a first conductive layer and each of the conductive layers including a first portion and a second portion arranged with the first portion in the second direction, the first portion extending in the first direction over the second area and the second portion including a terrace portion provided so as not to overlap an upper conductive layer of the conductive layers in the third direction;
a first insulating portion provided between the first portions of the conductive layers and the second portions of the conductive layers;
a first insulating layer arranged with the first portion of the first conductive layer in the second direction with the first insulating portion interposed therebetween; and
a first memory pillar passing through the conductive layers in the third direction in the first area, a portion of the first memory pillar intersecting the first conductive layer functioning as a first memory cell transistor.

2. The device of claim 1, wherein terrace portions of the conductive layers are aligned in the first direction.

3. The device of claim 1, further comprising a second insulating layer arranged with the first portion of a second conductive layer in the second direction with the first insulating portion interposed therebetween, the second conductive layer being included in the conductive layers and differing from the first conductive layer.

4. The device of claim 3, further comprising a third insulating layer arranged with the first portion of a third conductive layer in the second direction with the first insulating portion interposed therebetween, the third conductive layer being included in the conductive layers and differing from the first conductive layer and the second conductive layer, wherein
the first insulating layer is below the second insulating layer and the third insulating layer, and includes a first insulating terrace portion which does not overlap the second insulating layer or the third insulating layer in the third direction,
the second insulating layer is below the third insulating layer, and includes a second insulating terrace portion which does not overlap the third insulating layer in the third direction, and
the second insulating terrace portion is provided between the first insulating terrace portion and the first insulating portion in the second direction.

5. The device of claim 1, further comprising:
a second insulating portion arranged with the first insulating portion in the first direction with a distance therebetween and provided between the first portions of the conductive layers and the second portions of the conductive layers; and
a fourth insulating layer arranged with the first portion of the first conductive layer in the second direction with the second insulating portion interposed therebetween, and arranged with the first insulating layer in the first direction, wherein the first portion of the first conductive layer is coupled to the second portion of the first conductive layer between the first insulating portion and the second insulating portion.

6. The device of claim 1, wherein the first insulating portion extends in the first direction.

7. The device of claim 1, wherein the first insulating layer includes silicon nitride.

8. The device of claim 1, wherein an upper end of the first insulating portion is in a layer above an uppermost conductive layer of the conductive layers, and a lower end of the first insulating portion is in a layer below a lowermost conductive layer of the conductive layers.

9. The device of claim 8, wherein the first insulating portion is in contact with the first portions of the conductive layers.

10. The device of claim 8, wherein the first insulating portion is distanced from the first portion of a fourth conductive layer being included in the conductive layers and differing from the first conductive layer.

11. The device of claim 1, wherein
the substrate further includes a third area located on a side opposite to the first area with respect to the second area, and
the device further comprises a second memory pillar passing through the conductive layers in the third direction in the third area, a portion of the second memory pillar intersecting the first conductive layer functioning as a second memory cell transistor.

12. The device of claim 1, further comprising a plurality of contacts each coupled to the terrace portion of a corresponding conductive layer of the conductive layers.

13. The device of claim 1, further comprising a fifth conductive layer provided between the conductive layers and the substrate, wherein
a lower end of the first memory pillar is in contact with the fifth conductive layer.

14. The device of claim 13, wherein the fifth conductive layer is a source line.

15. The device of claim 13, wherein the substrate is provided with a circuit configured to execute an operation of the first memory cell transistor.

16. A semiconductor memory device comprising:
a substrate expanding in a first direction and a second direction and including a first area and a second area arranged in the first direction, the first direction intersecting the second direction;
a plurality of conductive layers arranged in a third direction with a distance therebetween, the third direction intersecting the first direction and the second direction, the conductive layers including a first conductive layer and a second conductive layer provided along the third direction with at least one conductive layer of the conductive layers interposed therebetween and each of the conductive layers including a first portion and a second portion arranged with the first portion in the second direction, the first portion extending in the first direction over the second area and the second portion including a terrace portion provided so as not to overlap an upper conductive layer of the conductive layers in the third direction;
a first insulating layer arranged in a same layer as a first upper conductive layer above the first conductive layer and provided between the first portion of the first conductive layer and the terrace portion of the first conductive layer in the second direction, the first upper conductive layer being included in the conductive layers and adjacent to the first conductive layer in the third direction;
a second insulating layer arranged in a same layer as a second upper conductive layer above the second conductive layer, provided between the first portion of the second conductive layer and the terrace portion of the second conductive layer in the second direction, and arranged with the first insulating layer in the third direction with a distance therebetween, the second upper conductive layer being included in the conductive layers and adjacent to the second conductive layer in the third direction; and
a first memory pillar passing through the conductive layers in the third direction in the first area, a portion of the first memory pillar intersecting the first conductive layer functioning as a first memory cell transistor.

17. The device of claim 16, wherein the first insulating layer is below the second insulating layer, and the second insulating layer is provided within a range between the first portion of the first conductive layer and the terrace portion of the first conductive layer in the second direction in the same layer as the second upper conductive layer.

18. The device of claim 16, wherein the first insulating layer and the second insulating layer are provided above a portion differing from the terrace portion of the second portion of a lower conductive layer included in the conductive layers and provided below the first conductive layer and the second conductive layer.

19. The device of claim 16, further comprising a third insulating layer arranged with the first insulating layer and the second insulating layer in the third direction with a distance therebetween and arranged with the first portion of a third conductive layer in the second direction, the third conductive layer being included in the conductive layers and differing from the first conductive layer, the second conductive layer, the first upper conductive layer, and the second upper conductive layer, wherein
the first insulating layer is below the second insulating layer and the third insulating layer, and includes a first insulating terrace portion which does not overlap the second insulating layer or the third insulating layer in the third direction,
the second insulating layer is below the third insulating layer, and includes a second insulating terrace portion which does not overlap the third insulating layer in the third direction, and
the second insulating terrace portion is provided between the first insulating terrace portion and the first portions of the conductive layers in the second direction.

20. The device of claim 16, wherein the first insulating layer and the second insulating layer include silicon nitride.

* * * * *